US012490458B2

(12) United States Patent
Hikasa

(10) Patent No.: US 12,490,458 B2
(45) Date of Patent: Dec. 2, 2025

(54) SEMICONDUCTOR DEVICE INCLUDING OVERLAPPING ELECTRODES

(71) Applicant: ROHM CO., LTD., Kyoto (JP)

(72) Inventor: Akihiro Hikasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/889,464

(22) Filed: Sep. 19, 2024

(65) Prior Publication Data

US 2025/0015178 A1    Jan. 9, 2025

Related U.S. Application Data

(63) Continuation of application No. 18/009,996, filed as application No. PCT/JP2021/033188 on Sep. 9, 2021.

(30) Foreign Application Priority Data

Sep. 17, 2020  (JP) .................................. 2020-156343

(51) Int. Cl.
  *H10D 30/66*  (2025.01)
  *H10D 8/00*  (2025.01)
  (Continued)

(52) U.S. Cl.
  CPC ............. *H10D 30/669* (2025.01); *H10D 8/00* (2025.01); *H10D 62/126* (2025.01);
  (Continued)

(58) Field of Classification Search
  CPC ............. H01L 29/7815; H01L 29/0692; H01L 29/41741; H01L 29/4238; H01L 29/861;
  (Continued)

(56) References Cited

U.S. PATENT DOCUMENTS 6,075,292 A    6/2000  Noguchi
6,893,912 B2   5/2005  Lung
(Continued)

FOREIGN PATENT DOCUMENTS

CN    1213852 A    4/1999
CN   101794779 A   8/2010
(Continued)

OTHER PUBLICATIONS

International Search Report and Written Opinion mailed on Nov. 30, 2021, received for PCT Application PCT/JP2021/033188, filed on Sep. 9, 2021, 13 pages including English Translation.
(Continued)

*Primary Examiner* — Ida M Soward
(74) *Attorney, Agent, or Firm* — XSENSUS LLP

(57) ABSTRACT

The semiconductor device includes a semiconductor layer which has a main surface, a switching device which is formed in the semiconductor layer, a first electrode which is arranged on the main surface and electrically connected to the switching device, a second electrode which is arranged on the main surface at an interval from the first electrode and electrically connected to the switching device, a first terminal electrode which has a portion that overlaps the first electrode in plan view and a portion that overlaps the second electrode and is electrically connected to the first electrode, and a second terminal electrode which has a portion that overlaps the second electrode in plan view and is electrically connected to the second electrode.

30 Claims, 22 Drawing Sheets

(51) Int. Cl.
*H10D 62/10* (2025.01)
*H10D 64/23* (2025.01)
*H10D 64/27* (2025.01)
*H10D 30/63* (2025.01)
*H10D 62/832* (2025.01)

(52) U.S. Cl.
CPC ......... *H10D 64/252* (2025.01); *H10D 64/519* (2025.01); *H10D 30/63* (2025.01); *H10D 62/8325* (2025.01)

(58) Field of Classification Search
CPC .. H01L 23/4824; H10D 30/669; H10D 30/63; H10D 30/668; H10D 8/00; H10D 62/126; H10D 62/8325; H10D 62/111; H10D 62/127; H10D 62/393; H10D 62/83; H10D 64/252; H10D 64/519; H10D 64/232; H10D 64/117; H10D 84/143; H10D 12/481
See application file for complete search history.

(56) References Cited

U.S. PATENT DOCUMENTS

| | | | |
|---|---|---|---|
| 8,502,313 | B2 | 8/2013 | Dikshit et al. |
| 8,791,525 | B2 | 7/2014 | Montgomery et al. |
| 8,981,471 | B2 * | 3/2015 | Yagi ............ H10D 89/911 257/334 |
| 9,673,318 | B1 | 6/2017 | Mirchandani et al. |
| 10,236,377 | B2 | 3/2019 | Katoh et al. |
| 2002/0033494 | A1 | 3/2002 | Ozaki et al. |
| 2004/0021173 | A1 | 2/2004 | Sapp |
| 2006/0060916 | A1 | 3/2006 | Girdhar et al. |
| 2006/0261391 | A1 | 11/2006 | Nakazawa et al. |
| 2007/0034943 | A1 | 2/2007 | Kushiyama et al. |
| 2009/0140327 | A1 * | 6/2009 | Hirao ............ H01L 29/7802 438/270 |
| 2009/0302384 | A1 * | 12/2009 | Izumi ............ H10D 84/811 257/E29.256 |
| 2010/0187640 | A1 * | 7/2010 | Miyata ............ H10D 30/668 257/401 |
| 2010/0258945 | A1 | 10/2010 | Numata et al. |
| 2010/0320461 | A1 | 12/2010 | Su et al. |
| 2011/0291223 | A1 | 12/2011 | Nakamura |
| 2012/0061754 | A1 * | 3/2012 | Hsieh ............ H10D 64/117 438/270 |
| 2012/0068258 | A1 * | 3/2012 | Ono ............ H01L 24/40 257/329 |
| 2012/0080728 | A1 * | 4/2012 | Malhan ............ H10D 64/411 257/280 |
| 2012/0104415 | A1 | 5/2012 | Kaguchi et al. |
| 2012/0175699 | A1 * | 7/2012 | Hsieh ............ H01L 29/41766 257/E27.06 |
| 2012/0326207 | A1 | 12/2012 | Yoshimochi |
| 2013/0207172 | A1 * | 8/2013 | Hsieh ............ H10D 30/0295 438/270 |
| 2013/0313634 | A1 | 11/2013 | Liu |
| 2014/0001539 | A1 | 1/2014 | Yagi et al. |
| 2014/0145291 | A1 | 5/2014 | Song et al. |
| 2015/0048450 | A1 | 2/2015 | Naito |
| 2015/0145025 | A1 | 5/2015 | Yoshida et al. |
| 2015/0214355 | A1 * | 7/2015 | Nakano ............ H01L 29/7806 257/330 |
| 2015/0295079 | A1 | 10/2015 | Nakano et al. |
| 2015/0380541 | A1 * | 12/2015 | Arai ............ H01L 21/02378 257/77 |
| 2017/0040423 | A1 | 2/2017 | Inoue et al. |
| 2017/0200799 | A1 | 7/2017 | Amali et al. |
| 2017/0221998 | A1 | 8/2017 | Ebihara et al. |
| 2017/0271451 | A1 | 9/2017 | Matsushita et al. |
| 2018/0108764 | A1 | 4/2018 | Ishii |
| 2018/0138272 | A1 | 5/2018 | Ebihara et al. |
| 2018/0269202 | A1 * | 9/2018 | Yamano ............ H10D 62/142 |
| 2018/0350900 | A1 | 12/2018 | Nakamata et al. |
| 2019/0019885 | A1 * | 1/2019 | Naito ............ H10D 62/393 |
| 2019/0058007 | A1 | 2/2019 | Tsai et al. |
| 2019/0097004 | A1 | 3/2019 | Ina et al. |
| 2019/0252542 | A1 | 8/2019 | Yoshimura |
| 2019/0333986 | A1 | 10/2019 | Fukui et al. |
| 2019/0341308 | A1 * | 11/2019 | Urakami ............ H01L 21/02104 |
| 2020/0185517 | A1 | 6/2020 | Nakao et al. |
| 2020/0243641 | A1 * | 7/2020 | Nakagawa ............ H01L 29/0623 |
| 2020/0286988 | A1 * | 9/2020 | Seok ............ H10D 62/111 |
| 2020/0321463 | A1 * | 10/2020 | Weyers ............ H10D 30/63 |
| 2021/0083103 | A1 | 3/2021 | Katou et al. |
| 2023/0187486 | A1 * | 6/2023 | Nakagawa ............ H01L 29/7811 257/77 |

FOREIGN PATENT DOCUMENTS

| | | | |
|---|---|---|---|
| CN | 104659026 | A | 5/2015 |
| DE | 112021000618 | T5 | 11/2022 |
| JP | 2010087125 | A | 4/2010 |
| JP | 2012094669 | A | 5/2012 |
| JP | 2015222743 | A | 12/2015 |
| JP | 2020-080387 | A | 5/2020 |
| WO | 2012111285 | A1 | 8/2012 |
| WO | 2017199706 | A1 | 11/2017 |
| WO | WO-2018212282 | A1 * | 11/2018 ......... H01L 29/0619 |
| WO | 2019/106948 | A1 | 6/2019 |
| WO | 2020032190 | A1 | 2/2020 |
| WO | 2020032206 | A1 | 2/2020 |
| WO | 2022/059597 | A1 | 3/2022 |

OTHER PUBLICATIONS

German Office Action issued Jul. 8, 2024 in corresponding German Patent Application No. 112021002199.0, 14 pages.
Japanese Office Action issued May 9, 2024 in corresponding Japanese Patent Application No. 2024-064698, 5 pages.
Japanese Office Action issued Apr. 11, 2024 in corresponding Japanese Patent Application No. 2024-036871, 6 pages.
Japanese Office Action issued Apr. 18, 2024 in corresponding Japanese Patent Application No. 2024-001472, 6 pages.
Japanese Office Action issued Mar. 14, 2024 in corresponding Japanese Patent Application No. 2024-018064, 6 pages.
Japanese Office Action issued Jan. 25, 2024 in corresponding Japanese Patent Application No. 2024-001472, 9 pages.
Japanese Notice of Reasons for Refusal issued Apr. 18, 2024 in corresponding Japanese Patent Application No. 2024-001472, 6 pages.
Japanese Decision to Grant a Patent issued Jul. 25, 2024 in corresponding Japanese Patent Application No. 2024-001472, 6 pages.
U.S. Office Action dated Oct. 29, 2024 in corresponding U.S. Appl. No. 18/780,607 (9 pages).
Office Action dated Jan. 16, 2025 issued in corresponding U.S. Appl. No. 18/883,121 (19 pages).
Office Action dated Jan. 30, 2025 issued in corresponding U.S. Appl. No. 18/907,734 (16 pages).
Final Office Action dated Feb. 7, 2025 issued in corresponding U.S. Appl. No. 18/780,607 (11 pages).
German Office Action dated Mar. 6, 2025 issued in corresponding German patent application No. 112021002199.0 (6 pages; with English translation).
German Office Action dated Mar. 6, 2025 issued in corresponding German patent application No. 112021008437.2 (14 pages; with English translation).
German Office Action dated Mar. 6, 2025 issued in corresponding German patent application No. 112021008570.0 (14 pages; with English translation).
German Office Action dated Mar. 6, 2025 issued in corresponding German patent application No. 112021008551.4 (14 pages; with English translation).
German Office Action dated Mar. 6, 2025 issued in corresponding German patent application No. 112021008572.7 (11 pages; with English translation).

(56) References Cited

OTHER PUBLICATIONS

Office Action dated Mar. 14, 2025 issued in parent U.S. Appl. No. 18/009,996 (10 pages).
Office Action dated May 16, 2025 in corresponding U.S. Appl. No. 18/780,607 (8 pages).
Final Office Action dated May 21, 2025 in corresponding U.S. Appl. No. 18/907,734 (17 pages).
Office Action dated Jun. 4, 2025 in corresponding Chinese patent application No. 202410884044.9 (17 pages; with English machine translation).
Final Office Action dated Jun. 18, 2025 in corresponding U.S. Patent Application No. 18/883, 121 (21 pages).
Notice of Reasons for Refusal (Dispatch date: Jul. 24, 2025) in corresponding Japanese Divisional Patent Application No. 2022-550514 (7 pages; with English machine translation).
U.S. Office Action dated Oct. 1, 2025 in corresponding U.S. Appl. No. 18/883,121 (24 pages).

* cited by examiner

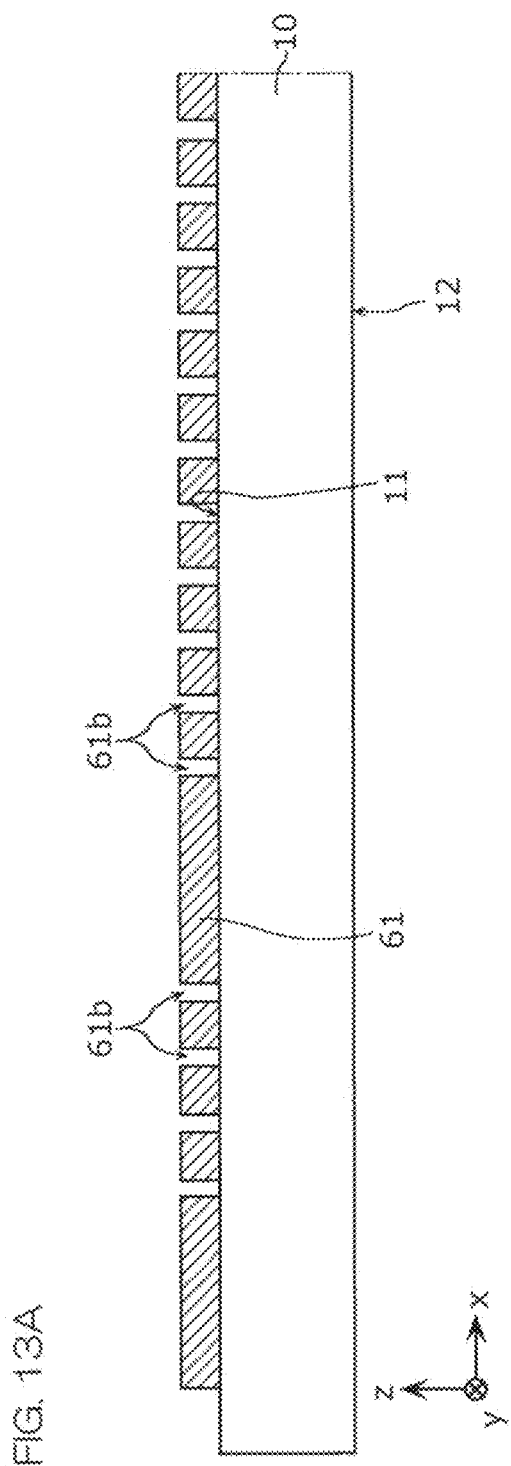

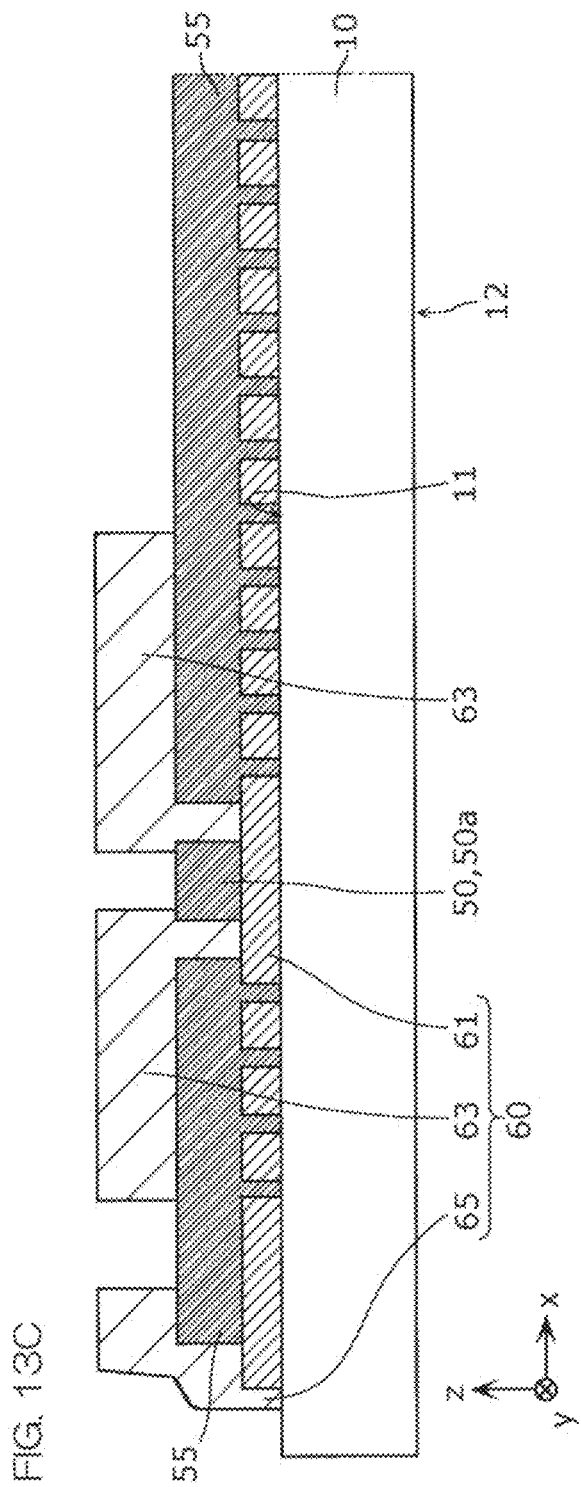

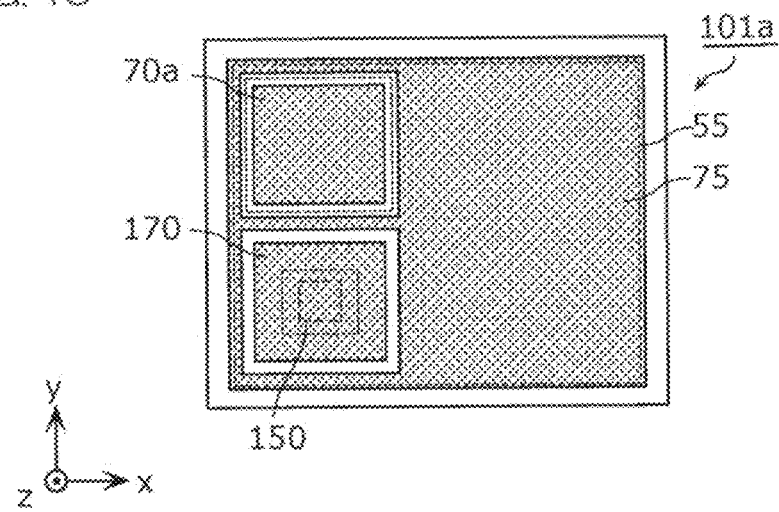
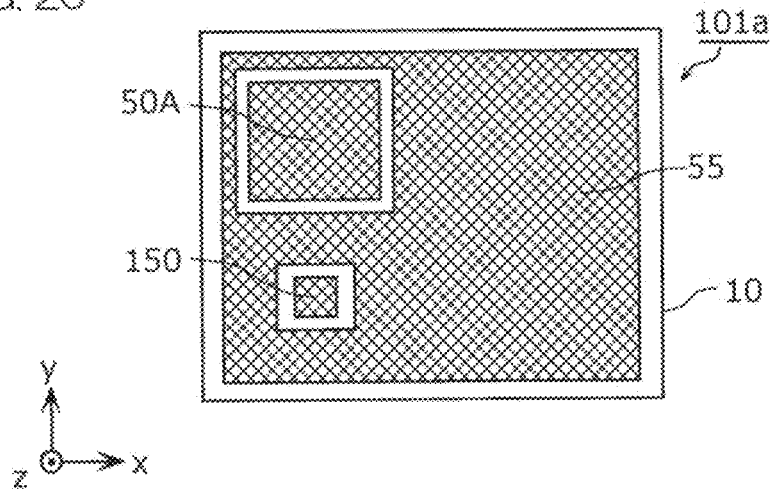

us 12,490,458 B2

SEMICONDUCTOR DEVICE INCLUDING OVERLAPPING ELECTRODES

CROSS-REFERENCE TO RELATED APPLICATIONS

The present application is a continuation of U.S. application Ser. No. 18/009,996, filed Dec. 13, 2022, based on PCT filing PCT/JP2021/033188, filed Sep. 9, 2021, which claims priority to Japanese Patent Application No. 2020-156343, filed Sep. 17, 2020, the entire contents of each are incorporated herein by reference.

TECHNICAL FIELD

The present invention relates to a semiconductor device.

BACKGROUND ART

Patent Literature 1 discloses an art related to a semiconductor device including an SiC substrate.

CITATION LIST

Patent Literature

Patent Literature 1: United States Patent Application Publication No. 2015/295079

SUMMARY OF INVENTION

Technical Problem

A preferred embodiment provides a semiconductor device capable of relaxing design rules derived from an electrode.

Solution to Problem

A preferred embodiment provides a semiconductor device including a semiconductor layer which has a main surface, a switching device which is formed in the semiconductor layer, a first electrode which is arranged on the main surface and electrically connected to the switching device, a second electrode which is arranged on the main surface at an interval from the first electrode and electrically connected to the switching device, a first terminal electrode which has a portion that overlaps the first electrode in plan view and a portion that overlaps the second electrode and is electrically connected to the first electrode, and a second terminal electrode which has a portion that overlaps the second electrode in plan view and is electrically connected to the second electrode.

A preferred embodiment provides a semiconductor device including a semiconductor layer which has a main surface, a main device which is formed in the semiconductor layer and generates a main current, a sensing device which is formed in a region different from the main device in the semiconductor layer and generates a monitoring current that monitors the main current, a first electrode which is arranged on the main surface and electrically connected to the main device, a second electrode which is arranged on the main surface at an interval from the first electrode and electrically connected to the main device, a third electrode which is arranged on the main surface at an interval from the first electrode and the second electrode and electrically connected to the sensing device, a first terminal electrode which is electrically connected to the first electrode on the first electrode, a second terminal electrode which is electrically connected to the second electrode on the second electrode, and a third terminal electrode which has a portion that overlaps the third electrode in plan view and a portion that overlaps the second electrode and is electrically connected to the third electrode.

A preferred embodiment provides a semiconductor device including a semiconductor layer which has a main surface, a switching device which is formed in the semiconductor layer, a diode which is formed in a region different from the switching device in the semiconductor layer, a first electrode which is arranged on the main surface and electrically connected to the switching device, a second electrode which is arranged on the main surface at an interval from the first electrode and electrically connected to the switching device, a first terminal electrode which is electrically connected to the first electrode on the first electrode, a second terminal electrode which is electrically connected to the second electrode on the second electrode, and a polar terminal electrode which has a portion that overlaps the diode in plan view and a portion that overlaps the second electrode and is electrically connected to the diode.

A preferred embodiment provides a semiconductor device including a semiconductor layer which includes SiC and has a first main surface at one side and a second main surface at the other side, a vertical transistor which is formed in the semiconductor layer, a first electrode which is arranged on the first main surface, a second electrode which is arranged on the first main surface at an interval from the first electrode, a first electrode pad which is arranged at the opposite side to the semiconductor layer with respect to the first electrode such as to at least partially overlap the first electrode in plan view and electrically connected to the first electrode, and an electrode which is arranged on the second main surface, wherein the first electrode pad overlaps a part of the second electrode in plan view.

A preferred embodiment provides a method for manufacturing a semiconductor device including a step which prepares a semiconductor layer that includes SiC, has a first main surface at one side and a second main surface at the other side, and includes a vertical transistor, a step which forms a first electrode and a second electrode at an interval on the first main surface, and a step which forms a first electrode pad at a position opposite to the semiconductor layer with respect to the first electrode such as to at least partially overlap the first electrode in plan view and such as to be electrically connected to the first electrode, wherein in the step of forming the first electrode pad, the first electrode pad which overlaps a part of the second electrode is formed.

The aforementioned as well as yet other objects, features and effects of the present invention will be made clear by description of the preferred embodiments, to be described with reference to the accompanying drawings.

BRIEF DESCRIPTION OF DRAWINGS

FIG. 13A is a cross-sectional view which shows an example of a method for manufacturing the semiconductor device shown in FIG. 2.

FIG. 13C is a cross-sectional view which shows a step subsequent to that of FIG. 13B.

FIG. 19 is a plan view which shows a modified example of the semiconductor device shown in FIG. 15.

FIG. 20 is a plan view of an upper surface of an electrode of the semiconductor device shown in FIG. 19.

DESCRIPTION OF EMBODIMENTS

Figure 1:
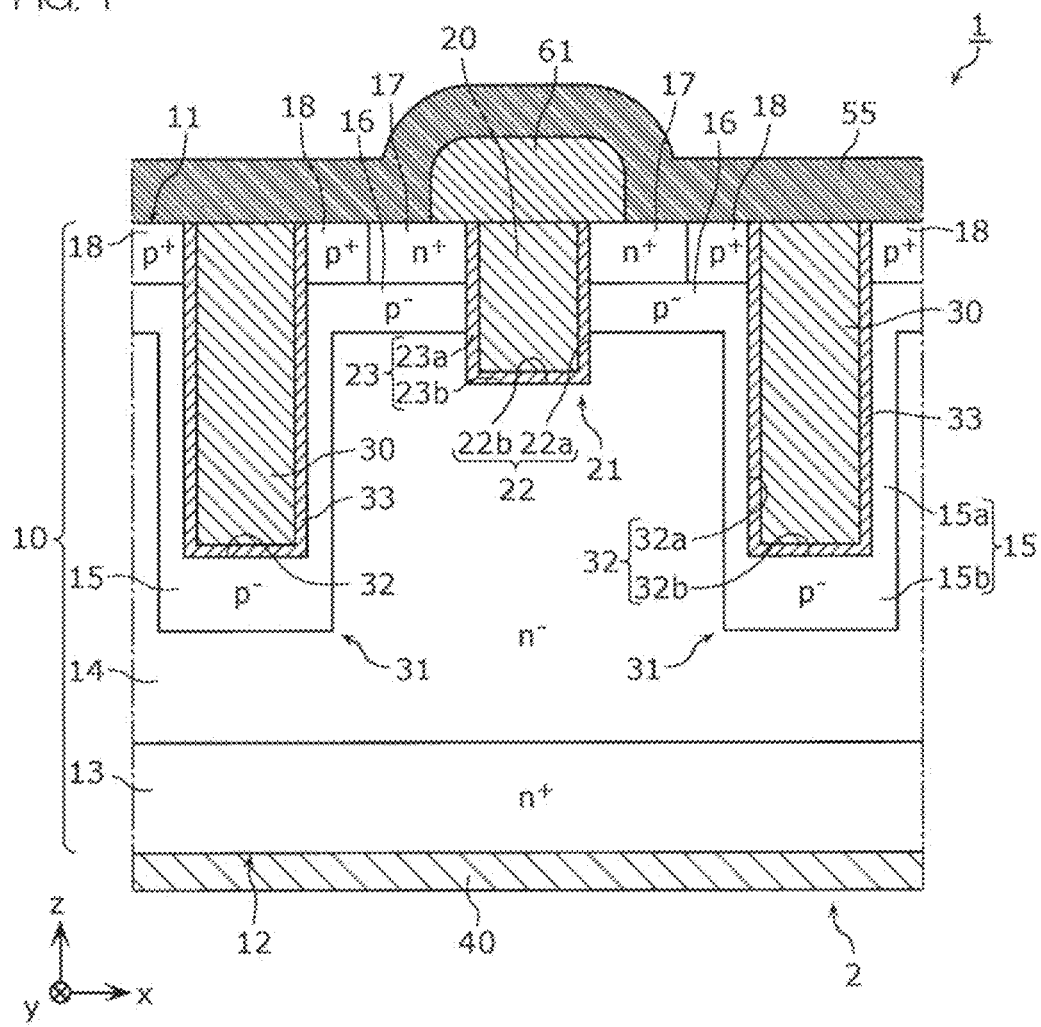
FIG. 1 is a cross-sectional view which shows a main portion of a semiconductor device according to a first preferred embodiment.

Each of the preferred embodiments described below illustrates a comprehensive or specific example. Numerical values, shapes, materials, constituent devices, arrangement positions and connection forms of the constituent devices, steps, order of the steps, etc., described with the following preferred embodiments are examples and are not intended to limit the present invention. Among the constituent devices in the following preferred embodiments, a constituent device that is not described in an independent claim is described as an optional constituent device.

The attached drawings are schematic views and not necessarily drawn exactly. For example, the scales, etc., of attached drawings do not always necessarily match. In the attached drawings, arrangements that are substantially the same are provided with the same reference signs, and a redundant description is omitted or simplified.

In the present description, terms that represent a relationship between devices such as vertical, horizontal, etc., terms that represent shapes of devices such as rectangular, etc., and numerical ranges are not expressions that express only strict meanings but are expressions that mean including substantially equivalent ranges. For example, in a polygonal shape or a polygonal columnar shape, apexes thereof may be rounded.

In the present description, the terms "upper"/"above" and "lower"/"below" do not indicate an upper direction (perpendicularly upper) or a lower direction (perpendicularly lower) in terms of an absolute spatial recognition but are defined by a relative positional relationship based on an order of lamination in a laminated configuration. For example, descriptions are provided with a first main surface side of the semiconductor layer as an upper side (above) and a second main surface side as a lower side (below). In actual use of a semiconductor device (vertical transistor), the first main surface side may be a lower side (below) and the second main surface side may be an upper side (above). As a matter of course, the semiconductor device (vertical transistor) may be used in an orientation where the first main surface and the second main surface are inclined or orthogonal with respect to a horizontal plane.

The terms "upper"/"above" and "lower"/"below" are applied not only in a case where two constituent devices are arranged such as to be separated in an up/down direction across a different constituent device but also in a case where two constituent devices are arranged in the up/down direction such as to adhere closely to each other.

In the present description and the drawings, an x-axis, a y-axis and a z-axis show three axes of a three-dimensional orthogonal coordinate system. In the present description, a "laminated direction" means a direction orthogonal to the main surface of the semiconductor layer. In the present description, "in plan view" refers to a view as viewed in a direction which is vertical to the first main surface of the semiconductor layer.

FIG. 1 is a cross-sectional view of a vertical transistor included in a semiconductor device according to the first preferred embodiment. In FIG. 1, in view of easy understanding of the drawing, no hatching for indicating a cross-section of a semiconductor layer 10 is given. With reference to FIG. 1, a semiconductor device 1 is an example of a switching device and includes a vertical transistor 2 (switching device/switching element). The vertical transistor 2 is, for example, a vertical-type MISFET (Metal Insulator Semiconductor Field Effect Transistor).

The semiconductor device 1 includes the semiconductor layer 10, a gate electrode 20, a source electrode 30, and a drain electrode 40. The semiconductor layer 10 is formed in a rectangular parallelepiped chip shape. The semiconductor layer 10 has a first main surface 11 at one side and a second main surface 12 at the other side. The semiconductor layer 10 includes SiC (silicon carbide) as a main component. Specifically, the semiconductor layer 10 is an n-type (first conductive type) SiC semiconductor layer which includes an SiC monocrystal.

The SiC monocrystal may be a 4H-SiC monocrystal. The first main surface 11 may be a silicon plane ((0001) plane) from which silicon of an SiC crystal is exposed. The second main surface 12 may be a carbon plane ((000-1) plane) from which carbon of an SiC crystal is exposed. The semiconductor layer 10 may have an off-angle which is inclined at an angle of within 10° with respect to a [11-20] direction from a (0001) plane of the 4H-SiC monocrystal. The off-angle may be not less than 0° and not more than 4°.

The off-angle may be in excess of 0° and be less than 4°. The off-angle may be 2° or 4°. The off-angle may be set in a range of 2°±0.2° or in a range of 4°±0.4°. An x-axis direction may be a [11-20] direction and a y-axis direction may be a [1-100] direction. As a matter of course, the x-axis direction may be the [1-100] direction and the y-axis direction may be the [11-20] direction.

The semiconductor layer 10 has a laminated structure which includes an n-type semiconductor substrate 13 and an n-type epitaxial layer 14. The semiconductor substrate 13 includes an SiC monocrystal. A lower surface of the semiconductor substrate 13 is the second main surface 12. The epitaxial layer 14 is laminated on an upper surface of the semiconductor substrate 13. The epitaxial layer 14 is an n-type SiC semiconductor layer which includes an SiC monocrystal. An upper surface of the epitaxial layer 14 is the first main surface 11.

An n-type impurity concentration of the semiconductor substrate 13 may be not less than $1.0 \times 10^{18}$ cm$^{-3}$ and not more than $1.0 \times 10^{21}$ cm$^{-3}$. In the present description, "impurity concentration" means a peak value of the impurity concentration. An n-type impurity concentration of the epitaxial layer 14 is preferably less than the n-type impurity concentration of the semiconductor substrate 13. The n-type impurity concentration of the epitaxial layer 14 may be not less than $1.0 \times 10^{15}$ cm$^{-3}$ and not more than $1.0 \times 10^{17}$ cm$^{-3}$. The semiconductor substrate 13 is provided as an n$^+$-type drain region. The epitaxial layer 14 is provided as an n$^-$-type drain drift region.

A thickness of the semiconductor substrate 13 may be not less than 1 μm and less than 1000 μm. The thickness of the semiconductor substrate 13 may be any one of not less than 5 μm, not less than 25 μm, not less than 50 μm, or not less than 100 μm. The thickness of the semiconductor substrate 13 may be any one of not more than 700 μm, not more than 500 μm, not more than 400 μm, not more than 300 μm, not more than 250 μm, not more than 200 μm, not more than 150 μm, or not more than 100 μm. In the vertical transistor 2, a current flows in the laminated direction (that is, the thickness direction) of the semiconductor layer 10. Therefore, the semiconductor substrate 13 is reduced in thickness and a current channel can be, thereby, shortened to reduce a resistance value.

A thickness of the epitaxial layer 14 may be not less than 1 μm and not more than 100 μm. The thickness of the epitaxial layer 14 may be any one of not less than 5 μm, not less than 10 μm, or not more than 50 μm. The thickness of the epitaxial layer 14 may be any one of not more than 40 μm, not more than 30 μm, not more than 20 μm, not more than 15 μm, or not more than 10 μm. The thickness of the epitaxial layer 14 is preferably less than the thickness of the semiconductor substrate 13.

With reference to FIG. 1, the semiconductor device 1 includes a p-type (second conductive type) body region 16, a plurality of trench gate structures 21, a plurality of trench source structures 31, an n-type source region 17, and a p-type contact region 18. The body region 16 is a p$^-$-type semiconductor region provided in a surface layer portion of the first main surface 11 of the semiconductor layer 10. The body region 16 is formed in a surface layer portion of the epitaxial layer 14. A p-type impurity concentration of the body region 16 may be not less than $1.0 \times 10^{16}$ cm$^{-3}$ and not more than $1.0 \times 10^{19}$ cm$^{-3}$.

The plurality of trench gate structures 21 are arrayed on the first main surface 11 at an interval in the x-axis direction in plan view and each formed in a band shape extending in the y-axis direction. The plurality of trench gate structures 21 are formed such as to penetrate through the body region 16 from the first main surface 11. The plurality of trench gate structures 21 are formed inside the epitaxial layer 14 at an interval from the semiconductor substrate 13 on the first main surface 11 side.

Each of the trench gate structures 21 includes a gate trench 22, a gate insulating layer 23, and a gate electrode 20. The gate trench 22 is formed by digging into the first main surface 11 toward the second main surface 12 side. The gate trench 22 has a rectangular cross-sectional shape on an xz section and is formed as a recessed portion (groove portion) extending in a band shape in the y-axis direction.

The gate trench 22 may have a length of a millimeter order in a longitudinal direction (y-axis direction). The length of the gate trench 22 may be not less than 1 mm and not more than 10 mm. The length of the gate trench 22 may be not less than 2 mm and not more than 5 mm. A total extension of one or a plurality of gate trenches 22 per unit area may be not less than 0.5 μm/μm$^2$ and not more than 0.75 μm/μm$^2$.

The gate insulating layer 23 is formed like a film along a side wall 22a and a bottom wall 22b of the gate trench 22. The gate insulating layer 23 demarcates a recessed space in an interior of the gate trench 22. The gate insulating layer 23 may include at least one type of silicon oxide, impurity non-doped silicon, silicon nitride, aluminum oxide, aluminum nitride, and aluminum oxynitride.

A thickness of the gate insulating layer 23 may be not less than 0.01 μm and not more than 0.5 μm. The thickness of the gate insulating layer 23 may be uniform or may vary depending on the site. The gate insulating layer 23 includes a side wall portion 23a which covers the side wall 22a of the gate trench 22 and a bottom wall portion 23b which covers the bottom wall 22b of the gate trench 22. A thickness of the bottom wall portion 23b may exceed a thickness of the side wall portion 23a.

The thickness of the bottom wall portion 23b may be not less than 0.01 μm and not more than 0.2 μm. The thickness of the side wall portion 23a may be not less than 0.05 μm and not more than 0.5 μm. The gate insulating layer 23 may include a covering portion which covers the first main surface 11 outside the gate trench 22. A thickness of the covering portion may exceed the thickness of the side wall portion 23a.

The gate electrode 20 is embedded in the gate trench 22 across the gate insulating layer 23. That is, the gate electrode 20 is embedded in a recessed space demarcated by the gate insulating layer 23. The gate electrode 20 may include at least one of a non-metal conductor and a metal. The gate electrode 20 may include at least one type of conductive polysilicon, titanium, nickel, copper, aluminum, silver, gold, tungsten, and titanium nitride (conductive metal nitride).

An aspect ratio of the trench gate structure 21 may be not less than 0.25 and not more than 15.0. The aspect ratio of the trench gate structure 21 is defined by a ratio of a depth (length in the z-axis direction) of the trench gate structure 21 in relation to a width (length in the x-axis direction) of the trench gate structure 21. The aspect ratio of the gate trench 22 is the same as the aspect ratio of the trench gate structure 21.

The width of the trench gate structure 21 may be not less than 0.2 μm and not more than 2.0 μm. As an example, the width of the trench gate structure 21 may be about 0.4 μm. The depth of the trench gate structure 21 may be not less than 0.5 μm and not more than 3.0 μm. As an example, the depth of the trench gate structure 21 may be about 1.0 μm.

The plurality of trench source structures 31 are each formed in a region of the first main surface 11 between the plurality of trench gate structures 21 which are adjacent to each other. The plurality of trench source structures 31 are each formed in a band shape extending in the y-axis direction. Thereby, the plurality of trench source structures 31 are arrayed alternately and repeatedly one by one together with the plurality of trench gate structures 21 in the x-axis direction. FIG. 1 shows only a range in which one trench gate structure 21 is held between two trench source structures 31. The plurality of trench source structures 31 form a stripe structure (refer to FIG. 5 described later) together with the plurality of trench gate structures 21 in plan view.

The trench source structures 31 may be each formed at an interval of a value which is not less than 0.3 μm and not more than 1.0 μm from an adjacent trench gate structure 21. The plurality of trench source structures 31 are formed such as to penetrate through the body region 16 from the first main surface 11 to demarcate the body region 16 extending between the trench source structures 31 and the plurality of trench gate structures 21 along the y-axis direction. The plurality of trench source structures 31 are formed inside the epitaxial layer 14 at an interval from the semiconductor substrate 13 on the first main surface 11 side. The plurality of trench source structures 31 are formed deeper than the plurality of trench gate structures 21.

The trench source structure 31 includes a source trench 32, a barrier forming layer 33, the source electrode 30, and a deep well region 15. The source trench 32 is formed by digging into the first main surface 11 toward the second main surface 12 side. The source trench 32 has a rectangular cross-sectional shape on an xz section and is formed as a recessed portion (groove portion) extending in a band shape in the y-axis direction. The source trench 32 is formed deeper than the gate trench 22. That is, a bottom wall 32b of the source trench 32 is positioned further on the second main surface 12 side than the bottom wall 22b of the gate trench 22.

The source electrode 30 is embedded in the source trench 32. The source electrode 30 may include at least one of a non-metal conductor and a metal. The source electrode 30 may include at least one type of conductive polysilicon, titanium, nickel, copper, aluminum, silver, gold, tungsten, and titanium nitride (conductive metal nitride). The source electrode 30 may include n-type polysilicon which is doped with an n-type impurity or p-type polysilicon which is doped with a p-type impurity. The source electrode 30 may be formed of the same material as the gate electrode 20. In this case, the source electrode 30 can be formed by the same step as the gate electrode 20.

The barrier forming layer 33 is interposed between a wall surface of the source trench 32 and the source electrode 30. In this embodiment, the barrier forming layer 33 covers a side wall 32a and the bottom wall 32b of the source trench 32 like a film and demarcates a recessed space in an interior of the source trench 32. That is, the source electrode 30 is embedded in the recessed space demarcated by the barrier forming layer 33.

The barrier forming layer 33 is formed of a material different from the source electrode 30. The barrier forming layer 33 has a potential barrier higher than a potential barrier between the source electrode 30 and the semiconductor layer 10 (specifically, the deep well region 15 described later). The barrier forming layer 33 may be a conductive barrier forming layer. In this case, the barrier forming layer 33 may include at least one type of conductive polysilicon, tungsten, platinum, nickel, cobalt, and molybdenum.

The barrier forming layer 33 is preferably an insulating barrier forming layer. In this case, the barrier forming layer 33 may include at least one type of silicon oxide, impurity non-doped silicon, silicon nitride, aluminum oxide, aluminum nitride, and aluminum oxynitride. The barrier forming layer 33 may be formed of the same material as the gate insulating layer 23. In this case, the barrier forming layer 33 may have the same film thickness as the gate insulating layer 23. For example, where the gate insulating layer 23 and the barrier forming layer 33 are formed of silicon oxide, the gate insulating layer 23 and the barrier forming layer 33 can be formed at the same time by a thermal oxidation treatment method.

The deep well region 15 is formed in a region of the semiconductor layer 10 along the trench source structure 31. The deep well region 15 is referred to as a withstand voltage holding region and is a p-type semiconductor region. The deep well region 15 may have a p-type impurity concentration of not less than $1.0 \times 10^{17}$ cm$^{-3}$ and not more than $1.0 \times 10^{19}$ cm$^{-3}$. The p-type impurity concentration of the deep well region 15 preferably exceeds the n-type impurity concentration of the epitaxial layer 14. The p-type impurity region of the deep well region 15 may be equal to the p-type impurity concentration of the body region 16. The p-type impurity concentration of the deep well region 15 may be less than the p-type impurity concentration of the body region 16.

The deep well region 15 includes a side wall portion 15a which covers the side wall 32a of the source trench 32 and a bottom wall portion 15b which covers the bottom wall 32b of the source trench 32. The side wall portion 15a is electrically connected to the body region 16. The bottom wall portion 15b is formed inside the epitaxial layer 14 at an interval from the semiconductor substrate 13. A thickness (length in the z-axis direction) of the bottom wall portion 15b is preferably not less than a thickness (length in the x-axis direction) of the side wall portion 15a. At least a part of the bottom wall portion 15b may be positioned inside the semiconductor substrate 13.

An aspect ratio of the trench source structure 31 is greater than that of the trench gate structure 21. The aspect ratio of the trench source structure 31 may be not less than 0.5 and not more than 18.0. The aspect ratio of the trench source structure 31 is preferably not less than 1.5 and not more than 4.0. The aspect ratio of the trench source structure 31 is defined by a ratio of a depth (length in the z-axis direction) of the trench source structure 31 in relation to a width (length in the x-axis direction) of the trench source structure 31.

The width of the trench source structure 31 is a sum of a width of the source trench 32 and widths of the side wall portions 15a of the deep well region 15 on both sides of the source trench 32. The depth of the trench source structure 31 is a sum of a depth of the source trench 32 and the thickness of the bottom wall portion 15b of the deep well region 15.

The width of the trench source structure 31 may be not less than 0.6 μm and not more than 2.4 μm. As an example, the width of the trench source structure 31 may be about 0.8 μm. The depth of the trench source structure 31 may be not less than 1.5 μm and not more than 11 μm. As an example, the depth of the trench source structure 31 may be about 2.5 μm. The trench source structure 31 is increased in depth and withstand-voltage holding effects due to an SJ (Supper Junction) structure can be thereby enhanced.

The source region 17 is an n$^+$-type semiconductor region which is formed in a surface layer portion of the first main surface 11 of the semiconductor layer 10. The source region 17 is formed on the body region 16 (a surface layer portion of the body region 16) and connected to the body region 16. The source region 17 is formed in a region along the gate trench 22. The source region 17 covers the gate insulating layer 23 and faces the gate electrode 20 across the gate insulating layer 23.

The source region 17 is formed in a band shape extending in the y-axis direction in plan view. A width (length in the x-axis direction) of the source region 17 may be not less than 0.2 μm and not more than 0.6 μm. As an example, the width of the source region 17 may be about 0.4 μm. An n-type impurity concentration of the source region 17 may be not less than $1.0 \times 10^{18}$ cm$^{-3}$ and not more than $1.0 \times 10^{21}$ cm$^{-3}$.

The contact region 18 is a p$^+$-type semiconductor region which is formed in the surface layer portion of the first main surface 11 of the semiconductor layer 10. The contact region 18 is formed on the body region 16 (a surface layer portion of the body region 16) and connected to the body region 16. The contact region 18 is also connected to the source region 17. The contact region 18 is formed in a region along the source trench 32. The contact region 18 covers the barrier forming layer 33 and faces the source electrode 30 across the barrier forming layer 33.

The contact region 18 is formed in a band shape extending along the y-axis direction in plan view. A width (length in the x-axis direction) of the contact region 18 may be not less than 0.1 μm and not more than 0.4 μm. As an example, the width of the contact region 18 may be about 0.2 μm. A p-type impurity concentration of the contact region 18 may be not less than $1.0 \times 10^{18}$ cm$^{-3}$ and not more than $1.0 \times 10^{21}$ cm$^{-3}$.

The semiconductor device 1 includes a drain electrode 40 which covers the second main surface 12 of the semiconductor layer 10. The drain electrode 40 is electrically connected to the semiconductor substrate 13 on the second main surface 12. The drain electrode 40 may include at least one type of titanium, nickel, copper, aluminum, gold, and silver. The drain electrode 40 may have a four-layer structure including a Ti layer, an Ni layer, an Au layer, and an Ag layer laminated in this order from the second main surface 12.

The drain electrode 40 may have a four-layer structure including a Ti layer, an Al Cu layer, an Ni layer, and an Au layer laminated in this order from the second main surface 12. The AlCu layer is an alloy layer of aluminum and copper. The drain electrode 40 may have a four-layer structure including a Ti layer, an AlSiCu layer, an Ni layer, and an Au layer laminated in this order from the second main surface 12. The AlSiCu layer is an alloy layer of aluminum, silicon, and copper. The drain electrode 40 may have a single layer structure composed of a TiN layer in place of the Ti layer or a laminated structure which includes a Ti layer and a TiN layer.

The vertical transistor 2 is switched between an on state in which a drain current flows and an off state in which no drain current flows, depending on a gate voltage applied to the gate electrode 20. The gate voltage may be not less than 10 V and not more than 50 V. As an example, the gate voltage may be 30 V. A source voltage applied to the source electrode 30 may be a reference voltage which acts as a reference for circuit operation such as a ground voltage (0 V). A drain voltage applied to the drain electrode 40 is a voltage that is not less than the source voltage. The drain voltage may be, for example, not less than 0 V and not more than 10000 V. The drain voltage may be not less than 1000 V.

Where the gate voltage is applied to the gate electrode 20, a channel is formed at a portion in contact with the gate insulating layer 23 of the p$^-$-type body region 16. Thereby, a current channel is formed from the source electrode 30 to the drain electrode 40 by way of the contact region 18, the source region 17, the body region 16 (channel), the epitaxial layer 14, and the semiconductor substrate 13.

The drain electrode 40 is higher in potential than the source electrode 30. Therefore, the drain current flows from the drain electrode 40 to the source electrode 30 by way of the semiconductor substrate 13, the epitaxial layer 14, the body region 16 (channel), the source region 17, and the contact region 18. Thus, the drain current flows along the thickness direction of the semiconductor device 1.

The deep well region 15 forms a pn junction between the deep well region 15 and the epitaxial layer 14. In the on state of the vertical transistor 2, the source voltage is applied via the source electrode 30 to the deep well region 15, and a drain voltage higher than the source voltage is applied via the drain electrode 40 to the epitaxial layer 14. That is, in the on state of the vertical transistor 2, a reverse bias voltage is applied to the pn junction and a depletion layer spreads from the pn junction toward the drain electrode 40.

Thereby, the vertical transistor 2 can be enhanced in withstand voltage. According to the deep well region 15 having the p-type impurity concentration higher than the n-type impurity concentration of the epitaxial layer 14, the depletion layer can be appropriately expanded from an interface portion between the deep well region 15 and the epitaxial layer 14.

In this embodiment, the trench gate structure is adopted. However, a planar gate structure may be adopted. Further, in the preferred embodiment, the trench source structure is formed. However, a configuration with no trench source structure may be adopted. Further, although what-is-called a stripe cell structure is adopted in the preferred embodiment, a mesh cell structure may be adopted.

In the preferred embodiments of the present description, a FET structure (transistor structure) is defined as a structure which has three regions of the source region, the drain region, and the gate region and in which a voltage is applied to the gate region to generate an electric field in the channel region, thereby controlling a current between the source region and the drain region. In this meaning, the FET structure is a concept which includes a junction type FET in addition to a MOSFET, a MISFET, etc.

That is, the FET structure is a concept which also includes an IGBT (Insulated Gate Bipolar Transistor) having an "emitter region" and a "collector region" which correspond respectively to the "source region" and the "drain region." In the preferred embodiments, the FET structure is constituted of the body region 16, the source region 17, the gate electrode 20, the epitaxial layer 14, etc.

In the preferred embodiments of the present description, the active region is a region (demarcated region) of the semiconductor device in which the FET structure is formed. In one semiconductor device, the active region may be one region or may be a plurality of regions which are divided from each other. Further, where a diode structure such as a Schottky barrier diode is formed inside a region including the FET structure, a region which includes the FET structure and the diode structure is defined as the active region. Further, where a region which includes the diode structure is adjacent to a region which includes the FET structure, the region which includes the diode structure and the region which includes the FET structure are defined as the active region.

In the preferred embodiments of the present description, the non-active region is a region other than the active region. A region directly under a gate wiring portion, an outer peripheral withstand-voltage structure portion, a region directly under a PN diode structure for a temperature sensor, etc., are included in examples of the non-active region. In the preferred embodiments of the present description, an FET structure for current detection is defined as the non-active region.

Figure 2:
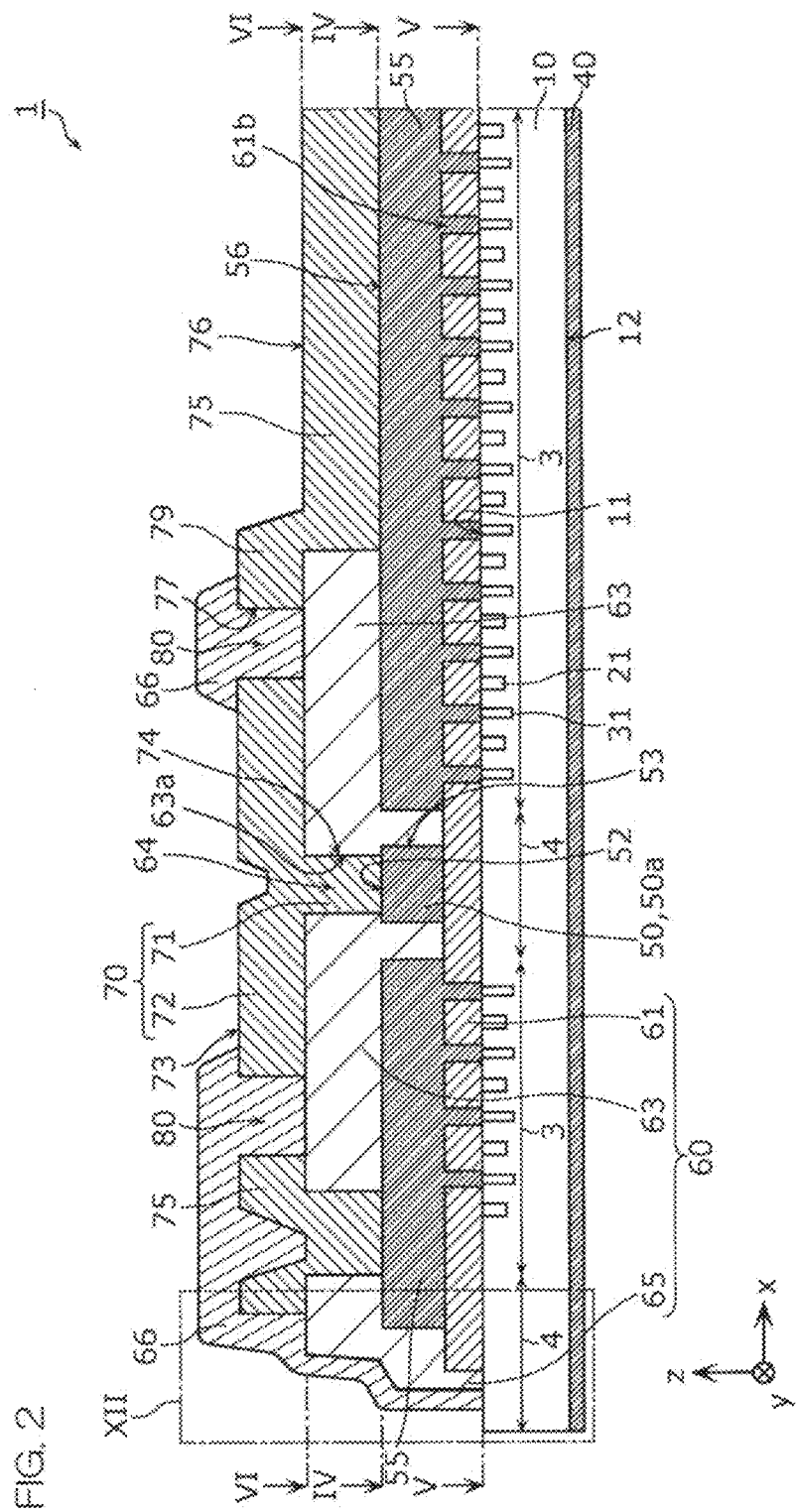
FIG. 2 is a cross-sectional view which shows another main portion of the semiconductor device shown in FIG. 1.
Figure 3:
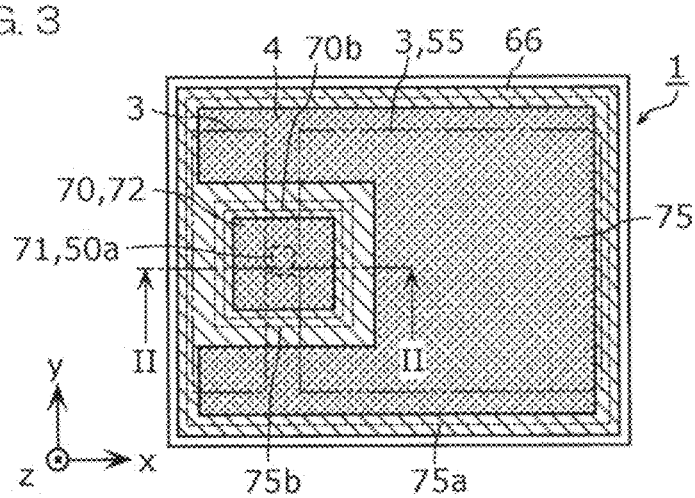
FIG. 3 is a plan view of the semiconductor device shown in FIG. 1.

Next, an entire structure of the semiconductor device 1 (in particular, a pad structure for supplying a predetermined voltage to the gate electrode 20 and the source electrode 30) will be described. FIG. 2 is a cross-sectional view which shows another main portion of the semiconductor device 1 shown in FIG. 1. In FIG. 2, a specific arrangement of the semiconductor layer 10 shown in FIG. 1 is not illustrated. In FIG. 2, hatching that indicates a cross-section of the semiconductor layer 10 is omitted. FIG. 2 shows a cross-section along line II-II in FIG. 3. FIG. 3 is a plan view of the semiconductor device 1 shown in FIG. 1. In FIG. 3, an outer edge 70b of a gate pad 70 (wide portion 72), an outer edge 75a of a source pad 75, and an inner edge 75b of the source pad 75 are indicated by broken lines.

Figure 4:
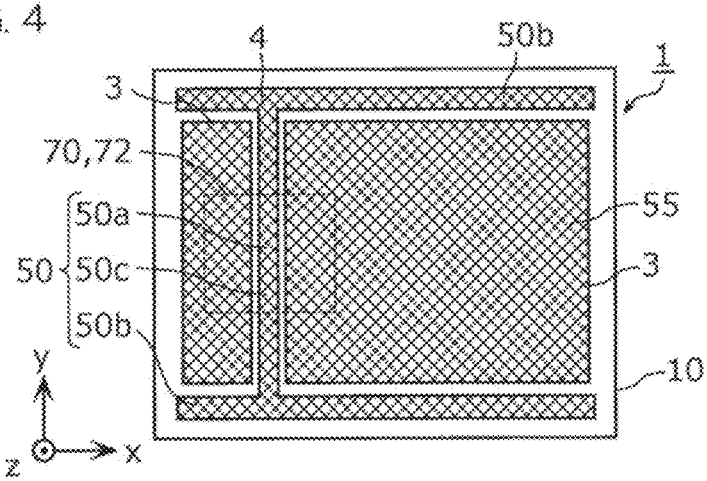
FIG. 4 is a plan view as viewed from a position along line IV-IV shown in FIG. 2.

FIG. 4 is a plan view of the semiconductor device 1 on a plane parallel to a front surface of a substrate as viewed from the position of line IV-IV in FIG. 2. FIG. 4 is a drawing which shows a planar shape of a main surface gate electrode 50 and a planar shape of a main surface source electrode 55. Specifically, FIG. 4 is a plan view when the semiconductor device 1 is viewed from the positive side of the z-axis through the gate pad 70 and the source pad 75 shown in FIG. 3.

Figure 5:
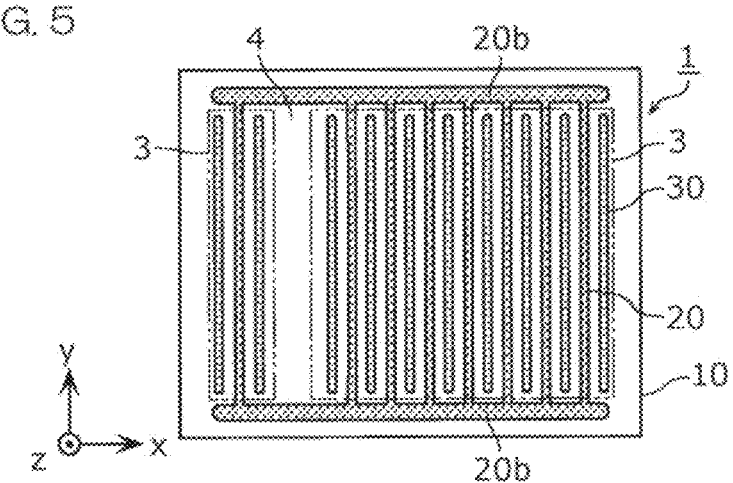
FIG. 5 is a plan view as viewed from a position along line V-V shown in FIG. 2.

FIG. 5 is a plan view of the semiconductor device 1 on a plane parallel to the front surface of the substrate as viewed from the position of line V-V in FIG. 2. FIG. 5 is a drawing which shows a disposition of the gate electrode 20 and the source electrode 30 in plan view. Specifically, FIG. 5 is a plan view when the semiconductor device 1 is viewed from the positive side of the z-axis through the main surface gate electrode 50, the main surface source electrode 55, an insulating layer 60, the gate pad 70, and the source pad 75 (refer also to FIG. 3 and FIG. 4).

Figure 6:
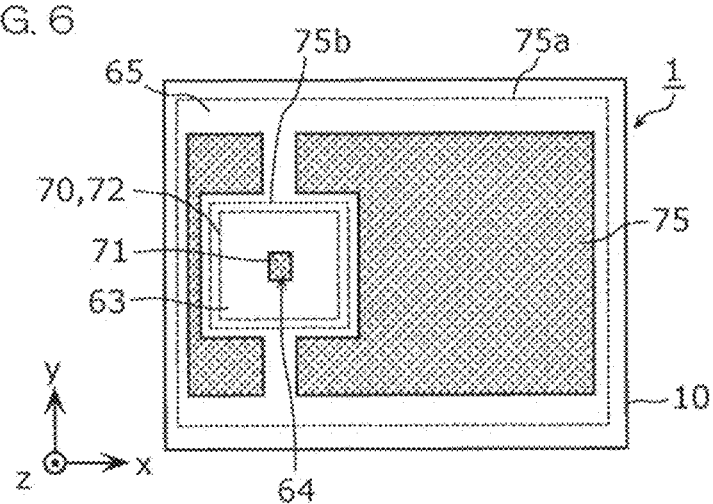
FIG. 6 is a plan view as viewed from a position along line VI-VI shown in FIG. 2.

FIG. 6 is a plan view on a plane parallel to the front surface of the substrate as viewed from the position of line VI-VI in FIG. 2. In FIG. 6, an upper insulating layer 63 and an end insulating layer 65 are indicated by white portions. In FIG. 6, a columnar portion 71 of the main surface gate electrode 50 and the source pad 75 which are exposed from a gap between the upper insulating layer 63 and the end insulating layer 65 are indicated by hatching portions.

Figure 7:
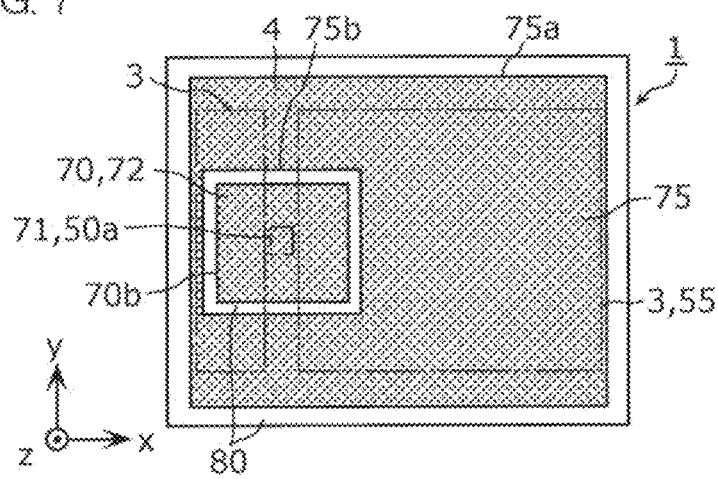
FIG. 7 is a plan view in which a protective insulating layer is removed from the plan view of FIG. 3.

In FIG. 6, the gate pad 70 (wide portion 72) as well as an outer edge 75a and an inner edge 75b of an upper part of the source pad 75 are indicated by broken lines. FIG. 7 is a plan view in which a protective insulating layer 66 is removed from the plan view of FIG. 3. FIG. 7 is a drawing which shows planar shapes of the gate pad 70 and the source pad 75. In other words, FIG. 7 is a plan view in which the protective insulating layer 66 is removed in FIG. 3.

With reference to FIG. 2 and FIG. 3, the semiconductor device 1 is a semiconductor chip, the planar shape of which is rectangular. A length of one side of the semiconductor device 1 may be not less than 1 mm and not more than 10 mm. The length of one side of the semiconductor device 1 may be not less than 2 mm and not more than 5 mm. The semiconductor device 1 includes the main surface gate electrode 50, the main surface source electrode 55, the insulating layer 60, the gate pad 70, the source pad 75, and the protective insulating layer 66.

With reference to FIG. 1 and FIG. 5, the semiconductor device 1 includes a plurality of gate electrodes 20 and a plurality of source electrodes 30 which are embedded in the first main surface 11. The plurality of gate electrodes 20 and the plurality of source electrodes 30 are each formed in a long shape extending along the y-axis direction. The plurality of gate electrodes 20 and the plurality of source electrodes 30 are alternately arrayed along the x-axis direction in plan view to form a stripe structure. In FIG. 5, the number of the gate electrodes 20 and the number of the source electrodes 30 are schematically illustrated to such an extent that they can be counted. However, in reality, the number of the gate electrodes 20 and the number of the source electrodes 30 are much larger than the numbers illustrated.

The semiconductor device 1 includes a plurality of gate finger portions 20b which are electrically connected to the plurality of gate electrodes 20. The plurality of gate finger portions 20b are each arranged at both end portions in the y-axis direction on the semiconductor layer 10 and formed in a long shape extending along the x-axis direction. The plurality of gate finger portions 20b are each connected to both ends of the plurality of gate electrodes 20 in the y-axis direction.

The number of the gate finger portions 20b is arbitrary. Therefore, the single gate finger portion 20b may be connected to only one end of the plurality of gate electrodes 20 in the y-axis direction. The plurality of gate electrodes 20 may be separated at a central portion in the y-axis direction. In this case, the semiconductor device 1 may include a gate finger portion 20b arranged at an inner portion of the semiconductor layer 10 in plan view. The gate finger portion 20b at the inner portion may extend along the x-axis direction in a region between the plurality of gate electrodes 20 adjacent to each other in the y-axis direction. Further, the gate finger portion 20b at the inner portion may be electrically connected to the plurality of gate electrodes 20 which are adjacent to each other in the y-axis direction.

The semiconductor device 1 includes the main surface gate electrode 50 as an example of the first electrode which is electrically connected to the plurality of gate electrodes 20. The main surface gate electrode 50 is positioned above the plurality of gate electrodes 20 (on the positive side in the z-axis direction) and electrically connected to the plurality of gate electrodes 20. The main surface gate electrode 50 may have an area which is not more than 20% of an area of the semiconductor layer 10 (first main surface 11) in plan view. The main surface gate electrode 50 preferably has an area which is not more than 10% of an area of the semiconductor layer 10 (first main surface 11) in plan view.

With reference to FIG. 4, the main surface gate electrode 50 may be formed in an H letter shape in plan view. Specifically, the main surface gate electrode 50 electricity receiving portion 50a, an includes an electricity supplying portion 50b and a connecting portion 50c. The electricity receiving portion 50a is a portion which is positioned directly under the gate pad 70 described later and connected to the columnar portion 71 of the gate pad 70. A portion of the main surface gate electrode 50 which overlaps the columnar portion 71 of the gate pad 70 in plan view corresponds to the electricity receiving portion 50a.

The electricity supplying portions 50b are each arranged at both end portions in the y-axis direction and formed in a long shape extending along the x-axis direction. The electricity supplying portion 50b is connected to the gate finger portion 20b by way of a via conductor (not shown) which penetrates through a lower insulating layer 61 described later.

The connecting portion 50c connects the electricity receiving portion 50a and the electricity supplying portion 50b together. The connecting portion 50c is formed in a long shape extending along the y-axis direction. In the example shown in FIG. 4, the connecting portion 50c is led out from the electricity receiving portion 50a to the positive side and also to the negative side in the y-axis direction and extends up to the electricity supplying portion 50b.

The main surface gate electrode 50 may include a non-metal conductor or a metal. The main surface gate electrode 50 is preferably formed of an aluminum-based metal material. The main surface gate electrode 50 may include, as an example of the aluminum-based metal material, aluminum, an aluminum silicon (Al—Si)-based alloy, an aluminum copper (Al—Cu)-based alloy, etc. As a matter of course, the main surface gate electrode 50 may be formed of conductive polysilicon, tungsten, titanium, nickel, copper, silver, gold, titanium nitride (metal nitride), etc. The main surface gate electrode 50 may be formed of the same material as the gate electrode 20.

The main surface gate electrode 50 may include a non-metal conductor or a metal. The main surface gate electrode 50 is preferably formed of an aluminum-based metal material. The main surface gate electrode 50 may include, as an example of the aluminum-based metal material, aluminum, an aluminum silicon (Al—Si)-based alloy, an aluminum copper (Al—Cu)-based alloy, etc. As a matter of course, the main surface gate electrode 50 may be formed of conductive polysilicon, tungsten, titanium, nickel, copper, silver, gold, titanium nitride (metal nitride), etc. The main surface gate electrode 50 may be formed of the same material as the gate electrode 20.

The main surface gate electrode 50 may have a laminated structure which includes a plurality of metal layers. The main surface gate electrode 50 may include, for example, a base layer and a metal layer laminated in this order from the semiconductor layer 10 side. The base layer may be formed of a barrier metal such as titanium. The metal layer may be formed of an aluminum-based metal material formed on the base layer. The semiconductor device 1 may include a plating layer which covers a front surface of the main surface gate electrode 50.

The semiconductor device 1 includes the main surface source electrode 55 as an example of the second electrode that is electrically connected to the plurality of source electrodes 30. The main surface source electrode 55 is an electrode which is positioned above the plurality of source electrodes 30 (the positive side in the z-axis direction) and electrically connected to the plurality of source electrodes 30. With reference to FIG. 1, the main surface source electrode 55 is directly connected to the upper surfaces of the plurality of source electrodes 30.

The main surface source electrode 55 is arranged at an interval from the main surface gate electrode 50 in plan view. The main surface source electrode 55 may be formed in substantially an entire region other than a region of the first main surface 11 where the main surface gate electrode 50 is arranged and a region on the periphery of the region where the main surface gate electrode 50 is arranged in plan view.

The main surface source electrode 55 is formed larger in area than the main surface gate electrode 50 in plan view. The main surface source electrode 55 may have an area which is not less than 50% of an area of the semiconductor layer 10 (first main surface 11) in plan view. The main surface source electrode 55 preferably has an area which is not less than 70% of an area of the semiconductor layer 10 (first main surface 11) in plan view.

The main surface source electrode 55 may include a non-metal conductor or a metal. The main surface gate electrode 50 is preferably formed of an aluminum-based metal material. The main surface gate electrode 50 may include, as an example of the aluminum-based metal material, aluminum, an aluminum silicon (Al—Si)-based alloy, an aluminum copper (Al—Cu)-based alloy, etc.

As a matter of course, the main surface gate electrode 50 may be formed of conductive polysilicon, tungsten, titanium, nickel, copper, silver, gold, titanium nitride (metal nitride), etc. The main surface source electrode 55 may be formed of the same material as the main surface gate electrode 50. In this case, the main surface source electrode 55 can be formed by the same step as the main surface gate electrode 50.

The main surface source electrode 55 may have a laminated structure which includes a plurality of metal layers. The main surface source electrode 55 may include a base layer and a metal layer laminated in this order from the semiconductor layer 10 side. The base layer may be formed of a barrier metal such as titanium. The layer may be formed of an aluminum-based metal material which is formed on the base layer. The semiconductor device 1 may include a plating layer which covers the front surface of the main surface source electrode 55.

In this embodiment, the main gate electrode 50 includes tungsten, and the main surface source electrode 55 includes tungsten. That is, the active region 3 is covered with the main surface source electrode 55 that includes tungsten having a relatively high hardness. Thereby, the active region 3 can be protected by the main surface source electrode 55. Further, damage to the FET structure due to stress such as wire bonding, etc., can be suppressed in the active region 3. This structure is found particularly effective in a case where wire bonding by copper wire relatively high in hardness is performed on the source pad 75 described later.

In another configuration example, a portion of the main surface gate electrode 50 which is embedded in a through hole (gate contact hole) may be formed of tungsten, and a portion of the main surface gate electrode 50 other than the through hole (gate contact hole) may be formed of an aluminum-based metal material. The portion of the main surface gate electrode 50 other than the through hole (gate contact hole) is a portion which is formed on the lower insulating layer 61 described later. The tungsten may be a pure metal or a tungsten alloy. Further, the tungsten may be formed via a barrier film such as titanium/titanium nitride, etc.

Further, a portion of the main surface source electrode 55 which is embedded in a source contact hole 61b may be formed of tungsten, and a portion of the main surface source electrode 55 other than the source contact hole 61b may be formed of an aluminum-based metal material. The portion of the main surface source electrode 55 other than the through hole (gate contact hole) is a portion which is formed on the lower insulating layer 61 described later. Tungsten may be a pure metal or a tungsten alloy. Further, tungsten may be formed via a barrier film such as titanium/titanium nitride, etc.

In the semiconductor device 1, the main surface source electrode 55 is arranged in a region including a center position of the semiconductor layer 10 in plan view, and the main surface gate electrode 50 is arranged in a region that avoids the main surface source electrode 55. However, the main surface gate electrode 50 and the main surface source electrode 55 may be arranged in an arbitrary manner and are not limited to the aforementioned disposition. For example, the main surface gate electrode 50 may be arranged in a region which includes the center position of the semiconductor layer 10 in plan view, and the main surface source electrode 55 may be arranged in such a manner as to surround a periphery of the main surface gate electrode 50 in plan view.

With reference to FIG. 2, the insulating layer 60 includes the lower insulating layer 61, the upper insulating layer 63 as an example of a first insulating layer (first insulator), and the end insulating layer 65. The lower insulating layer 61 is an interlayer insulating film and provided on the first main surface 11. Specifically, the lower insulating layer 61 covers collectively the plurality of trench gate structures 21. With reference to FIG. 1, the lower insulating layer 61 is provided for preventing the main surface source electrode 55 from coming into contact with the gate electrode 20.

The lower insulating layer 61 has a plurality of source contact holes 61b. A part of the main surface source electrode 55 is embedded in the plurality of source contact holes 61b and electrically connected to the plurality of source electrodes 30 inside the plurality of source contact holes 61b. Further, the main surface source electrode 55 is electrically connected to the source region 17 and the contact region 18 inside the plurality of source contact holes 61b.

Although not shown, the lower insulating layer 61 includes at least one (plural in this embodiment) through hole (gate contact hole) for exposing the electricity supplying portion 50b. A part of the electricity supplying portion 50b (refer to FIG. 4) of the main surface gate electrode 50 is embedded in the plurality of through holes (gate contact holes) and electrically connected to the gate finger portion 20b (refer to FIG. 5) inside the plurality of through holes (gate contact holes). Thereby, the main surface gate electrode 50 is electrically connected to the gate electrode 20.

The plurality of through holes (gate contact holes) are preferably formed at the same time as the plurality of source contact holes 61b. In this case, a material and a structure of the main surface gate electrode 50 (electricity supplying portion 50b) embedded in the plurality of through holes (gate contact holes) are the same as those of the main surface source electrode 55 embedded in the plurality of source contact holes 61b.

The upper insulating layer 63 covers a part of the main surface gate electrode 50 and a part of the main surface source electrode 55. The upper insulating layer 63 is interposed between the gate pad 70 described later and the main surface source electrode 55 such that the gate pad 70 will not be in contact with the main surface source electrode 55. Further, the upper insulating layer 63 is interposed between the source pad 75 described later and the main surface gate electrode 50 such that the source pad 75 will not be in contact with the main surface gate electrode 50.

The upper insulating layer 63 has a through hole 64 which covers the connecting portion 50c of the main surface gate electrode 50 and selectively exposes the electricity receiving portion 50a. Specifically, the upper insulating layer 63 exposes a part of an upper surface 52 of the electricity receiving portion 50a via the through hole 64. In this embodiment, one through hole 64 is formed at a portion of the upper insulating layer 63 which faces a substantially central position of the gate pad 70.

The gate pad 70 is connected only to the upper surface 52 of the electricity receiving portion 50a via the through hole 64. A planar shape of the through hole 64 (planar shape of the columnar portion 71 described later) may be square or rectangular. The length of one side of the through hole 64 in plan view may be not less than 5 μm and not more than 50 μm. As an example, the planar shape of the through hole 64 is a square of about 20 μm×20 μm.

Figure 8:
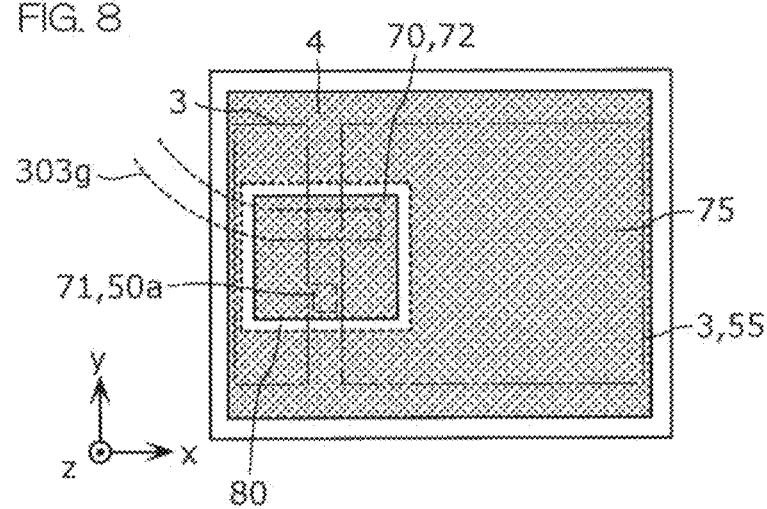
FIG. 8 is a plan view which shows a layout example of a through hole for a gate pad.

The through hole 64 may be provided in various types of layouts. Another layout example of the through hole 64 will be described hereinafter. FIG. 8 is a plan view which shows a layout example of the through hole 64 for the gate pad 70. In FIG. 8, the protective insulating layer 66 is not shown. With reference to FIG. 8, the through hole 64 may be arranged in the vicinity of an edge portion of the gate pad 70. In this case, a bonding wire 303g (shown by broken lines) is preferably connected to the gate pad 70 so as not to overlap the through hole 64 (columnar portion 71) in plan view. According to this structure, stress upon wire bonding imparted to the through hole 64 (columnar portion 71) can be suppressed.

Figure 9:
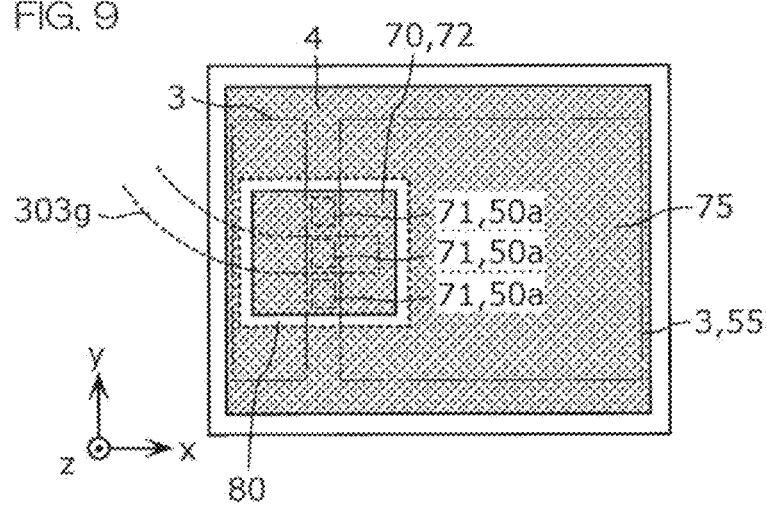
FIG. 9 is a plan view which shows another layout example of the through hole for the gate pad.

FIG. 9 is a plan view which shows another layout example of the through hole 64 for the gate pad 70. With reference to FIG. 9, the upper insulating layer 63 may have the plurality of through holes 64 for one gate pad 70. In this case, the plurality of through holes 64 (columnar portions 71) are formed in a region where the gate pad 70 and the main surface gate electrode 50 overlap with each other in plan view. Thereby, the gate pad 70 and the main surface gate electrode 50 can be reliably conducted. The bonding wire 303g (shown by broken lines) is preferably connected so as not to overlap at least some of the through holes 64 (columnar portions 71).

With reference to FIG. 2 again, the upper insulating layer 63 is interposed between the gate pad 70 and the main surface source electrode 55 in terms of the z-axis direction. Thereby, the gate pad 70 is insulated from the main surface source electrode 55 by the upper insulating layer 63. The upper insulating layer 63 is formed by etching (patterning), and a side surface 63a of the upper insulating layer 63 is thereby formed in a plane extending vertically (in the z-axis direction) with respect to the first main surface 11. Here, "vertical" means being substantially vertical and is not in a strict sense.

The end insulating layer 65 covers an outer peripheral portion (peripheral edge portion) of the semiconductor device 1 (semiconductor layer 10). The end insulating layer 65 covers the outer peripheral portion (peripheral edge portion) of the semiconductor device 1 (semiconductor layer 10) in its entirety. The end insulating layer 65 covers the electricity supplying portion 50b of the main surface gate electrode 50. A part of the end insulating layer 65 rides on the lower insulating layer 61 and the main surface source electrode 55.

The lower insulating layer 61, the upper insulating layer 63 and the end insulating layer 65 may include an inorganic insulating material. The inorganic insulating material may include silicon oxide, silicon nitride, etc. Silicon oxide includes PSG (Phosphor Silicate Glass), BPSG (Boron Phosphor Silicate Glass), etc. The lower insulating layer 61, the upper insulating layer 63, and the end insulating layer 65 may include an organic insulating material. The organic insulating material may include polyimide, PBO (polybenzoxazole), etc.

The lower insulating layer 61, the upper insulating layer 63 and the end insulating layer 65 may be formed of the same insulating material or may be formed of insulating materials different from each other. For example, the lower insulating layer 61, the upper insulating layer 63, and the end insulating layer 65 may be all formed of silicon oxide. As a matter of course, while the lower insulating layer 61 is formed of silicon oxide, the upper insulating layer 63, and the end insulating layer 65 may be formed of silicon nitride.

Both of the upper insulating layer 63 and the end insulating layer 65 may be not less than 3 µm and not more than 20 µm in thickness. The upper insulating layer 63 and the end insulating layer 65 are preferably not less than 5 µm and not more than 15 µm in thickness. The upper insulating layer 63 and the end insulating layer 65 are in particular preferably not less than 5 µm and not more than 10 µm in thickness.

The semiconductor device 1 includes the gate pad 70 as an example of the first electrode pad (first terminal electrode) that is electrically connected to the main surface gate electrode 50. The gate pad 70 overlaps the main surface gate electrode 50 in plan view and is electrically connected to the main surface gate electrode 50. Specifically, the gate pad 70 is arranged such that the electricity receiving portion 50a of the main surface gate electrode 50 will be positioned inside the gate pad 70 in plan view. That is, the gate pad 70 completely covers the electricity receiving portion 50a of the main surface gate electrode 50.

With reference to FIG. 2, the gate pad 70 includes the columnar portion 71 as an example of the lower conductive layer and the wide portion 72 as an example of the upper conductive layer. The columnar portion 71 is provided on the main surface gate electrode 50. Specifically, the columnar portion 71 is connected to the upper surface 52 of the electricity receiving portion 50a and formed in a columnar shape extending in a normal line direction (z-axis direction) of the upper surface 52. The height of the columnar portion 71 is equal to a thickness of a portion of the upper insulating layer 63 which is positioned on the electricity receiving portion 50a. The columnar portion 71 is formed inwardly at an interval from a peripheral edge of the electricity receiving portion 50a in plan view. That is, a side surface 74 of the columnar portion 71 which faces in the y-axis direction is positioned inside the main surface gate electrode 50 with respect to a side surface 53 of the main surface gate electrode 50 which faces in the y-axis direction.

The wide portion 72 is provided at an upper end of the columnar portion 71 and connects the electricity receiving portion 50a and the columnar portion 71 together. The wide portion 72 is a portion in which the upper end of the columnar portion 71 is expanded in size. That is, the wide portion 72 is formed larger in area than the columnar portion 71 in plan view. The wide portion 72 is formed such that the columnar portion 71 will be positioned inside the wide portion 72 in plan view. The size and a shape of the wide portion 72 match those of the gate pad 70 in plan view.

The wide portion 72 is formed such as to expand further toward the outside than the electricity receiving portion 50a in plan view. In this embodiment, the wide portion 72 is formed in an umbrella shape which expands from the electricity receiving portion 50a further toward the outside than the main surface gate electrode 50 in a direction (x-axis direction) orthogonal to a direction (y-axis direction) that the main surface gate electrode 50 extends. In this embodiment, the wide portion 72 expands in an umbrella shape toward both the negative side and the positive side in the x-axis direction.

Thereby, the width of the wide portion 72 in the x-axis direction becomes larger than the width of the main surface gate electrode 50 in the x-axis direction. That is, the gate pad 70 has an intersecting portion which intersects at least one side (two sides in this embodiment) of the main surface gate electrode 50 in plan view. A portion of an upper surface 73 of the wide portion 72 which overlaps the columnar portion 71 in plan view is recessed toward the main surface gate electrode 50.

The upper surface 73 of the wide portion 72 is used in electrically connecting the semiconductor device 1 and other circuits together. For example, the upper surface 73 of the wide portion 72 is electrically connected to a power circuit which supplies a gate voltage. A metal wire may be connected by wire bonding to the upper surface 73 of the wide portion 72. The metal wire may include at least one type of aluminum, copper, and gold. In this embodiment, an aluminum wire is wedge-bonded to the gate pad 70 (upper surface 73 of the wide portion 72). A metal plate may be connected to the upper surface 73 of the wide portion 72 by soldering in place of wire bonding.

The gate pad 70 has an area which is not more than 20% of an area of the semiconductor layer 10 (first main surface 11) in plan view. The gate pad 70 preferably has an area which is not more than 10% of an area of the semiconductor layer 10 (first main surface 11) in plan view. The wide portion 72 (area of the gate pad 70) has an area larger than an area of the electricity receiving portion 50a (that is, columnar portion 71) in plan view. The wide portion 72 may be not less than 200 times and not more than 40000 times larger in area than the electricity receiving portion 50a. The wide portion 72 is preferably not less than 400 times larger in area than the electricity receiving portion 50a. As an example, the wide portion 72 may be about 2500 times larger in area than the electricity receiving portion 50a.

In order to perform wire bonding appropriately, the wide portion 72 (gate pad 70) needs to have a size larger than a fixed size. The wide portion 72 preferably has an area which is not less than 800 µm×800 µm and not more than 1 mm×1 mm in plan view. In this case, the wide portion 72 may be formed in a square shape in plan view. In this case, connection of the metal wire can be set in any given direction. As a matter of course, the wide portion 72 may be formed in a square shape larger than 1 mm×1 mm in plan view. Further, the wide portion 72 may be formed in a rectangular shape which is not less than 400 µm×800 µm.

The columnar portion 71 and the wide portion 72 may be formed of the same conductive material. The columnar portion 71 and the wide portion 72 may be formed of an aluminum-based metal material. As a matter of course, the columnar portion 71 and the wide portion 72 may be formed of titanium, nickel, copper, silver, gold, tungsten, etc. The columnar portion 71 and the wide portion 72 may be formed of conductive materials which are different from each other.

The height of the gate pad 70 may be not less than several dozen micrometers and not more than several hundred micrometers (that is, not less than 20 µm and less than 1000 µm). The height of the gate pad 70 (length in the z-axis direction) is calculated from a sum of the height of the columnar portion 71 (length in the z-axis direction) and the thickness of the wide portion 72 (length in the z-axis direction). FIG. 2 shows an example in which the height of the columnar portion 71 is equal to the thickness of the wide portion 72. However, the height of the columnar portion 71 may be larger than the thickness of the wide portion 72 or may be smaller than the thickness of the wide portion 72.

The semiconductor device 1 includes the source pad 75 as an example of the second electrode pad (second terminal electrode) which is electrically connected to the main surface source electrode 55. The source pad 75 overlaps the main surface source electrode 55 in plan view and is electrically connected to the main surface source electrode 55. The source pad 75 is provided on the main surface source electrode 55. That is, the source pads 75 covers an upper surface 56 of the main surface source electrode 55. By giving a normal line direction (z-axis direction) of the upper surface 56 of the main surface source electrode 55 as a thickness direction, the source pad 75 is formed in a plate shape extending along the upper surface 56.

The source pad 75 is arranged in a region including a center position of the semiconductor layer 10 (first main surface 11) in plan view. The source pad 75 is arranged in a region that avoids the gate pad 70. In this embodiment, the gate pad 70 is arranged in a region which includes the center position of the semiconductor layer 10 (first main surface 11) and the source pad 75 is arranged such as to surround a periphery of the gate pad 70.

An end portion 79 of the source pad 75 at the negative side in the x-axis direction rides on the upper insulating layer 63 from above the main surface source electrode 55. A side surface 77 of the source pad 75 is positioned on the upper insulating layer 63. The source pad 75 has an area smaller than the area of the main surface source electrode 55 in plan view. The source pad 75 has an area larger than an area of the gate pad 70 in plan view. The source pad 75 has an area which is not less than 50% of an area of the semiconductor layer 10 (first main surface 11) in plan view. The source pad 75 preferably has an area which is not less than 70% of an area of the semiconductor layer 10 (first main surface 11) in plan view.

The source pad 75 is arranged at an interval from the gate pad 70 in plan view and forms a gap portion which exposes the upper insulating layer 63 between the source pad 75 and the gate pad 70 above the main surface source electrode 55. The gap portion is demarcated by a portion of the side surface of the gate pad 70 which is positioned above the main surface source electrode 55 and a portion of the side surface 77 of the source pad 75 which is positioned above the main surface source electrode 55.

Thereby, it is possible to suppress a short circuit caused by contact of the gate pad 70 with the source pad 75 above the main surface source electrode 55 and also to form the source pad 75 stably. In this embodiment, the side surface 77 of the source pad 75 is formed in a plane extending vertically or substantially vertically to the first main surface 11. However, the side surface 77 does not necessarily have to be a plane but may be a curved surface or a surface having irregularities.

An upper surface 76 of the source pad 75 is used in electrically connecting the semiconductor device 1 and other circuits together. For example, the upper surface 76 of the source pad 75 is connected to a power circuit that supplies a source voltage. A metal wire may be connected by wire bonding to the upper surface 76 of the source pad 75. The metal wire may include at least one type of aluminum, copper, and gold. In this embodiment, for example, an aluminum wire is wedge-bonded to the source pad 75. A metal plate may be connected to the source pad 75 by soldering in place of wire bonding.

The source pad 75 is formed of a conductive material. The source pad 75 may be formed of an aluminum-based metal material. As a matter of course, the source pad 75 may be formed of titanium, nickel, copper, silver, gold, tungsten, etc. The source pad 75 may be formed of the same material as the gate pad 70. In this case, the source pad 75 can be formed by the same step as the gate pad 70. As a matter of course, the source pad 75 may be formed of a material different from the gate pad 70.

The gate pad 70 is preferably formed by the same step as the source pad 75. In this case, a structure and a material of the gate pad 70 are the same as those of the source pad 75. Where the source pad 75 is wire-bonded by an aluminum wire, the source pad 75 is preferably constituted of an aluminum-based material. In this case, the gate pad 70 is also constituted of an aluminum-based material, as with the source pad 75.

Where the source pad 75 is connected to a metal plate by soldering, a plating layer may be formed on the front surface of the source pad 75. In this case, the source pad 75 may be constituted of an aluminum-based metal material. Further, the plating layer may include at least one of nickel plating and gold plating. The plating layer may have a single layer structure composed of nickel plating or may have a laminated structure which includes nickel plating and gold plating laminated in this order from the source pad 75 side.

In this case, the gate pad 70 may be similar in arrangement to the source pad 75. That is, the plating layer may be formed on the front surface of the gate pad 70. In this case, the gate pad 70 may be constituted of an aluminum-based metal material. Further, the plating layer may include at least one of nickel plating and gold plating. The plating layer may have a single layer structure composed of nickel plating or may have a laminated structure which includes nickel plating and gold plating laminated in this order from the gate pad 70 side.

Where the source pad 75 is connected to a metal plate by a sintered member such as Ag, the plating layer may be formed on the front surface of the source pad 75. In this case, the source pad 75 may be constituted of an aluminum-based metal material. Further, the plating layer may include at least one of nickel plating, palladium plating, and gold plating. For example, the plating layer may have a laminated structure which includes nickel plating, palladium plating, and gold plating laminated in this order from the source pad 75 side.

In this case, the gate pad 70 may be similar in arrangement to the source pad 75. That is, the plating layer may be formed on the front surface of the gate pad 70. In this case, the gate pad 70 may be constituted of an aluminum-based metal material. Further, the plating layer may include at least one of nickel plating, palladium plating, and gold plating. For example, the plating layer may have a laminated structure which includes nickel plating, palladium plating, and gold plating laminated in this order from the gate pad 70 side.

Here, an example in which the gate pad 70 and the source pad 75 include an aluminum-based material is shown. However, the gate pad 70 and the source pad 75 may be formed of a metal material such as copper and nickel in place of the aluminum-based material. That is, the gate pad 70 may include the columnar portion 71 and the wide portion 72 which are formed of a metal material such as copper and nickel.

Figure 10:
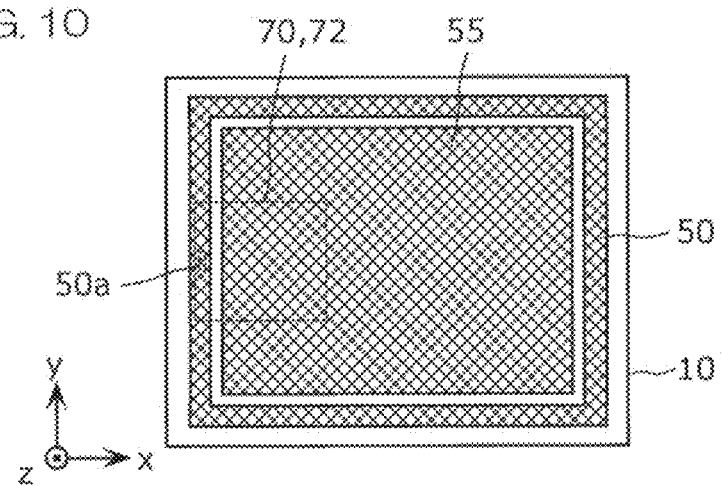
FIG. 10 is a plan view which shows another layout example of a main surface gate electrode and a main surface source electrode.

The main surface gate electrode 50, the main surface source electrode 55, the gate pad 70, and the source pad 75 can be formed in various types of layouts in addition to the above description. FIG. 10 is a plan view which shows another layout example of the gate pad 70 and the electricity receiving portion 50*a*. In other words, FIG. 10 is a drawing which shows another layout example of the main surface gate electrode 50 and the main surface source electrode 55. With reference to FIG. 10, the electricity receiving portion 50*a* of the main surface gate electrode 50 may be arranged at an outermost peripheral portion (peripheral edge portion) of the semiconductor device 1 (chip, semiconductor layer 10).

The wide portion 72 may be formed in an umbrella shape which expands only toward the positive side in the x-axis direction. That is, the gate pad 70 has an intersecting portion which intersects at least one side (one side in this embodiment) of the main surface gate electrode 50 in plan view. In the layout example shown in FIG. 10, the main surface source electrode 55 is formed in a rectangular shape in plan view and formed in a rectangular annular shape which surrounds the main surface source electrode 55 when the main surface gate electrode 50 is viewed in plan view.

Figure 11:
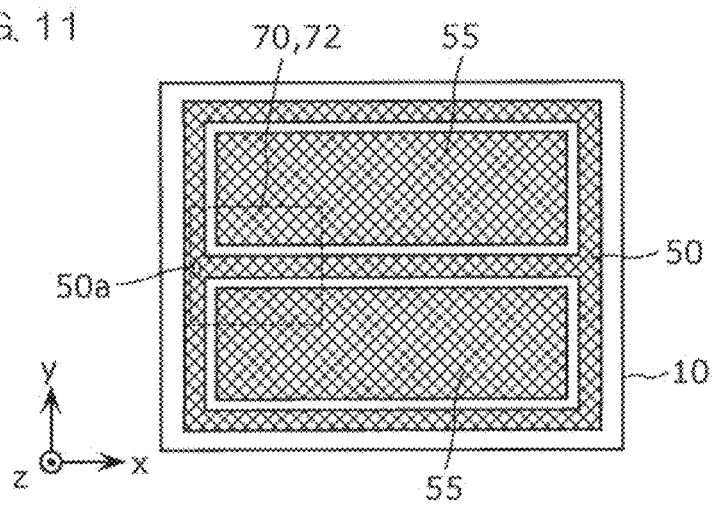
FIG. 11 is a plan view which shows still another layout example of the main surface gate electrode and the main surface source electrode.

FIG. 11 is a plan view which shows still another layout example of the main surface gate electrode 50 and the main surface source electrode 55. FIG. 11 shows an example in which the main surface gate electrode 50 also has a portion which extends from the electricity receiving portion 50*a* in the x-axis direction in the layout example of FIG. 10. Thus, the disposition of the main surface gate electrode 50 and the main surface source electrode 55 as well as the disposition of the gate pad 70 with respect to the main surface gate electrode 50 and the main surface source electrode 55 can take on various types of configurations.

With reference to FIG. 2 to FIG. 5 again, the semiconductor device 1 includes the active region 3 and the non-active region 4. In FIG. 3 and FIG. 5, the active region 3 is indicated by a region surrounded by alternate long and short dashed lines. The active region 3 is a region where the FET structure is formed and a main region through which a drain current of the vertical transistor 2 flows. The active region 3 substantially matches a region covered by the main surface source electrode 55. The non-active region 4 is a region other than the active region 3. A region in which the main surface gate electrode 50 is arranged and a withstand-voltage structure region on its outer periphery (at the peripheral edge side) are the non-active region 4.

In a semiconductor device, in general, a gate pad 70 with a fixed size is needed for wire-bonding a metal wire. Where a main surface gate electrode 50 is formed to have substantially the same size as a gate pad 70, a main surface source electrode 55 is formed relatively small. An active region 3 is substantially equal in size to a main surface source electrode 55. Therefore, when the main surface gate electrode 50 is made large, the main surface source electrode 55 is accordingly reduced in size and the active region 3 is made small. As a result, a semiconductor layer 10 is no longer used effectively, thus having an adverse effect on a reduction in size and cost of the semiconductor device.

In contrast thereto, in the semiconductor device 1, the main surface gate electrode 50 is formed, and the gate pad 70 (wide portion 72) which multi-level intersects the active region 3 is provided. According to this structure, a wire bonding target is changed from the main surface gate electrode 50 to the gate pad 70. Thereby, the main surface gate electrode 50 can be reduced in size and the active region 3 can be increased in size. That is, in the semiconductor device 1, design rules derived from the main surface gate electrode 50 are relaxed by the gate pad 70 to enhance the degree of freedom in design.

Specifically, a part of the gate pad 70 (wide portion 72) overlaps the main surface source electrode 55 in plan view. More specifically, the gate pad 70 has a width larger than a width of the main surface gate electrode 50 in terms of the x-axis direction in plan view and overlaps a part of the main surface source electrode 55. Thereby, the main surface gate electrode 50 can be reduced in area and the active region 3 can be increased in area. Further, while design rules derived from the main surface gate electrode 50 are avoided, the gate pad 70 can be formed in a size larger than a fixed size. Therefore, the limited region of the semiconductor layer 10 can be used effectively to realize the semiconductor device 1 capable of easily reducing the size and cost.

With reference to FIG. 3, the semiconductor device 1 includes the protective insulating layer 66 as an example of the second insulating layer (second insulator) formed on the upper insulating layer 63. The protective insulating layer 66 covers a boundary portion 80 (gap portion) between the gate pad 70, and the source pad 75. That is, the protective insulating layer 66 includes a portion which covers the upper insulating layer 63 inside the boundary portion 80 between the gate pad 70 and the source pad 75 above the main surface source electrode 55. The protective insulating layer 66 has a portion which faces the main surface source electrode 55 across the upper insulating layer 63 inside the boundary portion 80.

The boundary portion 80 is formed in a rectangular annular shape in plan view. Therefore, the protective insulating layer 66 is formed in a rectangular annular shape at a portion which covers the boundary portion 80. Further, the protective insulating layer 66 covers the outer peripheral portion (peripheral edge portion) of the semiconductor device 1 (first main surface 11) in its entirety. The protective insulating layer 66 may include an organic insulating material. The protective insulating layer 66 may include polyimide, PBO, etc.

Figure 12:
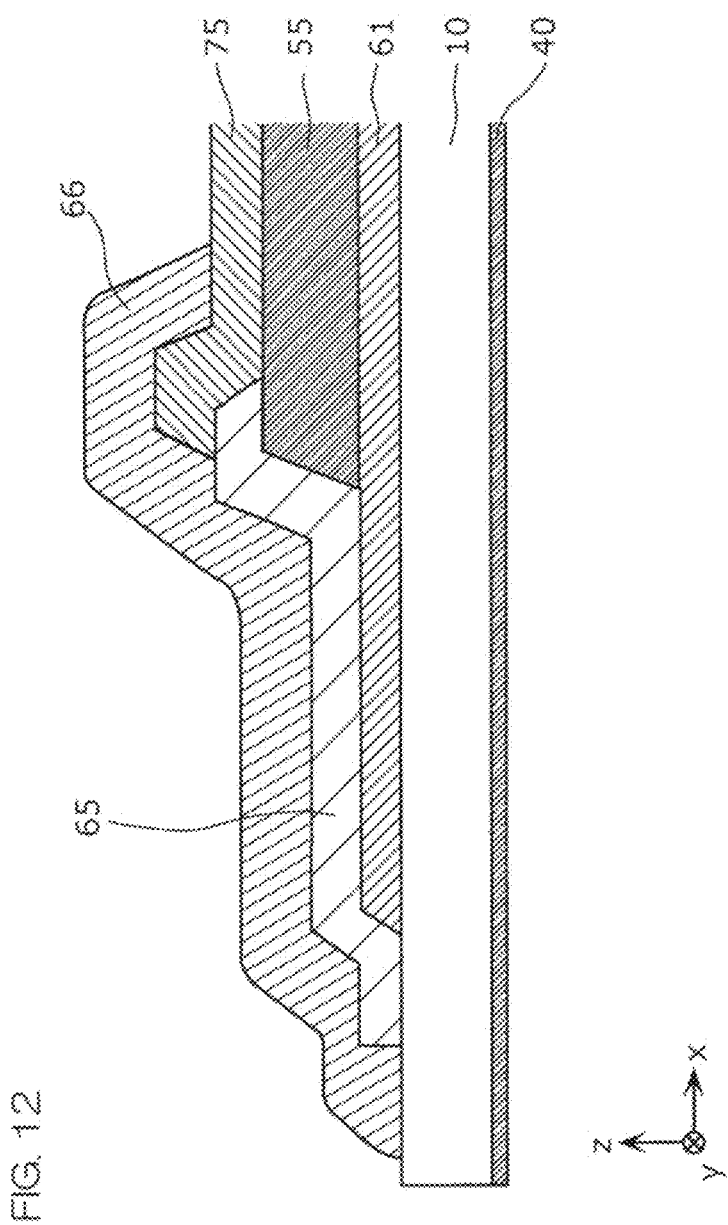
FIG. 12 is an enlarged cross-sectional view which shows an outer peripheral portion of the semiconductor device shown in FIG. 2.

FIG. 12 is an enlarged cross-sectional view which shows the outer peripheral portion (peripheral edge portion) of the semiconductor device 1 (first main surface 11) and a drawing which shows the region XII of FIG. 2 in more detail. With reference to FIG. 12, in the outer peripheral portion (peripheral edge portion) of the semiconductor device 1 (first main surface 11), an end portion of the end insulating layer 65 at the positive side in the x-axis direction rides on the main surface source electrode 55 such as to be positioned on the main surface source electrode 55. An end portion of the source pad 75 at the negative side in the x-axis direction is positioned on the end portion of the end insulating layer 65 at the positive side in the x-axis direction. The protective insulating layer 66 covers the end portion of the end insulating layer 65 at the positive side in the x-axis direction and the end portion of the source pad 75 at the negative side in the x-axis direction.

In an environment which meets at least one of high voltage, high temperature and high humidity, migration of impurities inside a module gel and intrusion of water into the module gel, etc., may occur. Where there is found a deterioration in the structure of the outer peripheral portion (peripheral edge portion) of the semiconductor layer 10 due to influence of temperature cycles and humidity, with the deteriorated site as a starting point, the substance (element) may enter into the device, thus causing problems such as a short circuit, discharge of electricity, malfunction, etc.

In the semiconductor device 1, the outer peripheral portion (peripheral edge portion) of the semiconductor layer 10 is covered in a predetermined pattern by the lower insulating layer 61, the protective insulating layer 66, and the end insulating layer 65 (upper insulating layer 63). Therefore, as compared with a case where the outer peripheral portion (peripheral edge portion) of the semiconductor layer 10 is covered with the lower insulating layer 61 and the protective insulating layer 66, the deterioration of the outer peripheral portion (peripheral edge portion) is suppressed. That is, intrusion of water, etc., with a deteriorated site as a starting point is suppressed to enhance the reliability of the semiconductor device 1.

FIG. 13A to FIG. 13E are each a cross-sectional view which shows individual steps of a method for manufacturing the semiconductor device 1. Hereinafter, the method for manufacturing an upper arrangement of the semiconductor layer 10 will be mainly described. A publicly known method is used in a method for forming the trench gate structure 21, the trench source structure 31 and each of the semiconductor regions (each of well regions) in the semiconductor layer 10.

First, with reference to FIG. 13A, the lower insulating layer 61 having the plurality of source contact holes 61b is formed on the first main surface 11 of the semiconductor layer 10. A step of forming the lower insulating layer 61 includes, for example, a step which forms an insulating film such as silicon oxide by a plasma CVD (Chemical Vapor Deposition) method and a step in which a part of the insulating film (silicon oxide) after film formation is removed by a photolithography method and an etching method. Thereby, the insulating film is patterned to form the lower insulating layer 61 having a predetermined pattern.

Figure 13B:
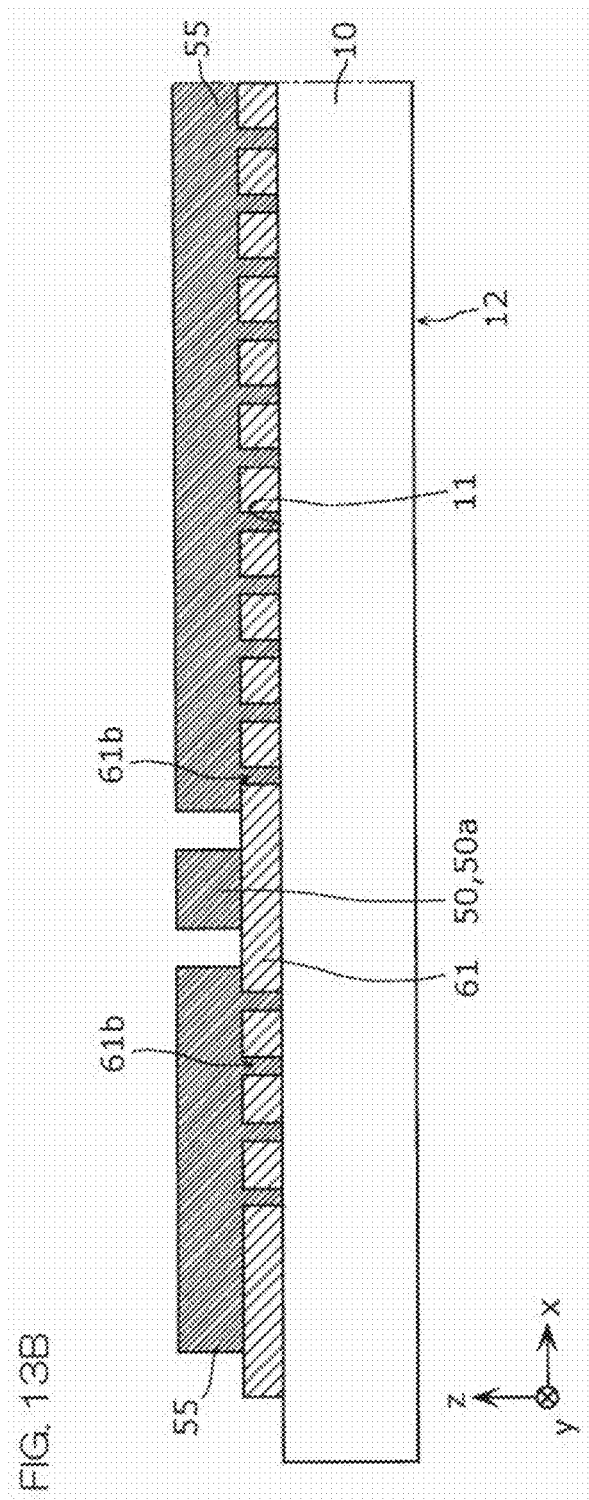
FIG. 13B is a cross-sectional view which shows a step subsequent to that of FIG. 13A.

Next, with reference to FIG. 13B, the main surface gate electrode 50 and the main surface source electrode 55 are formed at an interval on the lower insulating layer 61. A step of forming the main surface gate electrode 50 and the main surface source electrode 55 includes, for example, a step in which a metal film is formed on an entire surface of the first main surface 11 by a vapor deposition method or a sputtering method such as to cover the lower insulating layer 61 and a step in which a part of the metal film after film formation is removed by a photolithography method and an etching method.

Thereby, the metal film is patterned to form the main surface gate electrode 50 having a predetermined pattern and the main surface source electrode 55 having a predetermined pattern. The main surface gate electrode 50 and the main surface source electrode 55 may be formed through a different step by repeating a step of forming the metal film using a different material and a patterning step.

Next, with reference to FIG. 13C, the upper insulating layer 63 having the through hole 64 and the end insulating layer 65 are formed on the lower insulating layer 61. A step of forming the upper insulating layer 63 and the end insulating layer 65 includes, for example, a step which forms an insulating film such as silicon oxide by a plasma CVD method and a step in which a part of the insulating film (silicon oxide) after film formation is removed by a photolithography method and an etching method.

The upper insulating layer 63 and the end insulating layer 65 may be formed of an organic insulating material (for example, a photosensitive resin material such as polyimide). In this case, a step of forming the upper insulating layer 63 and the end insulating layer 65 includes, for example, a step in which a liquid-type photosensitive resin material that is to be a base of each of the insulating layers is coated on the upper surface 52 of the main surface gate electrode 50 and the upper surface 56 of the main surface source electrode 55 by a spin coating method and a step in which the photosensitive resin material after coating is cured by exposure and, thereafter, the photosensitive resin material after being cured is removed by development (for example, a wet etching method).

Figure 13D:
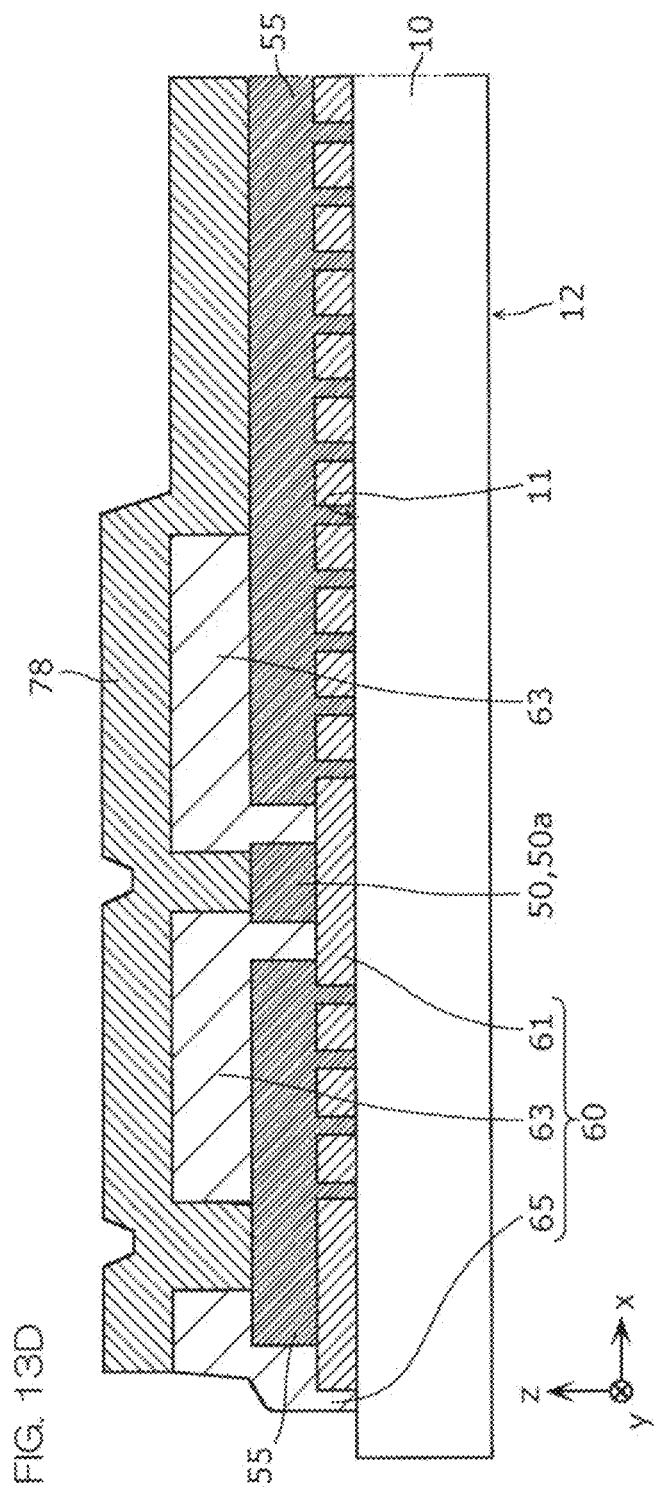
FIG. 13D is a cross-sectional view which shows a step subsequent to that of FIG. 13C.

Next, with reference to FIG. 13D, a metal film 78 is formed on an entire surface of the first main surface 11 such as to cover the upper insulating layer 63. The metal film 78 is formed, for example, by a vapor deposition method or a sputtering method.

Figure 13E:
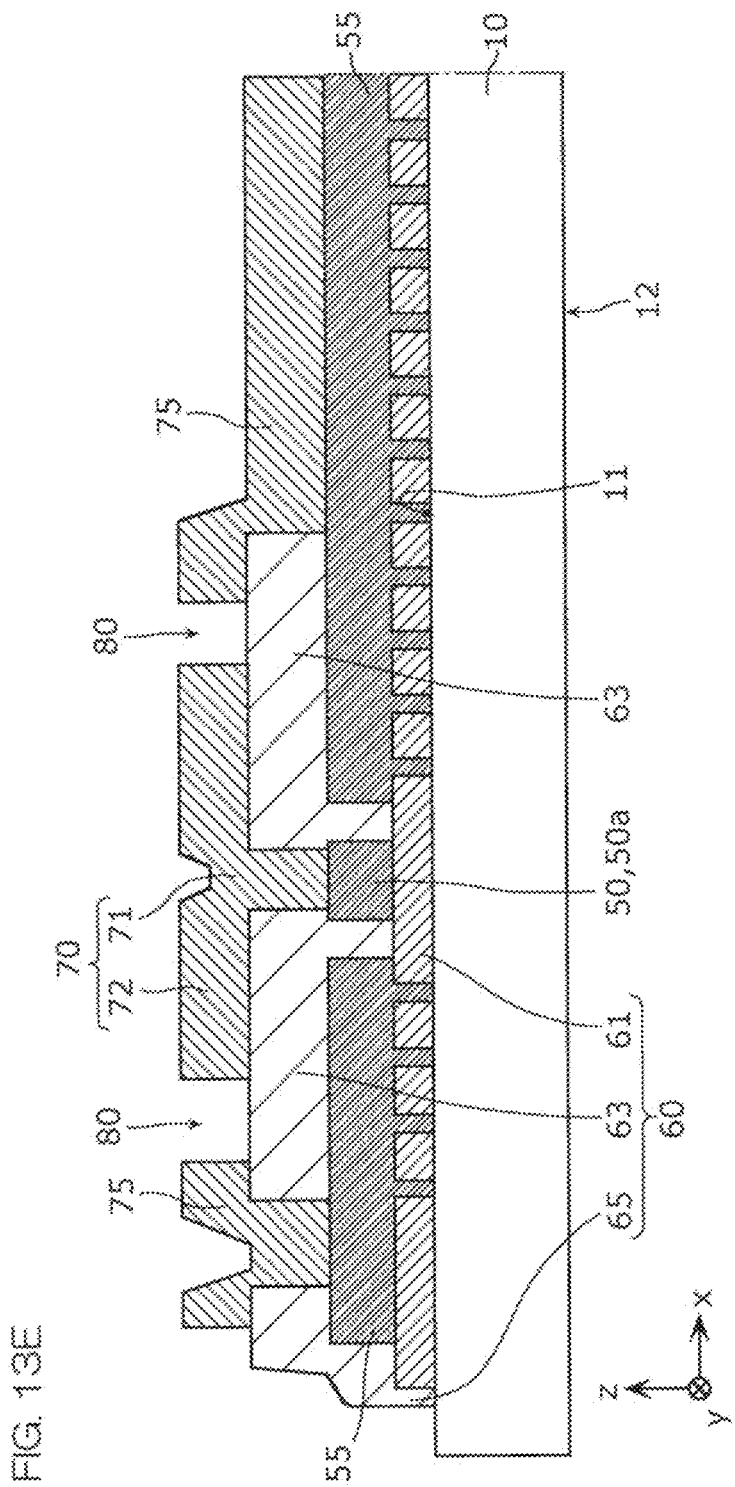
FIG. 13E is a cross-sectional view which shows a step subsequent to that of FIG. 13D.

Next, with reference to FIG. 13E, a part of the metal film 78 after film formation is removed by a photolithography method and an etching method. Thereby, the metal film 78 is patterned to form the gate pad 70 having a predetermined pattern and the source pad 75 having a predetermined pattern. The gate pad 70 and the source pad 75 may be formed through a different step by repeating a step of forming the metal film using a different material and a patterning step.

Next, liquid-type organic insulating the material (photosensitive resin material) that is to be a base of the protective insulating layer 66 is coated by a spin coating method on the upper surface of the semiconductor layer 10 in a state shown in FIG. 13E. Next, the photosensitive resin material after coating is cured by exposure and the photosensitive resin material after being cured is removed by development (for example, a wet etching method). Thereby, the protective insulating layer 66 having a predetermined pattern is formed.

Next, a drain electrode 40 which covers the second main surface 12 is formed. The drain electrode 40 is formed (film formation), for example, by a vapor deposition method or a sputtering method. Thereafter, the semiconductor layer 10 is cut by a dicing step using a dicing blade, a dicing step using a laser irradiation method, etc., and the semiconductor device 1 is cut out from the semiconductor layer 10. The semiconductor device 1 is manufactured through the steps including the above description.

Figure 14:
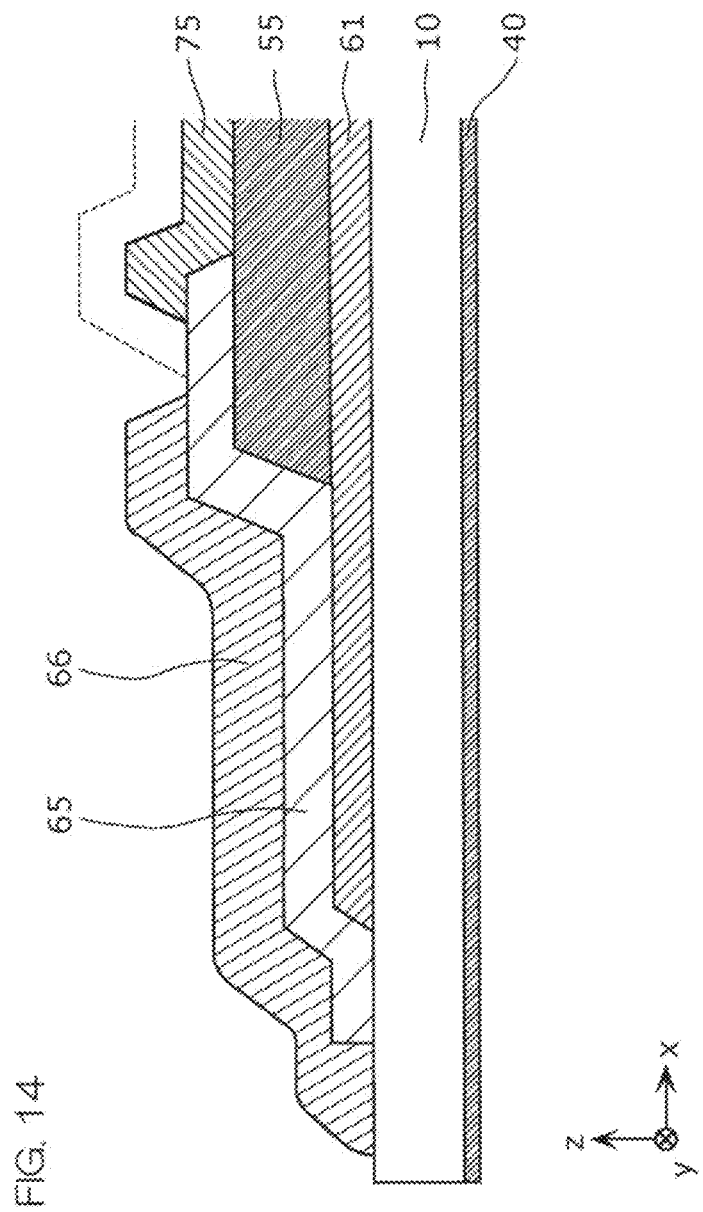
FIG. 14 is an enlarged cross-sectional view which shows a modified example of the outer peripheral portion of the semiconductor device shown in FIG. 2.

FIG. 14 is a cross-sectional view which shows a modified example of the structure of the outer peripheral portion (peripheral edge portion) of the semiconductor device 1 (semiconductor layer 10). FIG. 12 shows a configuration example in which the protective insulating layer 66 rides on the source pad 75. However, the protective insulating layer 66 may be separated from the source pad 75 such that the end insulating layer 65 can be exposed from a region between the protective insulating layer 66 and the source pad 75. In this case, the end insulating layer 65 may be an inorganic insulating film. Further, the source pad 75 may be an aluminum-based metal. In this case, a bonding wire may be bonded to the source pad 75.

Where the metal plate is bonded to the source pad 75 by soldering, a nickel/gold plating layer or a nickel/palladium/gold plating layer may be laminated on the source pad 75. The broken line portion of FIG. 14 indicates a plating layer where the plating layer is laminated on the source pad 75.

According to the arrangement of FIG. 14, the plating layer can be formed stably, as compared with the arrangement of FIG. 12.

Thus, the semiconductor device 1 includes the vertical transistor 2. The semiconductor device 1 includes the semiconductor layer 10, the main surface gate electrode 50, the main surface source electrode 55, the gate pad 70, and the drain electrode 40. The semiconductor layer 10 includes SiC as a main component and has the first main surface 11 and the second main surface 12 at the opposite side to the first main surface 11. The main surface gate electrode 50 covers a part of the first main surface 11.

The main surface source electrode 55 covers a part of the first main surface 11 at an interval from the main surface gate electrode 50. The gate pad 70 is provided at the opposite side to the semiconductor layer 10 with respect to the main surface gate electrode 50 such as to at least partially overlap the main surface gate electrode 50 in plan view and electrically connected to the main surface gate electrode 50. The gate pad 70 also overlaps a part of the main surface source electrode 55 in plan view.

Further, from another point of view, the semiconductor device 1 includes the semiconductor layer 10, the vertical transistor 2 (switching device), the main surface gate electrode 50 (first electrode), the main surface source electrode 55 (second electrode), the gate pad 70 (first terminal electrode), the source pad 75 (second terminal electrode), and the drain electrode 40. The semiconductor layer 10 has the first main surface 11 (main surface). The vertical transistor 2 is formed in the semiconductor layer 10. The main surface gate electrode 50 is arranged on the first main surface 11 and electrically connected to the vertical transistor 2.

The main surface source electrode 55 is arranged on the first main surface 11 at an interval from the main surface gate electrode 50 and electrically connected to the vertical transistor 2. The gate pad 70 has a portion that overlaps the main surface gate electrode 50 in plan view and a portion that overlaps the main surface source electrode 55 and is electrically connected to the main surface gate electrode 50. The source pad 75 has a portion that overlaps the main surface source electrode 55 in plan view and is electrically connected to the main surface source electrode 55. The drain electrode 40 is electrically connected to the second main surface 12.

On the assumption that in place of the gate pad 70 according to the preferred embodiment, the main surface gate electrode 50 is used as an electrode pad for wire bonding (that is, in the case of a conventional arrangement), the main surface gate electrode 50 equal in size to the gate pad 70 is needed. A region of the semiconductor layer 10 which is covered with the main surface gate electrode 50 becomes the non-active region 4. Therefore, an area that can be used as the active region 3 is reduced. As a result, the semiconductor layer 10 is prevented from being effectively used, thus having an adverse effect on a reduction in size and cost of the semiconductor device.

In contrast thereto, according to the semiconductor device 1, the gate pad 70 which overlaps the main surface gate electrode 50 and the main surface source electrode 55 in plan view is formed. According to this structure, design rules of the main surface gate electrode 50 are relaxed by the gate pad 70, and the main surface gate electrode 50 can be reduced in area. Thereby, the active region 3 can be expanded. Further, according to this structure, while a restriction on design rules derived from the main surface gate electrode 50 is avoided, the gate pad 70 to which wire bonding is given can be formed in a size larger than a fixed size.

That is, in the semiconductor device 1, design rules derived from the main surface gate electrode 50, etc., are relaxed to enhance the degree of freedom in design. According to this arrangement, the necessity for increasing the chip size for the purpose of expanding the active region 3 is eliminated. That is, while an increase in chip size is avoided, the active region 3 can be expanded. Thereby, the semiconductor layer 10 is used effectively to provide the semiconductor device 1 capable of reducing the size and cost.

The vertical transistor 2 may include a source, a gate, and a drain. Specifically, the vertical transistor 2 may include the source region 17 formed on the front surface of the semiconductor layer 10 on the first main surface 11 side, the gate insulating layer 23 (gate insulating film) which covers the source region 17, the gate electrode 20 which faces the source region 17 across the gate insulating layer 23, and the drain region formed inside the semiconductor layer 10. In the above-described structure, the main surface gate electrode 50 is electrically connected to the gate electrode 20, the main surface source electrode 55 is electrically connected to the source region 17, and the drain electrode 40 is electrically connected to the drain region.

The semiconductor device 1 may include the upper insulating layer 63 which is positioned between the gate pad 70 and the main surface source electrode 55 in a direction vertical to the first main surface 11. According to this structure, the upper insulating layer 63 is able to realize an arrangement that the gate pad 70 overlaps a part of the main surface source electrode 55 in plan view. The side surface 63a of the upper insulating layer 63 may be a plane extending along a direction vertical to the first main surface 11. According to this structure, the upper insulating layer 63 can be formed by an etching method.

Where the source pad 75 is electrically connected to the main surface source electrode 55, the end portion 79 of the source pad 75 at the gate pad 70 side is preferably positioned on the upper insulating layer 63. According to this structure, the source pad 75 can be formed stably. Specifically, it is possible to easily adjust the shape of the source pad 75, etc.

The semiconductor device 1 may include the protective insulating layer 66 which covers the boundary portion 80 (gap) between the gate pad 70 and the source pad 75. According to this structure, intrusion of water, etc., into the boundary portion 80 can be suppressed. Thereby, the reliability of the semiconductor device 1 is enhanced. In this case, a portion of the protective insulating layer 66 which is positioned at the boundary portion 80 may face the main surface source electrode 55 across the upper insulating layer 63.

A method for manufacturing the semiconductor device 1 includes a first step, a second step, and a third step. In the first step, the semiconductor layer 10 is prepared which includes SiC as a main component and has the first main surface 11 and the second main surface 12 at the opposite side of the first main surface 11. The semiconductor layer 10 includes the vertical transistor 2. In the second step, the main surface gate electrode 50 and the main surface source electrode 55 are formed on the first main surface 11 at an interval.

In the third step, the gate pad 70 is formed in a region at the opposite side to the semiconductor layer 10 with respect to the main surface gate electrode 50 such as to be electrically connected to the main surface gate electrode 50. The gate pad 70 is formed such as to overlap at least a part of the main surface gate electrode 50 and also a part of the main surface source electrode 55 in plan view. According to the manufacturing method, it is possible to manufacture and provide the semiconductor device 1 capable of avoiding an increase in chip size and also expanding the active region 3.

In the first preferred embodiment, there is shown an example in which the wide portion 72 spreads in an umbrella shape toward both the negative side and the positive side in the x-axis direction (refer to FIG. 3, etc.). However, the wide portion 72 may have an arrangement that spreads in an umbrella shape only toward the positive side in the x-axis direction (refer to FIG. 10). In this arrangement as well, the gate pad 70 (wide portion 72) is provided such as to overlap the active region 3 (main surface source electrode 55) in plan view.

In the first preferred embodiment, there is shown an example in which the main surface gate electrode 50 extends from the electricity receiving portion 50a in the y-axis direction (refer to FIG. 3, etc.). However, the main surface gate electrode 50 may have an arrangement that extends from the electricity receiving portion 50a not only in the y-axis direction but also in the x-axis direction (refer to FIG. 11). In this arrangement as well, the gate pad 70 (wide portion 72) is provided such as to overlap the active region 3 (main surface source electrode 55) in plan view.

Figure 15:
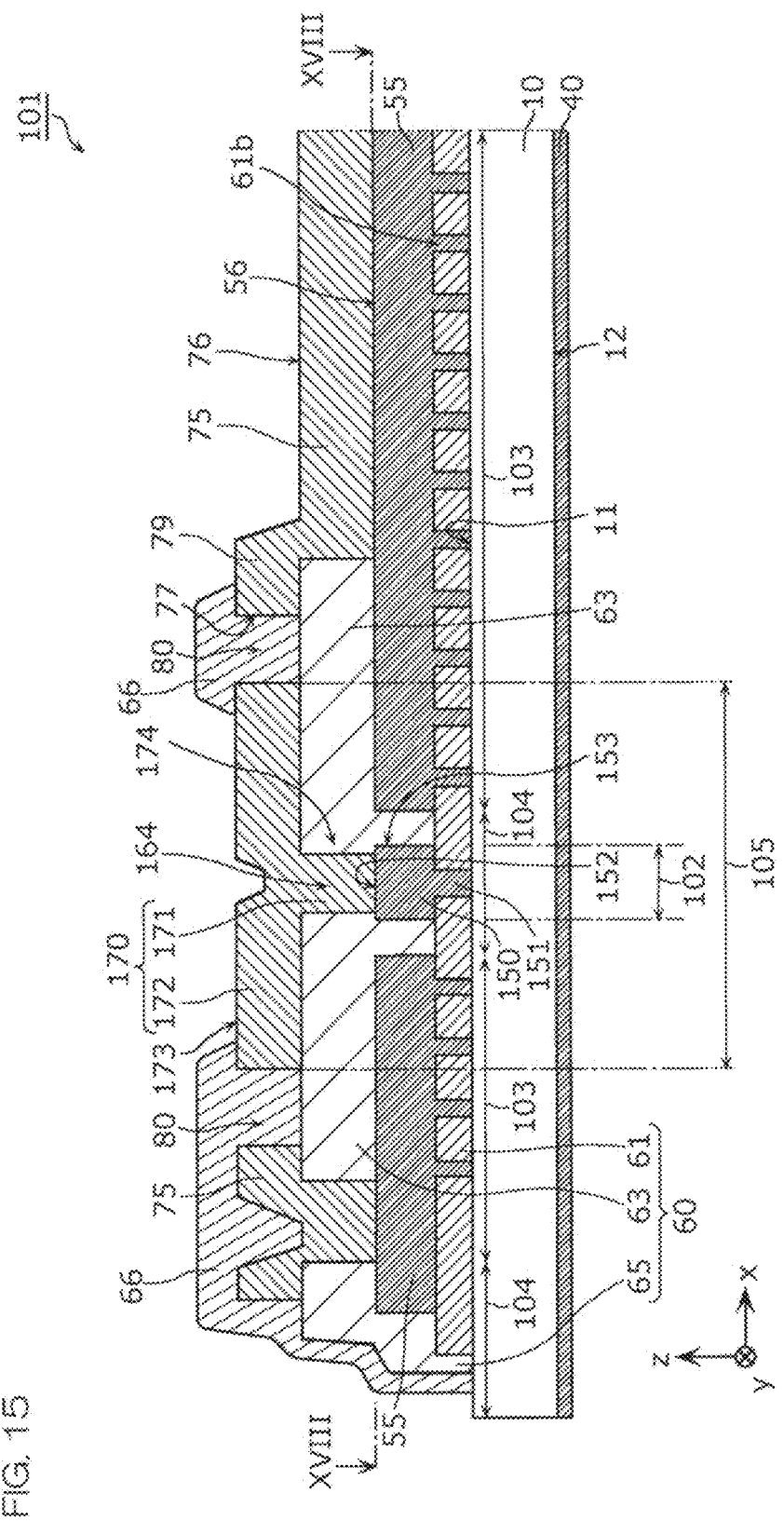
FIG. 15 is a cross-sectional view of a semiconductor device according to a second preferred embodiment.
Figure 16:
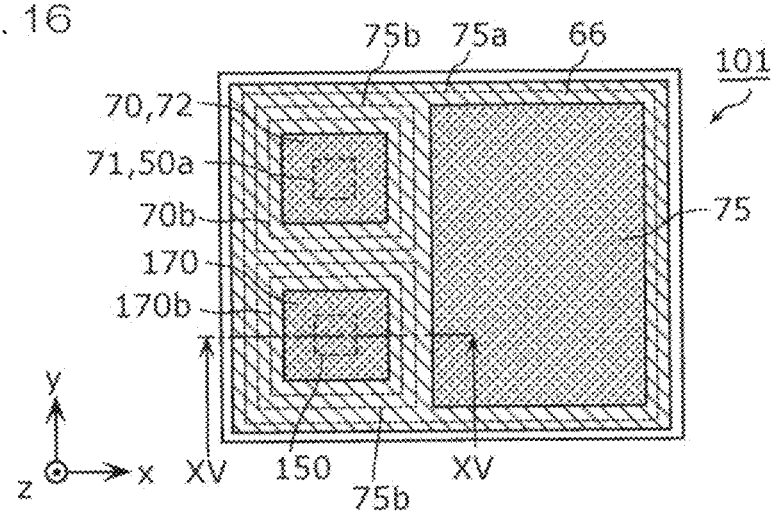
FIG. 16 is a plan view of the semiconductor device shown in FIG. 15.

FIG. 15 is a cross-sectional view of a semiconductor device 101 according to the second preferred embodiment. FIG. 15 shows a cross-section along line XV-XV in FIG. 16. FIG. 16 is a plan view of the semiconductor device 101 according to the second preferred embodiment. In FIG. 16, an outer edge 70b of a gate pad 70, an outer edge 75a of a source pad 75, an inner edge 75b of the source pad 75, and an outer edge 170b of a current detecting pad 170 are indicated by broken lines.

Figure 17:
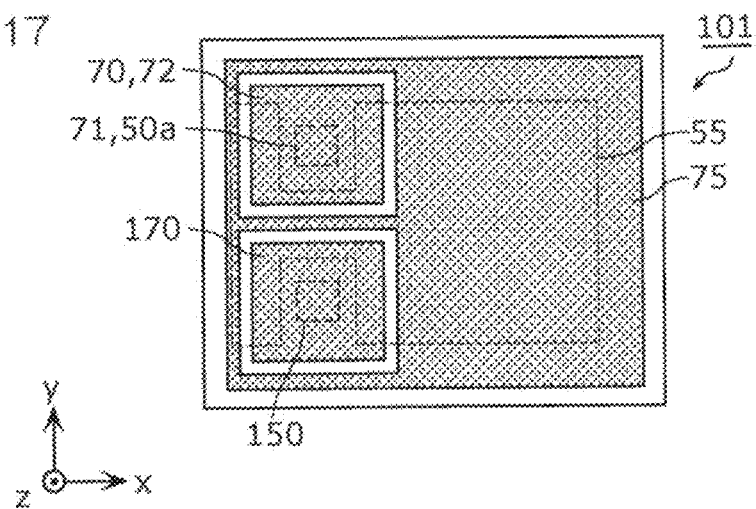
FIG. 17 is a plan view in which a protective insulating layer is removed from the plan view of FIG. 16.
Figure 18:
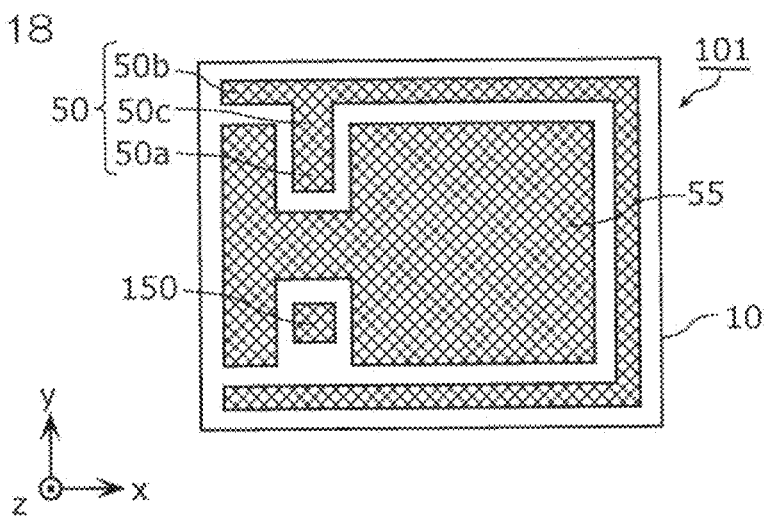
FIG. 18 is a plan view as viewed from a position along line XVIII-XVIII shown in FIG. 15.

FIG. 17 is a plan view in which a protective insulating layer 66 is removed from the plan view shown in FIG. 16. In FIG. 17, a main surface source electrode 55 is indicated by broken lines. FIG. 18 is a plan view of an upper surface of an electrode of the semiconductor device 101 on a plane parallel to a front surface of a substrate as viewed from a position of line XVIII-XVIII in FIG. 15. FIG. 18 is a plan view when the semiconductor device 101 is viewed from the positive side of a z-axis through the gate pad 70, the source pad 75, and the current detecting pad 170 shown in FIG. 16.

Although not shown in FIG. 15 to FIG. 18, as with the first preferred embodiment, the semiconductor device 101 includes a vertical transistor 2 which allows a current to flow in a thickness direction of a semiconductor layer 10. The semiconductor device 101 (second preferred embodiment) is mainly different from the semiconductor device 1 (first preferred embodiment) in that it further includes a current detecting electrode and an electrode pad connected to the current detecting electrode. In the semiconductor device 101, the current detecting electrode is formed smaller than the electrode pad. A difference from the first preferred embodiment will be mainly described below, and common descriptions will be omitted or simplified.

With reference to FIG. 15 to FIG. 18, the semiconductor device 101 includes a main surface gate electrode 50 (first electrode), a main surface source electrode 55 (second electrode), and a current detecting electrode 150 as an example of a third electrode. The main surface gate electrode 50 and the main surface source electrode 55 are different from each other in disposition and shape, as compared with the first preferred embodiment but they are substantially the same. Description of the main surface gate electrode 50 and the main surface source electrode 55 will be omitted.

The current detecting electrode 150 is arranged at an interval from the main surface gate electrode 50 and the main surface source electrode 55 in plan view. The current detecting electrode 150 may be arranged at an outer peripheral portion (peripheral edge portion) of the semiconductor layer 10 (first main surface 11) in plan view. The current detecting electrode 150 may be arranged in a region including a center position of the semiconductor layer 10 (first main surface 11) in plan view. The current detecting electrode 150 may be arranged in a region which is surrounded by the main surface source electrode 55 in plan view. That is, the main surface source electrode 55 may be arranged such as to surround a periphery of the current detecting electrode 150 in plan view.

The current detecting electrode 150 corresponds to a portion in which a part of the main surface source electrode 55 according to the first preferred embodiment is separated. Although not shown, an FET structure is formed below the current detecting electrode 150. The FET structure at the current detecting electrode 150 side is formed in a manner similar to as the FET structure formed below the main surface source electrode 55 (refer also to FIG. 1 and FIG. 2).

That is, in this embodiment, the FET structure includes a main cell region arranged below the main surface source electrode 55 and a current detecting cell region (sense cell region) arranged below the current detecting electrode 150. The main cell region conducts a drain current. The current detecting cell region is formed to detect the drain current. In other words, the semiconductor device 101 includes the main cell region provided at the first main surface 11 and the current detecting cell region provided at a region different from the main cell region on the first main surface 11.

The FET structure is formed each in the main cell region and in the current detecting cell region. The FET structure at the main cell region side is formed as a main FET structure (main device/main element) for generating a drain current as a main current. The FET structure at the current detecting cell region side is formed as a sense FET structure (sensing device/sensing element) for generating a sense current that detects the drain current. In this embodiment, the FET structure at the main cell region side and the FET structure at the current detecting cell region side have the same structure.

The main surface source electrode 55 is arranged in a region that overlaps the main cell region (main FET structure) in plan view and electrically connected to a source region 17 of the main cell region (main FET structure). The current detecting electrode 150 is arranged in a region that overlaps the current detecting cell region (sense FET structure) in plan view and electrically connected to a source region 17 of the current detecting cell region (sense FET structure).

In the vertical transistor 2 according to the semiconductor device 101, a drain current flows from a drain electrode 40 to the source region 17 at the main cell region side, and a sense current flows from the drain electrode 40 to the source region 17 at the sense cell region side. Thereby, the drain current is taken out from the main surface source electrode 55, and the sense current is taken out from the current detecting electrode 150.

The sense FET structure may be arranged such as to generate the sense current in conjunction with the drain current by on/off control in synchronization with the main FET structure. That is, the same gate voltage may be applied at the same time to the main cell region and the current detecting cell region. The main cell region is larger in area than the current detecting cell region. In this embodiment, the main cell region is different from the current detecting cell region only in area. Therefore, a current proportional to an area ratio of the main cell region in relation to the current detecting cell region flows in the current detecting cell region.

That is, the sense current of the sense FET structure may be less than the main current of the main FET structure. The main cell region may be not less than 100 times and not more than 10000 times larger in area than the current detecting cell region. In this case, a current which is not less than $\frac{1}{10000}$ and not more than $\frac{1}{100}$ of a current (drain current) which flows in the main surface source electrode 55 flows in the current detecting electrode 150.

Thereby, even if a relatively large drain current occurs due to certain factors, it is possible to reduce a current flowing through the current detecting electrode 150. For example, a maximum current which flows through the current detecting electrode 150 can be suppressed to about 1 A. Thus, the current detecting electrode 150 can be used to appropriately detect an increase in current within a predetermined current detecting range.

The current detecting electrode 150 may include a non-metal conductor or a metal. The current detecting electrode 150 is preferably formed of an aluminum-based metal material. The current detecting electrode 150 may include aluminum, an aluminum silicon (Al—Si)-based alloy, an aluminum copper (Al—Cu)-based alloy, etc., as an example of the aluminum-based metal material. As a matter of course, the current detecting electrode 150 may be formed of conductive polysilicon, tungsten, titanium, nickel, copper, silver, gold, titanium nitride (metal nitride), etc. The current detecting electrode 150 may be formed of the same material as the main surface gate electrode 50 and the main surface source electrode 55.

With reference to FIG. 15, the current detecting electrode 150 is provided on a lower insulating layer 61 having one or more source contact holes 61b. The current detecting electrode 150 is electrically connected via the source contact holes 61b to the source region 17 of the current detecting cell region.

The current detecting electrode 150 is smaller than the current detecting pad 170 described later in plan view. A planar shape of the current detecting electrode 150 may be square or rectangular. A length of one side of the current detecting electrode 150 may be not less than 5 μm and not more than 50 μm. As an example, the planar shape of the current detecting electrode 150 may be a square with about 20 μm×20 μm. With reference to FIG. 18, in this embodiment, the current detecting electrode 150 has the same size as an electricity receiving portion 50a of the main surface gate electrode 50.

As a matter of course, the current detecting electrode 150 may be smaller in size than the electricity receiving portion 50a. The current detecting electrode 150 may be larger in size than the electricity receiving portion 50a. The current detecting electrode 150 may have an area which is not more than 20% of an area of the semiconductor layer 10 (first main surface 11) in plan view. The current detecting electrode 150 preferably has an area which is not more than 10% of an area of the semiconductor layer 10 (first main surface 11).

With reference to FIG. 15 to FIG. 17, the semiconductor device 101 includes the gate pad 70 (first electrode pad), the source pad 75 (second electrode pad), and the current detecting pad 170 as an example of the third electrode pad. The gate pad 70 and the source pad 75 are different from each other in disposition and shape as compared with those of the first preferred embodiment but they are substantially the same. Description of the gate pad 70 and the source pad 75 will be omitted.

The current detecting pad 170 overlaps the current detecting electrode 150 in plan view and is electrically connected to the current detecting electrode 150. The current detecting pad 170 is arranged at an interval from the gate pad 70 and the source pad 75. The current detecting pad 170 may be arranged in a region which includes a center position of the semiconductor layer 10 (first main surface 11) in plan view. The current detecting pad 170 may be arranged in a region which is surrounded by the source pad 75. That is, the source pad 75 may be arranged such as to surround a periphery of the current detecting pad 170.

In this embodiment, the current detecting pad 170 is similar in arrangement to the gate pad 70. With reference to FIG. 15, specifically, the current detecting pad 170 includes a columnar portion 171 as an example of the lower conductive layer and a wide portion 172 as an example of the upper conductive layer. The columnar portion 171 is provided on the current detecting electrode 150. The columnar portion 171 is connected to an upper surface 152 of the current detecting electrode 150 and formed in a columnar shape extending in a normal line direction (z-axis direction) of the upper surface 152. The columnar portion 171 is connected to the current detecting electrode 150 via a through hole 164 provided in an upper insulating layer 63.

A height of the columnar portion 171 (length in the z-axis direction) is larger than a thickness of the upper insulating layer 63 (length in the z-axis direction). Specifically, the height of the columnar portion 171 is equal to a thickness of a portion of the upper insulating layer 63 which is positioned on the current detecting electrode 150. A side surface 174 of the columnar portion 171 may be flush with a side surface 153 of the current detecting electrode 150. The side surface 174 of the columnar portion 171 may be positioned inside the current detecting electrode 150 with respect to the side surface 153 of the current detecting electrode 150.

The wide portion 172 is provided at an upper end of the columnar portion 171. The wide portion 172 is a portion in which the upper end of the columnar portion 171 is expanded in size. That is, the wide portion 172 is formed in an area larger than the columnar portion 171 in plan view. The wide portion 172 is formed such that the columnar portion 171 will be positioned inside the wide portion 172 in plan view. A size and a shape of the wide portion 172 match those of the current detecting pad 170 in plan view. A portion of an upper surface 173 of the wide portion 172 which overlaps the columnar portion 171 in plan view is recessed toward the current detecting electrode 150.

The upper surface 173 of the wide portion 172 is used in electrically connecting the semiconductor device 101 and other circuits together. For example, the upper surface 173 of the wide portion 172 is connected to a control circuit that controls the semiconductor device 101 on the basis of a detected current. A metal wire may be connected by wire bonding to the upper surface 173 of the wide portion 172. The metal wire may include at least one type of aluminum, copper, and gold. In this embodiment, an aluminum wire is wedge-bonded to the current detecting pad 170 (upper surface 173 of the wide portion 172). A metal plate may be connected to the upper surface 173 of the wide portion 172 by soldering in place of wire bonding.

The current detecting pad 170 has an area which is not more than 20% of an area of the semiconductor layer 10 (first main surface 11) in plan view. The current detecting pad 170 preferably has an area which is not more than 10% of an area of the semiconductor layer 10 (first main surface 11) in plan view. The wide portion 172 (that is, current detecting pad 170) is larger in area than the current detecting electrode 150 in plan view. The area of the wide portion 172 may be not less than 200 times and not more than 40000 times larger than the area of the current detecting electrode 150. The area of the wide portion 172 may be not less than 400 times larger than the area of the current detecting electrode 150. As an example, the area of the wide portion 172 may be about 2500 times larger than the area of the current detecting electrode 150.

In order to appropriately perform wire bonding, the wide portion 172 (current detecting pad 170) needs to have a size larger than a fixed size. The wide portion 172 preferably has an area which is not less than 800 μm×800 μm and not more than 1 mm×1 mm in plan view. In this case, the wide portion 172 may be formed in a square shape in plan view. In this case, connection of the metal wire can be set in any given direction.

As a matter of course, the wide portion 172 may be formed in a square shape larger than 1 mm×1 mm in plan view. Further, the wide portion 172 may be formed in a rectangular shape of not less than 400 μm×800 μm in plan view. In this embodiment, the wide portion 172 is equal in size to the wide portion 72 of the gate pad 70. As a matter of course, the size of the wide portion 172 may be less than the size of the wide portion 72 or may exceed the size of the wide portion 72.

The columnar portion 171 and the wide portion 172 may be formed of the same conductive material. The columnar portion 171 and the wide portion 172 may be formed of an aluminum-based metal material. As a matter of course, the columnar portion 171 and the wide portion 172 may be formed of titanium, nickel, copper, silver, gold, tungsten, etc. The columnar portion 171 and the wide portion 172 may be formed of conductive materials which are different from each other. The current detecting pad 170 may be formed of the same material as the gate pad 70 and the source pad 75. Thereby, the current detecting pad 170, the gate pad 70, and the source pad 75 can be formed by the same step.

A height of the current detecting pad 170 (length in z-axis direction) is a sum of the height of the columnar portion 171 (length in the z-axis direction) and a thickness of the wide portion 172 (length in the z-axis direction). The height of the current detecting pad 170 may be, for example, not less than several dozen micrometers and not more than several hundred micrometers (that is, not less than 20 μm and less than 1000 μm). In FIG. 15, there is shown an example in which the height of the columnar portion 171 is equal to the thickness of the wide portion 172. However, the height of the columnar portion 171 may be larger than the thickness of the wide portion 172 or may be smaller than the thickness of the wide portion 172.

With reference to FIG. 15, the semiconductor device 101 includes an active region 103 and a non-active region 104. The active region 103 is a main region in which a drain current of the vertical transistor 2 flows. Specifically, the active region 103 is a region which overlaps the main surface source electrode 55 in plan view and does not include a region which overlaps the main surface gate electrode 50 (not shown in FIG. 15) and the current detecting electrode 150. That is, the active region 103 includes a main cell region in which a main FET structure is formed but does not include a region other than the main cell region.

The non-active region 104 is a region other than the active region 103 and a region in which no drain current of the vertical transistor 2 flows. Specifically, the non-active region 104 is a region which overlaps the main surface gate electrode 50 and the current detecting electrode 150 in plan view and does not include a region which overlaps the main surface source electrode 55. That is, the non-active region 104 includes the current detecting cell region in which the sense FET structure is formed but does not include the main cell region. With reference to FIG. 15, the non-active region 104 includes a current detecting region 102. The current detecting region 102 includes a region which overlaps the current detecting electrode 150 in plan view (that is, the current detecting cell region).

In the semiconductor device 101, while the current detecting electrode 150 is formed, the current detecting pad 170 (wide portion 172) which multi-level intersects the active region 103 is provided. According to this structure, a wire bonding target is changed from the current detecting electrode 150 to the current detecting pad 170. Thereby, the current detecting electrode 150 can be reduced in size to increase the size of the active region 103. That is, in the semiconductor device 101, design rules derived from the current detecting electrode 150 are relaxed by the current detecting pad 170 to enhance the degree of freedom in design.

Specifically, the current detecting pad 170 has a width larger than a width of the current detecting electrode 150 both in an x-axis direction and a y-axis direction and overlaps a part of the main surface source electrode 55 in plan view. Thereby, while design rules derived from the current detecting electrode 150 are avoided, the current detecting pad 170 can be formed in a size larger than a fixed size. Further, the main surface gate electrode 50 can be reduced in area and the area of the active region 103 can be increased. Therefore, the limited region of the semiconductor layer 10 can be effectively used to provide the semiconductor device 101 capable of easily reducing the size and cost.

A configuration similar to the modified example which has been adopted in the gate pad 70 may be applied to the current detecting pad 170. For example, the arrangement shown in FIG. 8 and FIG. 9 (the position and the number of through holes, a positional relationship with bonding wire, etc.) may be applied to the current detecting pad 170.

In this embodiment, the arrangement in which the current detecting pad 170 overlaps the current detecting electrode 150 in plan view has been described. However, the current detecting pad 170 may not overlap the current detecting electrode 150 in plan view. In this case, there may be provided a connection wiring portion (not shown) which extends from the current detecting pad to a position above the current detecting electrode such as to be conducted to the current detecting electrode 150 via the through hole. In this case, the main surface source electrode 55 may be arranged in a region below the current detecting pad and the connection wiring portion.

Thus, the semiconductor device 101 includes the vertical transistor 2. The semiconductor device 101 includes the active region 103, the non-active region 104, the main surface gate electrode 50 (first electrode), the main surface source electrode 55 (second electrode), the current detecting electrode 150 (third electrode), the gate pad 70 (first electrode pad), the source pad 75 (second electrode pad), and the current detecting pad 170 (third electrode pad).

The active region 103 is provided in the semiconductor layer 10. The active region 103 includes the main cell region which conducts a drain current. The non-active region 104 is provided in a region different from the active region 103 in the semiconductor layer 10. The non-active region 104 includes the current detecting cell region (sense cell region) which conducts a sense current that detects the drain current. The main surface gate electrode 50 is arranged such as to overlap a region other than the main cell region in plan view. The main surface source electrode 55 is arranged such as to overlap the main cell region at an interval from the main surface gate electrode 50 in plan view.

The gate pad 70 is provided at the opposite side to the semiconductor layer 10 with respect to the main surface gate electrode 50 such as to at least partially overlap the main surface gate electrode 50 in plan view and electrically connected to the main surface gate electrode 50. The gate pad 70 also overlaps a part of the main surface source electrode 55 in plan view. The source pad 75 is arranged at an interval from the gate pad 70. The source pad 75 is provided at the opposite side to the semiconductor layer 10 with respect to the main surface source electrode 55 such as to at least partially overlap the main surface source electrode 55 in plan view and electrically connected to the main surface source electrode 55.

The current detecting pad 170 is arranged at an interval from the gate pad 70 and the source pad 75 in plan view. The current detecting pad 170 is provided at the opposite side to the semiconductor layer 10 with respect to the current detecting electrode 150 such as to at least partially overlap the current detecting electrode 150 in plan view and electrically connected to the current detecting electrode 150. In this embodiment, the current detecting pad 170 also overlaps a part of the main surface source electrode 55 in plan view.

On the assumption that in place of the current detecting pad 170 according to the aforementioned preferred embodiment, the current detecting electrode 150 is used as an electrode pad for wire bonding, the current detecting electrode 150 equal in size to the current detecting pad 170 is needed. Since a region of the semiconductor layer 10 which is covered by the current detecting electrode 150 becomes the non-active region 104, an area that can be used as the active region 103 is reduced. Therefore, the semiconductor layer 10 is prevented from being effectively used, thus having an adverse effect on a reduction in size and cost of the semiconductor device.

In contrast thereto, according to the semiconductor device 101, the current detecting pad 170 which overlaps the current detecting electrode 150 and the main surface source electrode 55 in plan view is formed. According to this structure, design rules of the current detecting electrode 150 are relaxed by the current detecting pad 170 and the current detecting electrode 150 can be reduced in area. Thereby, the active region 103 can be expanded. Further, according to this structure, while a restriction on design rules derived from the current detecting electrode 150 is avoided, the current detecting pad 170 to which wire bonding is given can be formed in a size larger than a fixed size.

That is, in the semiconductor device 101, the design rules derived from the current detecting electrode 150, etc., are relaxed to enhance the degree of freedom in design. According to this arrangement, the necessity for increasing the chip size for expanding the active region 103 is eliminated. That is, while an increase in chip size is avoided, the active region 103 can be expanded. Thus, the semiconductor layer 10 can be effectively used to provide the semiconductor device 101 capable of reducing the size and cost.

The semiconductor device 101 is manufactured by the same manufacturing method as the method for manufacturing the semiconductor device 1. Specifically, the semiconductor device 101 is manufactured by changing the patterning step of the main surface gate electrode 50, the main surface source electrode 55, and the current detecting electrode 150, the patterning step of the insulating layer 60, and the patterning step of the gate pad 70, the source pad 75, and the current detecting pad 170 in the method for manufacturing the semiconductor device 1 respectively to the corresponding steps in the semiconductor device 101.

FIG. 19 is a plan view of a semiconductor device 101a according to a modified example of the second preferred embodiment (a protective insulating layer 66 is not shown). FIG. 20 is a plan view of an upper surface of an electrode of the semiconductor device 101a according to the modified example of the second preferred embodiment. FIG. 19 and FIG. 20 correspond respectively to FIG. 17 and FIG. 18. In the second preferred embodiment, an example in which the gate pad 70 has the wide portion 72, and the current detecting pad 170 has the wide portion 172 has been described. However, as shown in FIG. 19 and FIG. 20, there may be adopted such a configuration in which the gate pad 70 does not have the wide portion 72, and the current detecting pad 170 has the wide portion 172.

Specifically, in the semiconductor device 101a, a gate pad 70a has the same size and shape as a main surface gate electrode 50A in plan view. That is, the main surface gate electrode 50A according to the semiconductor device 101a is larger in size than the electricity receiving portion 50a of the main surface gate electrode 50 according to the semiconductor device 101 in plan view. A current detecting electrode 150 and a current detecting pad 170 are similar in arrangement to those of the semiconductor device 101. That is, the semiconductor device 101a includes the current detecting electrode 150 as an example of the first electrode and includes the current detecting pad 170 as an example of the first electrode pad.

Thus, an arrangement (specifically, the current detecting pad 170) in which only the current detecting electrode 150 is increased in area in plan view is applied to the semiconductor device 101a. That is, the current detecting electrode 150 according to the semiconductor device 101a overlaps a part of a main surface source electrode 55 in plan view and is electrically connected to one of a plurality of source electrodes 30. In this case, the current detecting electrode is regarded as an example of a first electrode and the current detecting pad 170 is regarded as an example of a first electrode pad.

Thus, according to the semiconductor device 101a, the current detecting pad 170 which overlaps the current detecting electrode 150 and the main surface source electrode 55 in plan view is formed. According to this structure, design rules of the current detecting electrode 150 are relaxed by the current detecting pad 170, and the current detecting electrode 150 can be reduced in area. Thereby, the active region 103 can be expanded. Further, according to this structure, while a restriction on design rules derived from the current detecting electrode 150 is avoided, the current detecting pad 170 to which wire bonding is given can be formed in a size larger than a fixed size.

That is, in the semiconductor device 101a, design rules derived from the current detecting electrode 150, etc., are relaxed to enhance the degree of freedom in design. According to this arrangement, the necessity for increasing the chip size for expanding the active region 103 is eliminated. That is, while an increase in chip size is avoided, the active region 103 can be expanded. Thereby, the semiconductor layer 10 can be effectively used to provide the semiconductor device 101a capable of reducing the size and cost.

Figure 21:
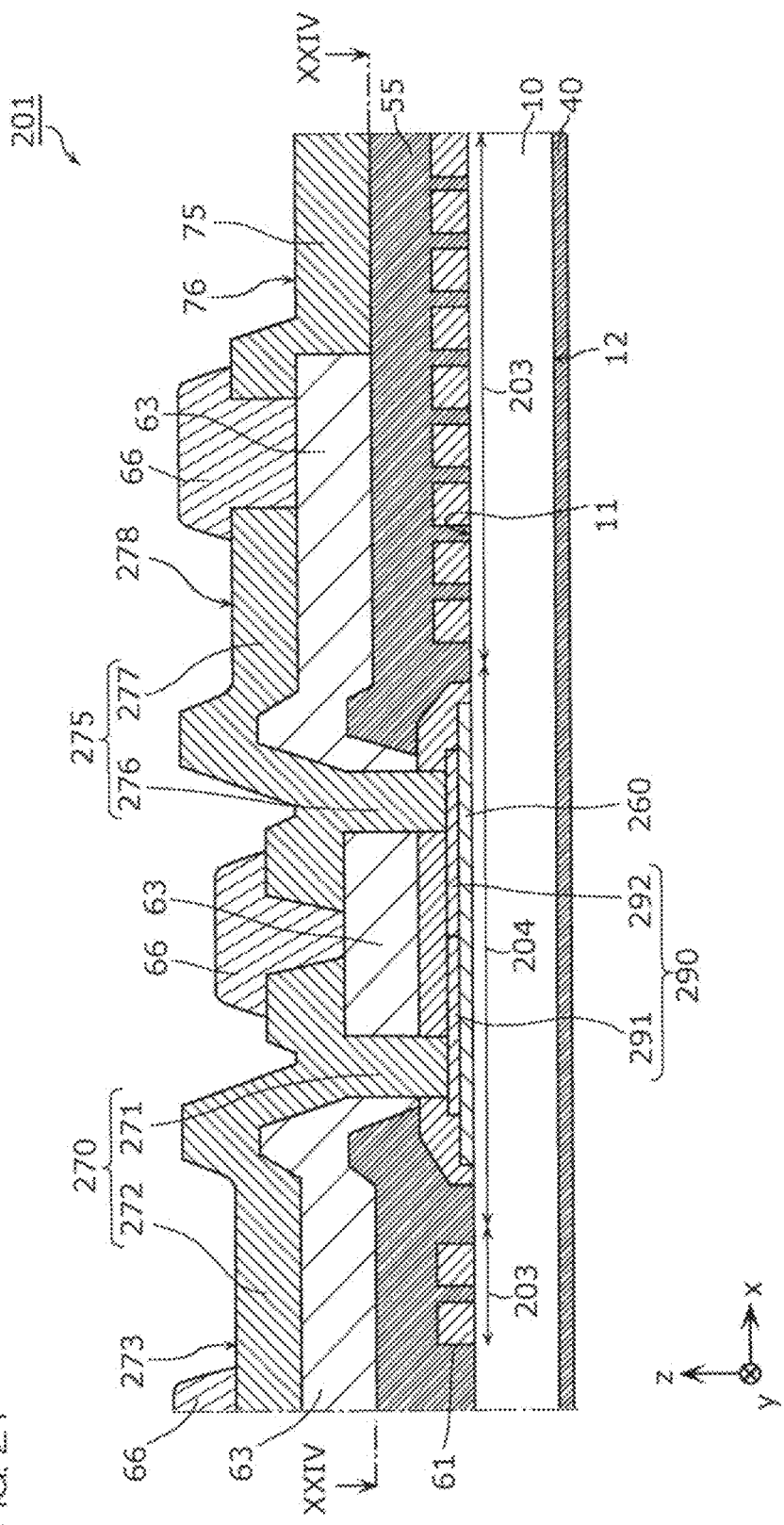
FIG. 21 is a cross-sectional view of a semiconductor device according to a third preferred embodiment.
Figure 22:
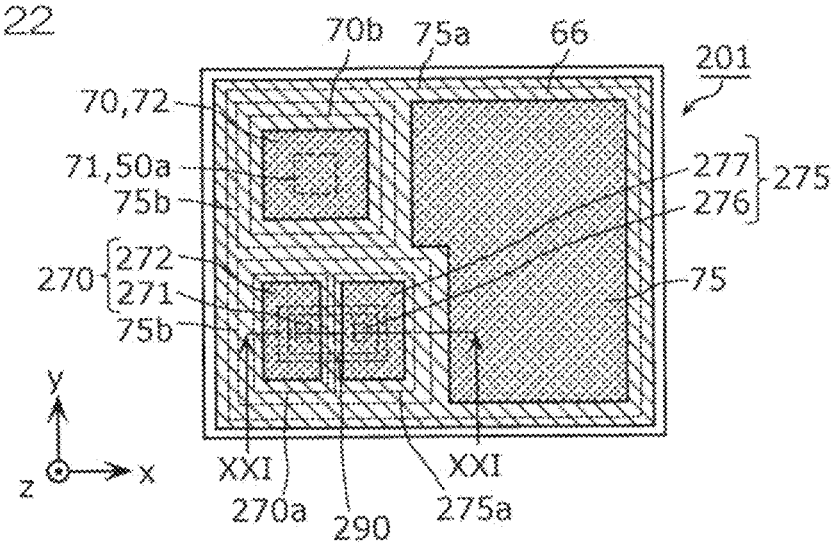
FIG. 22 is a plan view of the semiconductor device shown in FIG. 21.
Figure 23:
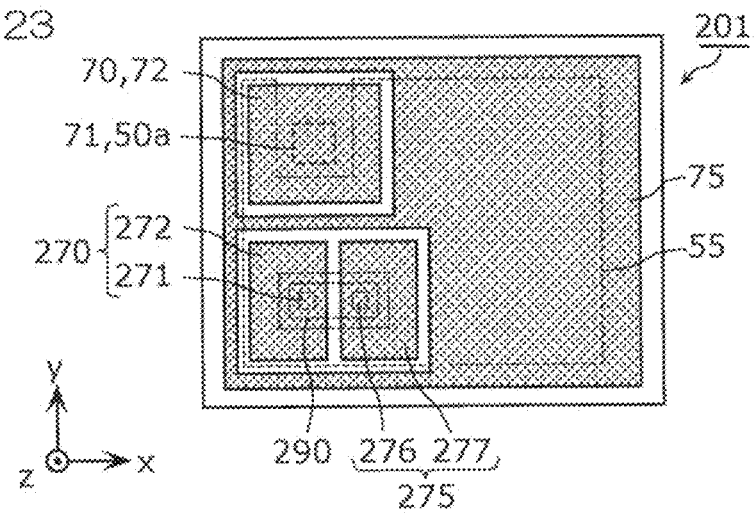
FIG. 23 is a plan view in which a protective insulating layer is removed from the plan view of FIG. 22.

FIG. 21 is a cross-sectional view of a semiconductor device 201 according to the third preferred embodiment. FIG. 21 shows a cross-section along line XXI-XXI in FIG. 22. FIG. 22 is a plan view of the semiconductor device 201 according to the third preferred embodiment. In FIG. 22, an outer edge 70b of a gate pad 70, an outer edge 75a of a source pad 75, an inner edge 75b of the source pad 75, an outer edge 270a of an anode electrode pad 270, and an outer edge 275a of a cathode electrode pad 275 are indicated by broken lines. FIG. 23 is a plan view in which a protective insulating layer 66 is removed from the plan view of FIG. 22. In FIG. 23, a main surface source electrode 55 is indicated by broken lines.

Figure 24:
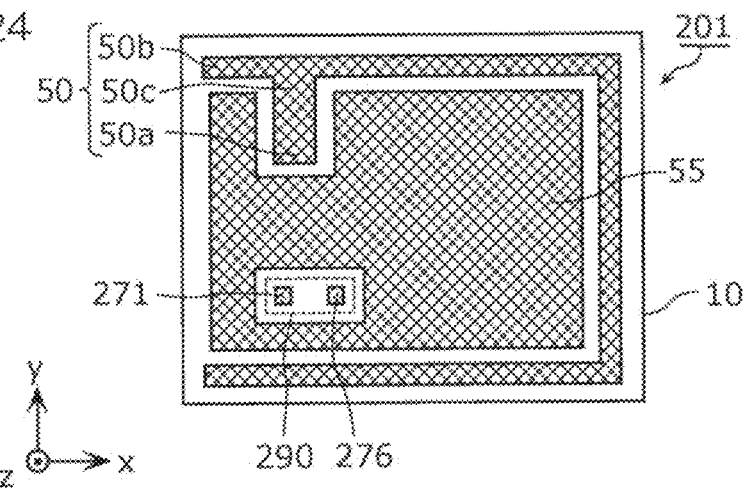
FIG. 24 is a plan view as viewed from a position along line XXIV-XXIV shown in FIG. 21.

FIG. 24 is a plan view of the semiconductor device 201 on a plane parallel to a front surface of a substrate as viewed from a position of line XXIV-XXIV in FIG. 21. Specifically, FIG. 24 is a plan view when the semiconductor device 201 is viewed from the positive side of a z-axis through the gate pad 70, the source pad 75, the anode electrode pad 270, and the cathode electrode pad 275 shown in FIG. 23.

With reference to FIG. 21 to FIG. 24, the semiconductor device 201 (third preferred embodiment) is mainly different from the semiconductor device 1 (first preferred embodiment) in that it includes a diode 290 (first conductive layer). Hereinafter, a difference from the first preferred embodiment will be mainly described, and common descriptions will be omitted or simplified. Specifically, the semiconductor device 201 includes an insulating layer 260 which covers a part of a first main surface 11 of a semiconductor layer 10, and the diode 290 which is provided on the insulating layer 260.

In this embodiment, the diode 290 is a pn diode which includes polysilicon, a p-type semiconductor layer 291 formed in the polysilicon, and an n-type semiconductor layer 292 formed in the polysilicon. For example, the p-type semiconductor layer 291 is polysilicon doped with a p-type impurity, and the n-type semiconductor layer 292 is polysilicon doped with an n-type impurity. The n-type semiconductor layer 292 is connected to the p-type semiconductor layer 291, thereby constituting a pn junction (pn diode) together with the p-type semiconductor layer 291.

The diode 290 is used as a temperature sensor (temperature-sensitive diode) that detects a temperature of the semiconductor device 201 (semiconductor layer 10) by a magnitude of the voltage between the p-type semiconductor layer 291 and the n-type semiconductor layer 292. That is, the diode 290 may have forward voltage characteristics showing a linear change in response to a change in temperature. The temperature of the semiconductor layer 10 is indirectly detected from the voltage characteristics of the diode 290.

The semiconductor device 201 includes the gate pad 70, the source pad 75, the anode electrode pad 270 (first polar terminal electrode), and the cathode electrode pad 275 (second polar terminal electrode). The anode electrode pad 270 and the cathode electrode pad 275 are each formed as an example of the diode electrode pad (polar terminal electrode). The gate pad 70 and the source pad 75 are different from each other in disposition and shape as compared with those of the first preferred embodiment but they are substantially the same. Description of the gate pad 70 and the source pad 75 will be omitted.

The anode electrode pad 270 is arranged in a region which overlaps the p-type semiconductor layer 291 in plan view at an interval from the gate pad 70 and the source pad 75 and electrically connected to the p-type semiconductor layer 291. In this embodiment, the anode electrode pad 270 has the same arrangement as the gate pad 70.

With reference to FIG. 21, specifically, the anode electrode pad 270 includes a columnar portion 271 as an example of the lower conductive layer and a wide portion 272 as an example of the upper conductive layer. The columnar portion 271 is provided on the p-type semiconductor layer 291. The columnar portion 271 is connected to an upper surface of the p-type semiconductor layer 291 and formed in a columnar shape extending in a normal line direction (z-axis direction) of the upper surface of the p-type semiconductor layer 291.

The wide portion 272 is provided at an upper end of the columnar portion 271. The wide portion 272 is a portion in which the upper end of the columnar portion 271 is expanded in size. That is, the wide portion 272 is formed in area larger than the columnar portion 271 in plan view. The wide portion 272 is formed such that the columnar portion 271 will be positioned inside the wide portion 272 in plan view. In plan view, a size and a shape of the wide portion 272 match those of the anode electrode pad 270.

An upper surface 273 of the wide portion 272 is used in electrically connecting the semiconductor device 201 and other circuits together. A metal wire may be connected to the upper surface 273 of the wide portion 272 by wire bonding. The metal wire may include at least one type of aluminum, copper, and gold. In this embodiment, an aluminum wire is wedge-bonded to the anode electrode pad 270 (upper surface 273 of the wide portion 272).

In order to perform wire bonding appropriately, the wide portion 272 (anode electrode pad 270) needs to have a size larger than a fixed size. A planar shape and a size of the wide portion 272 may be the same as those of the wide portion 72 of the gate pad 70. As a matter of course, one of or both of the planar shape and the size of the wide portion 272 may be different from those of the wide portion 72.

The columnar portion 271 and the wide portion 272 may be formed of the same conductive material. The columnar portion 271 and the wide portion 272 may be formed of an aluminum-based metal material. As a matter of course, the columnar portion 271 and the wide portion 272 may be formed of titanium, nickel, copper, silver, gold, tungsten, etc. The columnar portion 271 and the wide portion 272 may be formed of conductive materials different from each other.

A height of the anode electrode pad 270 (length in the z-axis direction) is a sum of a height of the columnar portion 271 (length in the z-axis direction) and a thickness of the wide portion 272 (length in the z-axis direction). The height of the anode electrode pad 270 may be, for example, not less than several dozen micrometers and not more than several hundred micrometers (that is, not less than 20 μm and less than 1000 μm). The height of the columnar portion 271 may exceed the thickness of the wide portion 272 or may be less than the thickness of the wide portion 272. As a matter of course, the height of the columnar portion 271 may be equal to the thickness of the wide portion 272.

The cathode electrode pad 275 is arranged in a region which overlaps the n-type semiconductor layer 292 at an interval from the gate pad 70, the source pad 75, and the anode electrode pad 270 and electrically connected to the n-type semiconductor layer 292. In this embodiment, the cathode electrode pad 275 is similar in arrangement to the gate pad 70 and the anode electrode pad 270.

With reference to FIG. 21, specifically, the cathode electrode pad 275 includes a columnar portion 276 as an example of the lower conductive layer and a wide portion 277 as an example of the upper conductive layer. The columnar portion 276 is provided on the n-type semiconductor layer 292. The columnar portion 276 is connected to an upper surface of the n-type semiconductor layer 292 and formed in a columnar shape extending in a normal line direction (z-axis direction) of the n-type semiconductor layer 292.

The wide portion 277 is provided at an upper end of the columnar portion 276. The wide portion 277 is a portion in which the upper end of the columnar portion 276 is expanded in size. That is, the wide portion 277 is formed in area larger than the columnar portion 276 in plan view. The wide portion 277 is formed such that the columnar portion 276 will be positioned inside the wide portion 277 in plan view.

In plan view, a size and a shape of the wide portion 277 match those of the cathode electrode pad 275. An upper surface 278 of the wide portion 277 is used in electrically connecting the semiconductor device 201 and other circuits together. In this embodiment, the upper surface 278 of the wide portion 277 is connected to a voltmeter, etc. A metal wire may be connected to the upper surface 278 of the wide portion 277 by wire bonding.

The anode electrode pad 270 and the cathode electrode pad 275 may each have an area which is not more than 20% of an area of the semiconductor layer 10 (first main surface 11) in plan view. Preferably, the anode electrode pad 270 and the cathode electrode pad 275 may each have an area which is not more than 10% of an area of the semiconductor layer 10 (first main surface 11) in plan view.

One of or both of the anode electrode pad 270 and the cathode electrode pad 275 may be arranged in an outer peripheral portion (peripheral edge portion) of the semiconductor layer 10 (first main surface 11) in plan view. One of or both of the anode electrode pad 270 and the cathode electrode pad 275 may be arranged in a region which includes a center position of the semiconductor layer 10 (first main surface 11) in plan view.

One of or both of the anode electrode pad 270 and the cathode electrode pad 275 may be arranged in a region surrounded by the source pad 75. That is, the source pad 75 may be formed such as to surround one of or both of the anode electrode pad 270 and the cathode electrode pad 275.

The anode electrode pad 270 and the cathode electrode pad 275 are formed of the same material as the gate pad 70 and the source pad 75, for example. Thereby, the anode electrode pad 270, the cathode electrode pad 275, the gate pad 70, and the source pad 75 can be formed by the same step. A shape, a material, etc., of the columnar portion 276 and the wide portion 277 pertaining to the cathode electrode pad 275 may be the same as those of the columnar portion 276 and the wide portion 277 pertaining to the anode electrode pad 270. Description of the shape, the material, etc., of the columnar portion 276 and the wide portion 277 pertaining to the cathode electrode pad 275 will be omitted.

With reference to FIG. 21, the semiconductor device 201 includes an active region 203 and a non-active region 204. The active region 203 is a main region in which a drain current of a vertical transistor 2 flows. The active region 203 is a region which overlaps the main surface source electrode 55 in plan view.

The non-active region 204 is a region other than the active region 203 in plan view and a region which will not act as the vertical transistor 2 (region where no drain current flows). The diode 290 is arranged in the non-active region 204. That is, in this embodiment, the anode electrode pad 270 and the cathode electrode pad 275 are arranged in a region which overlaps the non-active region 204 such as to overlap a part of the active region 203 in plan view.

In the semiconductor device 201, a part of the anode electrode pad 270 (wide portion 272) overlaps the main surface source electrode 55 in plan view. Thereby, while design rules derived from the diode 290 are avoided, the anode electrode pad 270 can be formed in a size larger than a fixed size. Further, the diode 290 can be reduced in area and the active region 203 can be increased in area. Therefore, the limited region of the semiconductor layer 10 can be effectively used to realize the semiconductor device 201 capable of easily reducing the size and cost.

Further, in the semiconductor device 201, a part of the cathode electrode pad 275 (wide portion 277) overlaps the main surface source electrode 55 in plan view. Thereby, while the design rules derived from the diode 290 are avoided, the cathode electrode pad 275 can be formed in a size larger than a fixed size. Further, the diode 290 can be reduced in area and the active region 203 can be increased in area. Therefore, the limited region of the semiconductor layer 10 is effectively used to realize the semiconductor device 201 capable of easily reducing the size and cost.

Thus, the semiconductor device 201 includes the insulating layer 260, the diode 290, the anode electrode pad 270 (first polar terminal electrode), and the cathode electrode pad 275 (second polar terminal electrode). The insulating layer 260 covers a part of the first main surface 11. The diode 290 is arranged on the insulating layer 260. The diode 290 includes the p-type semiconductor layer 291 (first polar layer) and the n-type semiconductor layer 292 (second polar layer) which constitutes a pn junction portion with the p-type semiconductor layer.

The anode electrode pad 270 has a portion which overlaps the p-type semiconductor layer 291 in plan view and is electrically connected to the p-type semiconductor layer 291. The cathode electrode pad 275 has a portion which overlaps the n-type semiconductor layer 292 in plan view and is electrically connected to the n-type semiconductor layer 292. In this structure, one of or both of the anode electrode pad 270 and the cathode electrode pad 275 overlap a part of the main surface source electrode 55 in plan view.

According to this structure, while the design rules derived from the diode 290 are avoided, one of or both of the anode electrode pad 270 and the cathode electrode pad 275 can be formed in a size larger than a fixed size. Further, according to this structure, the diode 290 can be reduced in area and the active region 203 can be increased in area. Therefore, the limited region of the semiconductor layer 10 is effectively used to realize the semiconductor device 201 capable of easily reducing the size and cost.

The semiconductor device 201 is manufactured by the same manufacturing method as the method for manufacturing the semiconductor device 1. Specifically, the semiconductor device 201 is manufactured by changing a patterning step of the main surface gate electrode 50 and the main surface source electrode 55, a patterning step of the insulating layer 60, and a patterning step of the gate pad 70, the source pad 75, the anode electrode pad 270, and the cathode electrode pad 275 respectively to the corresponding steps in the semiconductor device 201.

Figure 25:
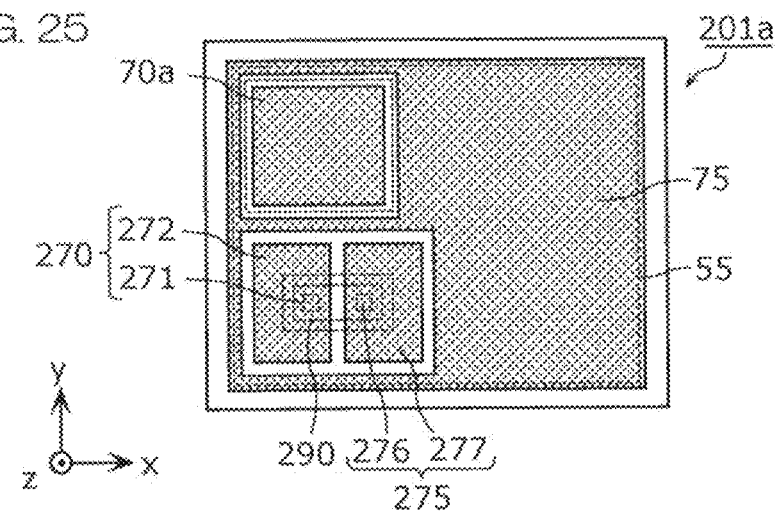
FIG. 25 is a plan view which shows a modified example of the semiconductor device shown in FIG. 21.
Figure 26:
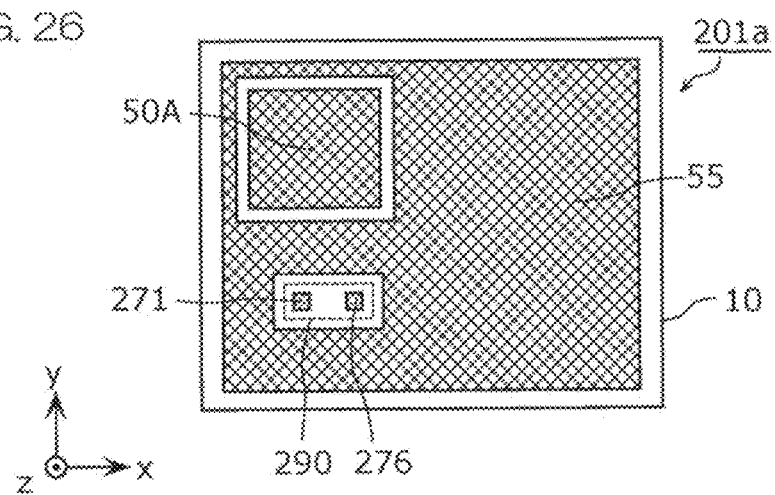
FIG. 26 is a plan view of an upper surface of an electrode of the semiconductor device shown in FIG. 25.

FIG. 25 is a plan view (a protective insulating layer 66 is not shown) of a semiconductor device 201a according to a modified example of the third preferred embodiment. FIG. 26 is a plan view which shows an upper surface of an electrode of the semiconductor device 201a according to the modified example of the third preferred embodiment. FIG. 25 and FIG. 26 correspond respectively to FIG. 23 and FIG.

24 of the third preferred embodiment. In FIG. 25, a main surface source electrode 55 is indicated by broken lines.

In the semiconductor device 201, the example in which the gate pad 70 has the wide portion 72, the anode electrode pad 270 has the wide portion 272, and the cathode electrode pad 275 has the wide portion 277 has been described. However, as shown in FIG. 25 and FIG. 26, there may be adopted a configuration in which the gate pad 70 has no wide portion 72, the anode electrode pad 270 has the wide portion 272, and the cathode electrode pad 275 has the wide portion 277.

A gate pad 70a pertaining to the semiconductor device 201a has the same size and shape as a main surface gate electrode 50A in plan view. That is, the main surface gate electrode 50A pertaining to the semiconductor device 201a is larger in size than the electricity receiving portion 50a of the main surface gate electrode 50 pertaining to the semiconductor device 201 in plan view.

Thus, the semiconductor device 201a can also reduce an area of a diode 290 and increase an area of an active region 203. Therefore, the limited region of a semiconductor layer 10 is effectively used to realize the semiconductor device 201a capable of easily reducing the size and cost.

Figure 27:
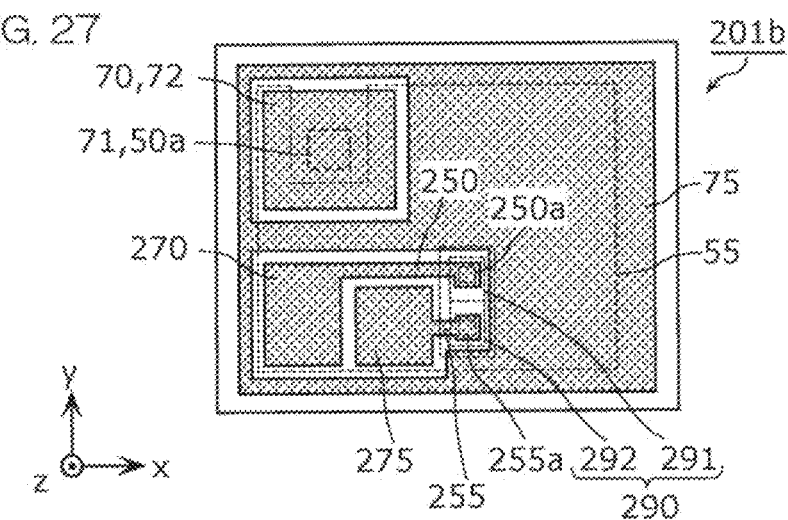
FIG. 27 is a plan view which shows another modified example of the semiconductor device shown in FIG. 21.
Figure 28:
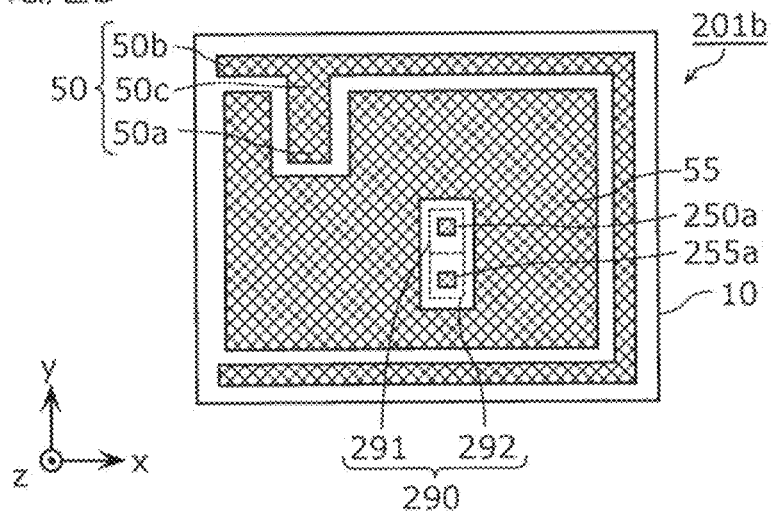
FIG. 28 is a plan view of an upper surface of an electrode of the semiconductor device shown in FIG. 27.

FIG. 27 and FIG. 28 are each a drawing which shows a semiconductor device 201b according to another modified example of the third preferred embodiment. FIG. 27 is a plan view (a protective insulating layer 66 is not shown) of the semiconductor device 200b. FIG. 28 is a plan view which shows an upper surface of an electrode in the semiconductor device 201b. In FIG. 27, a main surface source electrode 55 is indicated by broken lines. FIG. 28 shows that a diode 290 is arranged on a main surface source electrode 55.

With reference to FIG. 27 and FIG. 28, as with the semiconductor device 201, the semiconductor device 201b includes the diode 290, an anode electrode pad 270, and a cathode electrode pad 275. In this embodiment, the diode 290 is arranged in the vicinity of a central portion of a chip (in the vicinity of a central portion of a first main surface 11) in plan view.

In this embodiment, the anode electrode pad 270 and the cathode electrode pad 275 are arranged at a peripheral edge of the chip (a peripheral edge portion of the first main surface 11) in plan view. One of or both of the anode electrode pad 270 and the cathode electrode pad 275 (in this embodiment, both of them) are arranged at an interval from the diode 290 so as not to overlap the diode 290 in plan view. In this embodiment, the anode electrode pad 270 in its entirety overlaps the main surface source electrode 55 in plan view. Further, the cathode electrode pad 275 in its entirety overlaps the main surface source electrode 55 in plan view.

The semiconductor device 201b includes a first connecting portion 250a, a first finger portion 250, a second connecting portion 255a, and a second finger portion 255. The first connecting portion 250a is positioned directly on a p-type semiconductor layer 291 of the diode 290. The first finger portion 250 is interposed between the anode electrode pad 270 and the first connecting portion 250a and connects the anode electrode pad 270 and the first connecting portion 250a together.

The first finger portion 250 extends in a line (band shape) in a region between the anode electrode pad 270 and the first connecting portion 250a in plan view. In this embodiment, the first finger portion 250 extends in an x-axis direction in plan view. At least a part of the first finger portion 250 overlaps the main surface source electrode 55 in plan view.

The second connecting portion 255a is positioned directly on an n-type semiconductor layer 292 of the diode 290. The second finger portion 255 is interposed between the cathode electrode pad 275 and the second connecting portion 255a and connects the cathode electrode pad 275 and the second connecting portion 255a together. The second finger portion 255 extends in a line (band shape) in a region between the cathode electrode pad 275 and the second connecting portion 255a in plan view.

In this embodiment, the second finger portion 255 is provided at an interval from the first finger portion 250 in a y-axis direction in plan view and extends in the x-axis direction. That is, the second finger portion 255 extends in parallel to the first finger portion 250 in plan view. At least a part of the second finger portion 255 overlaps the main surface source electrode 55 in plan view.

A temperature tends to rise at a central portion of the chip (semiconductor layer 10) than at a peripheral edge portion of the chip (semiconductor layer 10). Therefore, where the diode 290 which functions as a temperature sensor is provided, the diode 290 is preferably arranged at the central portion of the chip (semiconductor layer 10) in plan view. On the other hand, in view of assembly of wire bonding, etc., the electrode pad is preferably arranged at an end portion (a peripheral edge portion) of the chip where few obstacles are found.

In a conventional case, a region directly under a plurality of electrode pads for a temperature sensor arranged at an end portion (a peripheral edge portion) of a chip (semiconductor layer 10) and a region directly under wiring from the electrode pads to the central portion of the chip (semiconductor layer 10) are formed as a non-active region. In this respect, according to the structure of the semiconductor device 201b, in addition to a region directly under the anode electrode pad 270 and the cathode electrode pad 275, a region directly under the first finger portion 250 and the second finger portion 255 can be used as the active region 203.

Figure 29:
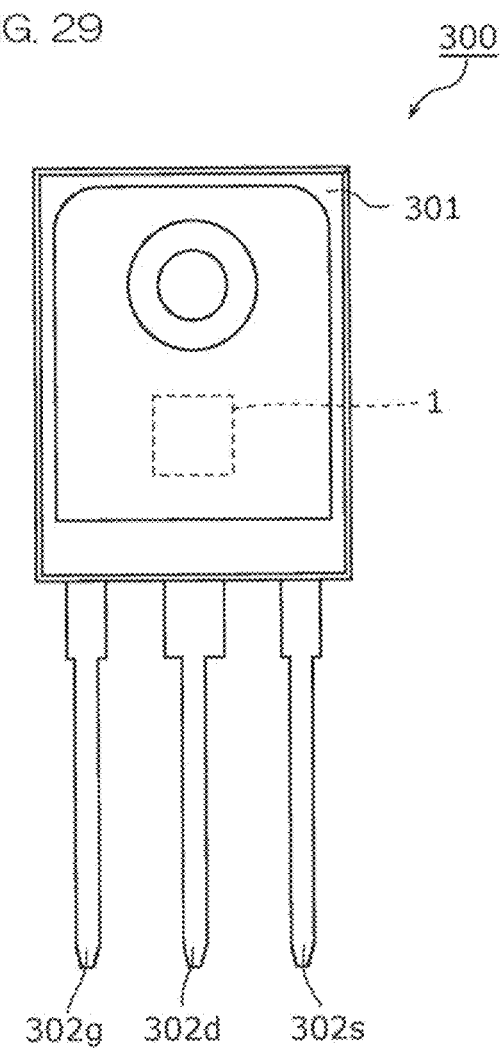
FIG. 29 is a front view of an example of a semiconductor package according to a fourth preferred embodiment.
Figure 30:
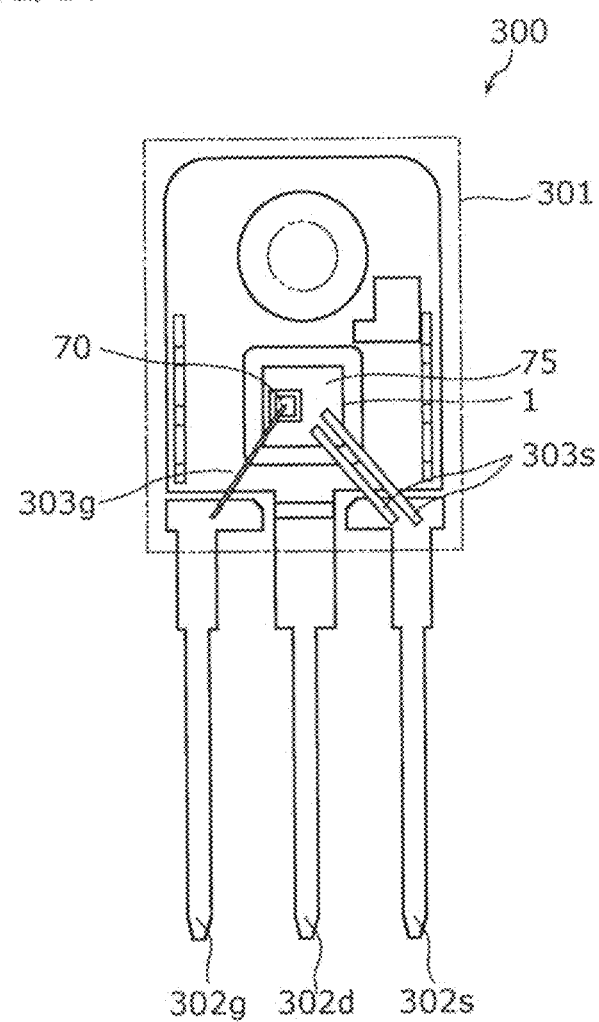
FIG. 30 is a rear view which shows an example of the semiconductor package shown in FIG. 29.

FIG. 29 and FIG. 30 are each a drawing which shows a semiconductor package 300 according to the fourth preferred embodiment. FIG. 30 is a drawing which shows an inner structure of the semiconductor package 300 of FIG. 29 as viewed from the opposite side to that of FIG. 29.

The semiconductor package 300 is a so-called TO (Transistor Outline) type semiconductor package. The semiconductor package 300 includes a package main body 301, a terminal 302d, a terminal 302g, a terminal 302s, a bonding wire 303g, a bonding wire 303s, and a semiconductor device 1. Hereinafter, the terminal 302d, the terminal 302g, and the terminal 302s may be collectively referred to simply as "terminals 302d to 302s".

The package main body 301 is formed in a rectangular parallelepiped shape. The package main body 301 is, for example, formed of an epoxy resin that includes carbon and glass fiber, etc. Each of the terminals 302d to 302s protrudes from a bottom portion of the package main body 301 and is arranged one by one in a line. The terminals 302d to 302s may be formed of aluminum. The terminals 302d to 302s may be formed of other metal materials such as copper, etc.

The semiconductor device 1 is internally housed in the package main body 301. That is, the package main body 301 is constituted as a sealing body for sealing the semiconductor device 1. A gate pad 70 pertaining to the semiconductor device 1 is electrically connected to the terminal 302g via the bonding wire 303g, etc., inside the package main body 301.

A source pad 75 pertaining to the semiconductor device 1 is electrically connected to the terminal 302s via the bonding wire 303s, etc. A drain electrode 40 pertaining to the semiconductor device 1 is bonded to the terminal 302d by soldering or via a sintered layer, etc. The sintered layer may include silver, copper, etc. In this embodiment, the drain electrode 40 is bonded to a wide portion of the terminal 302d which is positioned inside the package main body 301.

The semiconductor package 300 may include the semiconductor device 101, 101a, 201, 201a, or 201b in place of the semiconductor device 1. In this case, the semiconductor package 300 may further include at least one terminal other than the terminals 302d to 302s. Where, for example, the semiconductor device 101 is mounted, the semiconductor package 300 may further include a terminal that is connected to a current detecting pad 170. Further, where the semiconductor device 201 is mounted, the semiconductor package 300 may further include a terminal to which an anode electrode pad 270 is connected and a terminal to which a cathode electrode pad 275 is connected.

Thus, the semiconductor package 300 includes the semiconductor device 1, 101, 101a, 201, 201a, or 201b. As described above, according to the semiconductor device 1 and others, the semiconductor layer 10 is effectively used to reduce the size. Therefore, the semiconductor package 300 can be easily reduced in size by reducing the size of the semiconductor device 1, etc.

Further, according to the semiconductor device 1, etc., the active regions 3, 103, and 203 can be expanded. Therefore, the semiconductor package 300 can be increased in allowable current amount as compared with a semiconductor package in general of the same size. In the semiconductor package 300, an example in which the semiconductor device 1, etc., are electrically connected to the terminal via a bonding wire is shown. However, in the semiconductor package 300, the semiconductor device 1, etc., may be electrically connected to the terminal by a bonding material.

Figure 31:
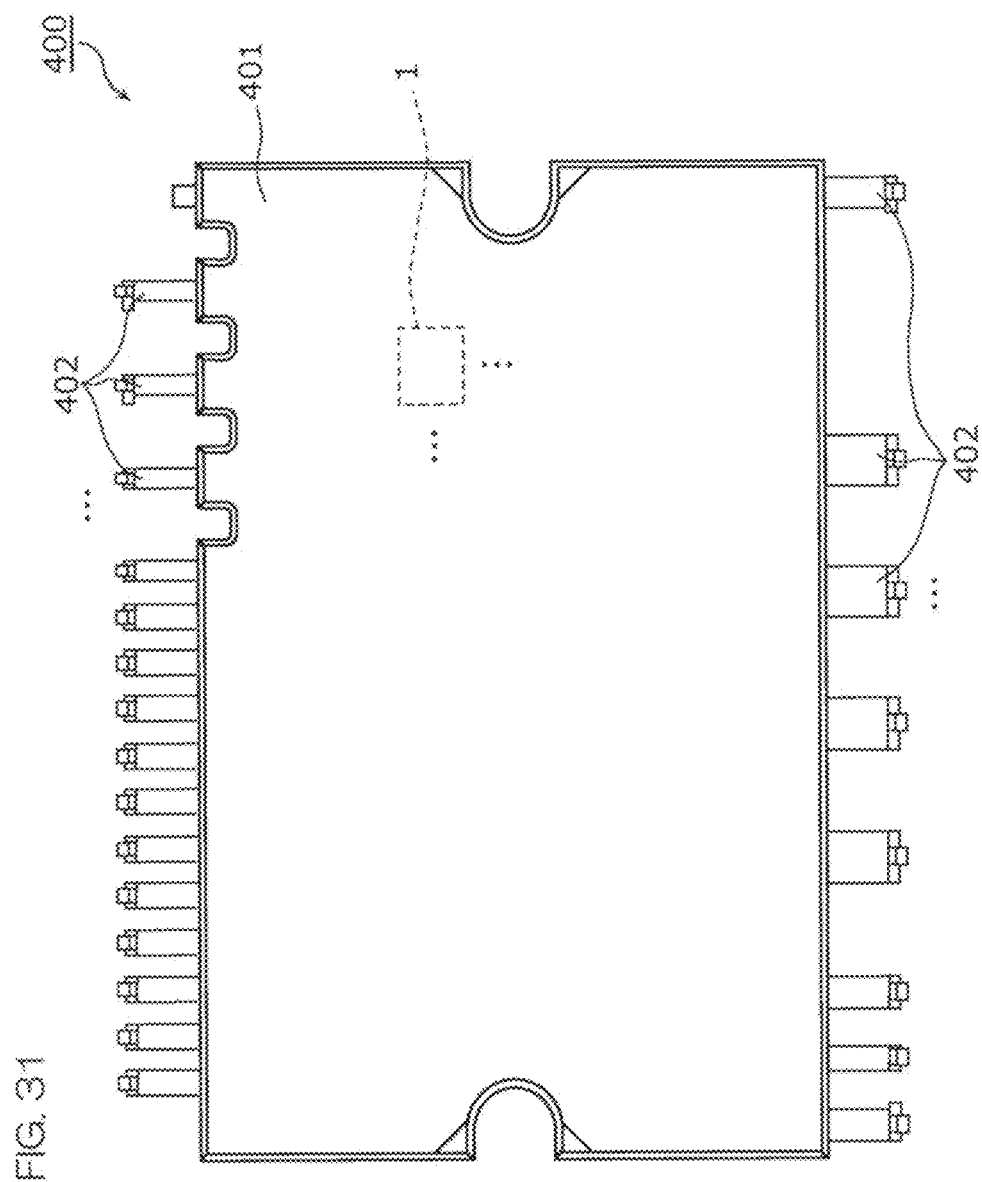
FIG. 31 is a front view of another example of the semiconductor package shown in FIG. 29.

FIG. 31 is a drawing which shows a semiconductor package 400 according to the fourth preferred embodiment. With reference to FIG. 31, the semiconductor package 400 is a so-called DIP (Dual In-line Package) type semiconductor package. The semiconductor package 400 includes a package main body 401, a plurality of terminals 402, and a semiconductor device 1.

The package main body 401 is formed in a rectangular parallelepiped shape. The package main body 401 is formed of an epoxy resin including, for example, carbon, glass fiber, etc. The plurality of terminals 402 are arrayed side by side along a long side of the package main body 401. The plurality of terminals 402 protrude outward from the long side of the package main body 401. The plurality of terminals 402 may be formed of aluminum, for example. The plurality of terminals 402 may be formed by other metal materials such as copper, etc.

The semiconductor device 1 is internally housed in the package main body 401. That is, the package main body 401 is constituted as a sealing body for sealing the semiconductor device 1. A gate pad 70, a source pad 75, and a drain electrode 40 pertaining to the semiconductor device 1 are electrically connected respectively to the corresponding terminals 402 via a bonding wire, etc., in an interior of the package main body 401. The semiconductor package 400 may include the plurality of semiconductor devices 1. That is, the plurality of semiconductor devices 1 may be internally housed in the package main body 401.

As a matter of course, the semiconductor package 400 may include at least one of the semiconductor devices 101, 101a, 201, 201a, and 201b, in place of the semiconductor device 1 or in addition to the semiconductor device 1. Where the semiconductor device 101 is mounted, a current detecting pad 170 is electrically connected to a corresponding terminal 402 via a bonding wire, etc., in the interior of the package main body 401. Further, where the semiconductor device 201 is mounted, an anode electrode pad 270, and a cathode electrode pad 275 are each electrically connected to the corresponding terminals 402 via a bonding wire, etc., in the interior of the package main body 401.

Thus, the semiconductor package 400 includes at least one of the semiconductor devices 1, 101, 101a, 201, 201a, and 201b. As described above, the semiconductor device 1, etc., can be reduced in size by effective use of the semiconductor layer 10. Therefore, the semiconductor package 300 can be easily reduced in size by reducing the size of the semiconductor device 1, etc.

Further, according to the semiconductor device 1, etc., the active regions 3, 103, and 104 can be increased in size. Therefore, the semiconductor package 300 can be increased in an allowable current amount as compared with a semiconductor package in general of the same size. In the semiconductor package 400, an example in which the semiconductor device 1, etc., are electrically connected to the terminals via a bonding wire is shown. However, in the semiconductor package 400, the semiconductor device 1, etc., may be electrically connected to the terminals by a bonding material.

Figure 32:
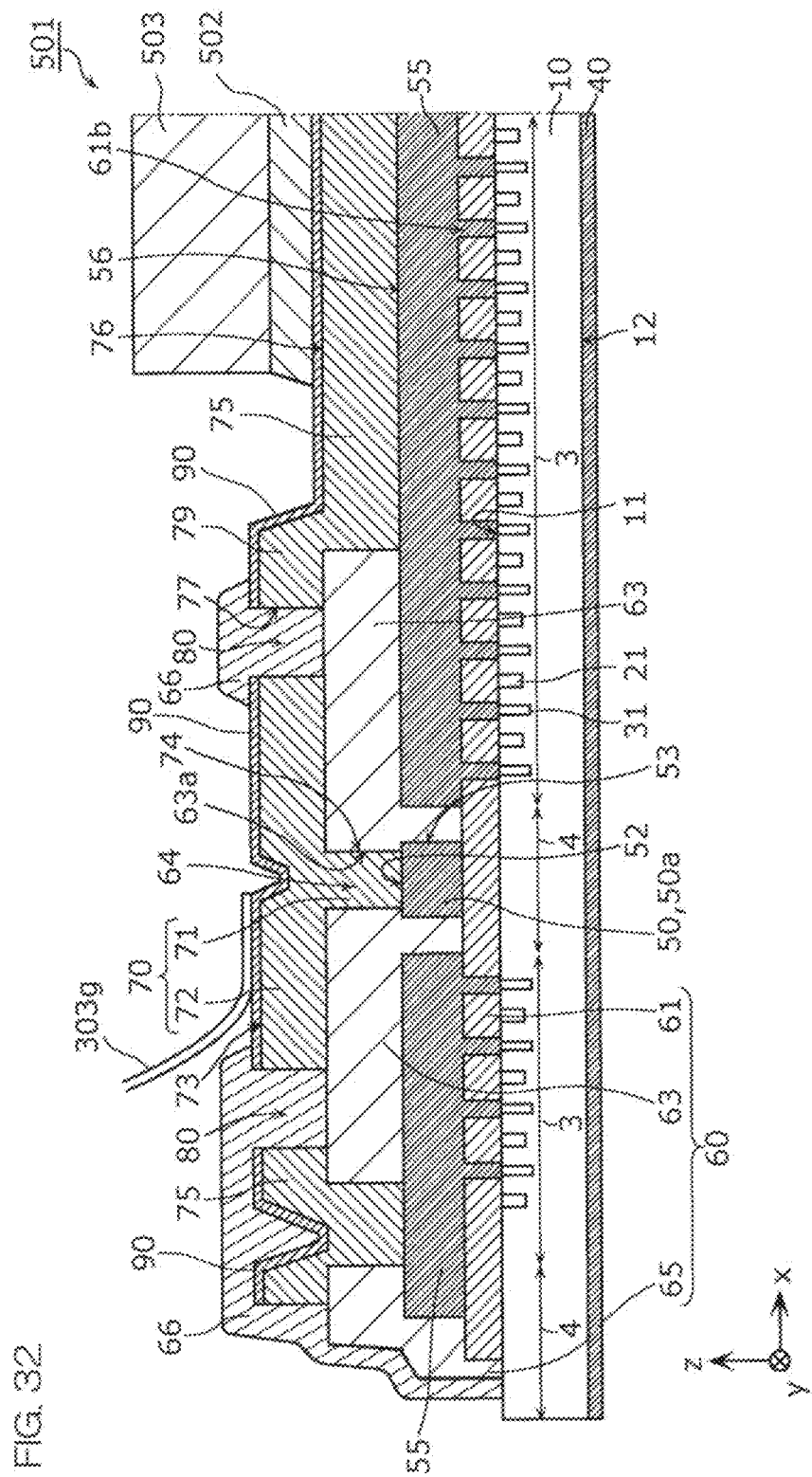
FIG. 32 is a cross-sectional view of a semiconductor device having a configuration in which a plating layer for covering a gate pad and a source pad respectively are formed.

FIG. 32 is a cross-sectional view of a semiconductor device 501 according to a modified example. With reference to FIG. 32, as an example of a metal layer, a plating layer 90 (metal plating layer) may be formed on an upper surface 73 of a gate pad 70 and an upper surface 76 of a source pad 75. In FIG. 32, in addition to the plating layer 90, a bonding wire 303g, a bonding material 502, and a metal plate 503 are shown as an example of connecting members (bonding means) with an external terminal.

In the semiconductor device 501, the bonding wire 303g is connected to the gate pad 70, and the bonding material 502 is bonded to the source pad 75. The bonding material 502 is interposed between the metal plate 503 and the source pad 75 such as to bond the metal plate 503 and the source pad 75. The bonding material 502 includes, for example, soldering and a sintered metal member. The sintered metal member may include silver, copper, etc.

The plating layer 90 is formed of a metal material different from a metal material that forms the gate pad 70 and the source pad 75. The plating layer 90 is, for example, a metal layer which includes nickel as a main component. Specifically, the plating layer 90 is a metal layer composed of nickel alone.

The plating layer 90 may have a two-layer structure which includes a nickel layer and a palladium layer laminated on the nickel layer (that is, an NiPd layer). The plating layer 90 may have a three-layer structure which includes a nickel layer, a palladium layer laminated on the nickel layer, and a gold (Au) layer laminated on the palladium layer (that is, an NiPdAu layer). As a matter of course, the plating layer 90 may have a laminated structure which includes another metal layer in place of the gold (Au) layer. The NiPd layer and the NiPdAu layer are favorably applicable not only to a case that a bonding wire is bonded but also to a case that an external terminal is bonded by silver sintering or by soldering.

The plating layer 90 may be applied to the semiconductor devices 101, 101a, 201, 201a, and 201b. That is, the plating layer 90 may be provided on the respective upper surfaces of the current detecting pad 170, the anode electrode pad 270, and the cathode electrode pad 275.

The preferred embodiments have been so far described. The aforementioned preferred embodiments can be executed by still other embodiments. For example, a configuration of the semiconductor package on which the semiconductor device 1, 101, 101*a*, 201, 201*a*, 201*b*, and 501 is mounted shall not be limited to the configurations of semiconductor package 300 and the semiconductor package 400. As the semiconductor package, there may be adopted SOP (Small Outline Package), QFN (Quad Flat Non Lead Package), DFP (Dual Flat Package), QFP (Quad Flat Package), SIP (Single Inline Package), or SOJ (Small Outline J-Leaded Package). As a matter of course, various types of the semiconductor package similar to the above may be adopted.

In the first to fourth preferred embodiments, a description has been given of a case where "the first conductive type" is "n-type" and the "second conductive type" is "p-type". However, the "first conductive type" may be "p-type" and the "second conductive type" may be "n-type". In this case, a specific arrangement is obtained by replacing the "n-type region" with the "p-type region" and replacing the "p-type region" with the "n-type region" in the above description and the accompanying drawings. The "first conductive type" and the "second conductive type" are merely expressions that clarify a sequence of the description, and "n-type" may be expressed as the "second conductive type" and "p-type" may be expressed as the "first conductive type".

In the first to the fourth preferred embodiments, in place of the n⁺-type semiconductor substrate 13, the p⁺-type SiC semiconductor substrate may be adopted. In this case, a semiconductor device which includes an IGBT (Insulated Gate Bipolar Transistor) is available as the vertical transistor 2. In this case, in the description and the drawings, a "source" of a MISFET is replaced with an "emitter" of an IGBT, and a "drain" of a MISFET is replaced with a "collector" of an IGBT. The emitter of the IGBT (emitter electrode) is an example of the first main electrode, and the collector of the IGBT (collector electrode) is an example of the second main electrode. In the semiconductor device according to each of the preferred embodiments, the same effects as those of the above description can be obtained where an IGBT is included in place of a MISFET.

The arrangements of the first to the fourth preferred embodiments and those of the modified examples of the first to the fourth preferred embodiments may be used in combination, whenever necessary. For example, in the semiconductor device including the gate pad, the current detecting pad and the temperature sensing pad, the arrangements described in the preferred embodiments may be applied to each of the gate pad, the current detecting pad and the temperature sensing pad. Thereby, it is possible to provide a high-performance semiconductor device on which a current-detecting function and a temperature sensing function are provided without a reduction in area of the active region.

Examples of features that are extracted from the present description and the drawings are indicated below. Although alphanumeric characters within parentheses in the following express corresponding constituent devices, etc., in the preferred embodiments described above, these are not meant to limit the scopes of the respective items to the preferred embodiments. The "semiconductor device" according to the following items may be replaced with a "wide bandgap semiconductor device", a "SiC semiconductor device", a "wide bandgap semiconductor switching device" or a "SiC semiconductor switching device".

A conventional semiconductor device includes a gate pad and a source pad to which wire bonding is given. An active region including an FET structure is arranged below the source pad. A non-active region which does not include the FET structure is arranged below the gate pad. The gate pad needs to be formed in a size larger than a fixed size in order to secure a bonding area with a wire. Thus, where the active region is increased in size without changing the size of the gate pad, it is necessary to increase the size of the chip itself.

Thus, an object of the following items is to provide a semiconductor device capable of relaxing design rules derived from an electrode. Another object of the following items is to provide a semiconductor device capable of increasing an active region without an increase in the size of the chip.

[A1] A semiconductor device (1, 101, 101*a*, 201, 201*a*, 201*b*, 501: hereinafter, simply referred to as a "semiconductor device (1, etc.)") comprising: a semiconductor layer (10) which includes SiC and has a first main surface (11) at one side and a second main surface (12) at the other side; a vertical transistor (2) which is formed in the semiconductor layer (10); a first electrode (50/150) which is arranged on the first main surface (11); a second electrode (55) which is arranged on the first main surface (11) at an interval from the first electrode (50/150); a first electrode pad (70/170) which is arranged at the opposite side to the semiconductor layer (10) with respect to the first electrode (50/150) such as to at least partially overlap the first electrode (50/150) in plan view and electrically connected to the first electrode (50/150); and an electrode (40) which is arranged on the second main surface (12), wherein the first electrode pad (70/170) overlaps a part of the second electrode (55) in plan view.

[A2] The semiconductor device (1, etc.) according to A1, further comprising: a first insulating layer (63) which is interposed between the first electrode pad (70/170) and the second electrode (55) in a direction (z) vertical to the first main surface (11).

[A3] The semiconductor device (1, etc.) according to A2, wherein a side surface of the first insulating layer (63) is formed in a plane extending in the vertical direction (z).

[A4] The semiconductor device (1, etc.) according to A2 or A3, further comprising: a second electrode pad (75) that is electrically connected to the second electrode (55); wherein an end portion of the second electrode pad (75) at the first electrode pad (70/170) side is positioned on the first insulating layer (63).

[A5] The semiconductor device (1, etc.) according to A4, further comprising: a second insulating layer (66) which covers a boundary portion (80) between the first electrode pad (70/170) and the second electrode pad (75).

[A6] The semiconductor device (1, etc.) according to any one of A1 to A5, wherein the vertical transistor (2) includes a source region (17) which is formed at a front surface portion of the first main surface (11), a gate insulating film (23) which covers the source region (17), a gate electrode (20) which faces the source region (17) across the gate insulating film (23), and a drain region (10, 13, 14) which is formed in the semiconductor layer (10), the first electrode (50/150) is electrically connected to the gate electrode (20), the second electrode (55) is electrically connected to the source region (17), and the electrode (40) is electrically connected to the drain region (10, 13, 14).

[A7] The semiconductor device (1, etc.) according to A6, wherein the vertical transistor (2) includes a main cell region (103) which generates a drain current and a current detecting cell region (104) which generates a sense current that detects the drain current in plan view, and the second electrode (55) is arranged in a region which overlaps the main cell region (103) in plan view.

The [A8] semiconductor device (1, etc.) according to A7, further comprising: a third electrode (150) which is arranged in a region that overlaps the current detecting cell region (104) at an interval from the first electrode (50) and the second electrode (55) in plan view, and a third electrode pad (170) which is arranged at the opposite side to the semiconductor layer (10) with respect to the third electrode (150) such as to at least partially overlap the third electrode (150) in plan view and electrically connected to the third electrode (150).

[A9] The semiconductor device (1, etc.) according to A8, wherein the third electrode pad (170) overlaps a part of the second electrode (55) in plan view.

[A10] The semiconductor device (1, etc.) according to any one of A1 to A9, further comprising: an insulating layer (260) which covers a part of the first main surface (11); a diode (290) which is arranged on the insulating layer (260) and has a first polar portion (291) and a second polar portion (292) that forms a pn junction portion with the first polar portion (291); a first polar electrode pad (270) which is electrically connected to the first polar portion (291) on the diode (290); and a second polar electrode pad (275) which is electrically connected to the second polar portion (292) on the diode (290).

[A11] The semiconductor device (1, etc.) according to A10, wherein at least one of the first polar electrode pad (270) and the second polar electrode pad (275) overlaps a part of the second electrode (55) in plan view.

[A12] A method for manufacturing a semiconductor device (1, etc.) comprising: a step which prepares a semiconductor layer (10) that includes SiC, has a first main surface (11) at one side and a second main surface (12) at the other side, and includes a vertical transistor (2); a step which forms a first electrode (50/150) and a second electrode (55) at an interval on the first main surface (11); and a step which forms a first electrode pad (70/170) at a position opposite to the semiconductor layer (10) with respect to the first electrode (50/150) such as to at least partially overlap the first electrode (50/150) in plan view and such as to be electrically connected to the first electrode (50/150), wherein in the step of forming the first electrode pad (70/170), the first electrode pad (70/170) which overlaps a part of the second electrode (55) is formed.

[B1] A semiconductor device (1, etc.) comprising: a semiconductor layer (10) which has a main surface (11); a switching device (2) which is formed in the semiconductor layer (10); a first electrode (50/150) which is arranged on the main surface (11) and electrically connected to the switching device (2); a second electrode (55) which is arranged on the main surface (11) at an interval from the first electrode (50/150) and electrically connected to the switching device (2); a first terminal electrode (70/170) which has a portion that overlaps the first electrode (50/150) in plan view and a portion that overlaps the second electrode (55) and is electrically connected to the first electrode (50/150); and a second terminal electrode (75) which has a portion that overlaps the second electrode (55) in plan view and is electrically connected to the second electrode (55).

[B2] The semiconductor device (1, etc.) according to B1, wherein the semiconductor layer (10) includes SiC.

[B3] The semiconductor device (1, etc.) according to B1 or B2, wherein the first terminal electrode (70/170) is connected to the first electrode (50/150) in a first area and has an electrode surface (73) in excess of the first area.

[B4] The semiconductor device (1, etc.) according to any one of B1 to B3, wherein the second terminal electrode (75) has an area equal to or larger than that of the first terminal electrode (70/170) in plan view.

[B5] The semiconductor device (1, etc.) according to any one of B1 to B4, wherein the first terminal electrode (70/170) intersects at least a part of the first electrode (50/150) in plan view.

[B6] The semiconductor device (1, etc.) according to any one of B1 to B5, wherein the second terminal electrode (75) has a portion that overlaps the first electrode (50/150) in plan view.

[B7] The semiconductor device (1, etc.) according to any one of B1 to B6, wherein the first electrode (50/150) is a control electrode that transmits a control signal of the switching device (2), and the second electrode (55) is a non-control electrode.

[B8] The semiconductor device (1, etc.) according to any one of B1 to B7, wherein the switching device (2) includes a gate (20) and a source (17), the first electrode (50/150) is electrically connected to the gate (20), and the second electrode (55) is electrically connected to the source (17).

[B9] The semiconductor device (1, etc.) according to any one of B1 to B8, further comprising: a first insulator (63) which covers the second electrode (55); wherein the first terminal electrode (70/170) has a portion that faces the second electrode (55) across the first insulator (63), and the second terminal electrode (75) has a portion that faces the second electrode (55) across the first insulator (63).

[B10] The semiconductor device (1, etc.) according to B9, wherein the first terminal electrode (70/170) has a side surface that is arranged above the second electrode (55) such as to face the second electrode (55) across the first insulator (63), and the second terminal electrode (75) has a side surface that is arranged above the second electrode (55) such as to face the second electrode (55) across the first insulator (63) and forms a gap (80) that exposes the first insulator (63) between the second terminal electrode (75) and the side surface of the first terminal electrode (70/170).

[B11] The semiconductor device (1, etc.) according to B10, further comprising: a second insulator (66) which covers the first insulator (63) inside the gap (80) and faces the second electrode (55) across the first insulator (63).

[B12] The semiconductor device (1, etc.) according to any one of B9 to B11, wherein the first insulator (63) covers the first electrode (50/150), the first terminal electrode (70/170) has a portion that faces the first electrode (50/150) across the first insulator (63), and the second terminal electrode (75) has a portion that faces the first electrode (50/150) across the first insulator (63).

[B13] The semiconductor device (1, etc.) according to any one of B1 to B12, further comprising: an active region (3, 103, 203) provided in the semiconductor layer (10); and a non-active region (4, 104, 204) provided in a region other than the active region (3, 103, 203) in the semiconductor layer (10); wherein the switching device (2) is formed in the active region (3, 103, 203), the first electrode (50/150) is arranged in a region that overlaps the non-active region (4, 104, 204) in plan view, the second electrode (55) is arranged in a region that overlaps the active region (3, 103, 203) in plan view, the first terminal electrode (70/170) is arranged in a region that overlaps the active region (3, 103, 203) and the non-active region (4, 104, 204) in plan view, and the second terminal electrode (75) is arranged in a region that overlaps the active region (3, 103, 203) in plan view.

[B14] The semiconductor device (1, etc.) according to B13, wherein the active region (3, 103, 203) includes a main cell region (103) provided in the semiconductor layer (10), the non-active region (4, 104, 204) includes a sense cell region (104) provided in a region different from the main cell region (103) in the semiconductor layer (10), and the switching device (2) includes a main switching device (2) that is formed in the main cell region (103) such as to generate a main current and a sense switching device (2) that is formed in the sense cell region (104) such as to generate a monitoring current that detects the main current.

[B15] The semiconductor device (1, etc.) according to B14, wherein the first electrode (50/150) is electrically connected to the main switching device (2), the second electrode (55) is arranged in a region that overlaps the main cell region (103) in plan view and electrically connected to the main switching device (2), the first terminal electrode (70/170) is arranged in a region that overlaps the main cell region (103) and the non-active region (4, 104, 204) in plan view, and the second terminal electrode (75) is arranged in a region that overlaps the main cell region (103) in plan view.

[B16] The semiconductor device (1, etc.) according to B14 or B15, wherein the first electrode (50/150) is electrically connected to the sense switching device (2).

[B17] The semiconductor device (1, etc.) according to any one of B14 to B16, further comprising: a third electrode (150) which is arranged in a region that overlaps the sense cell region (104) at an interval from the first electrode (50) and the second electrode (55) in plan view and electrically connected to the sense switching device (2), and a third terminal electrode (170) which has a portion that overlaps the third electrode (150) in plan view and is electrically connected to the third electrode (150).

[B18] The semiconductor device (1, etc.) according to any one of B13 to B17, further comprising: a diode (290) which is formed in the non-active region (4, 104, 204); and a polar terminal electrode (270, 275) which has a portion that overlaps the diode (290) in plan view and is electrically connected to the diode (290).

[B19] A semiconductor device (1, etc.) comprising: a semiconductor layer (10) which has a main surface (11); a main device (2) which is formed in the semiconductor layer (10) and generates a main current; a sensing device (2) which is formed in a region different from the main device (2) in the semiconductor layer (10) and generates a monitoring current that monitors the main current; a first electrode (50) which is arranged on the main surface (11) and electrically connected to the main device (2); a second electrode (55) which is arranged on the main surface (11) at an interval from the first electrode (50) and electrically connected to the main device (2); a third electrode (150) which is arranged on the main surface (11) at an interval from the first electrode (50) and the second electrode (55) and electrically connected to the sensing device (2); a first terminal electrode (70) which is electrically connected to the first electrode (50) on the first electrode (50); a second terminal electrode (75) which is electrically connected to the second electrode (55) on the second electrode (55); and a third terminal electrode (170) which has a portion that overlaps the third electrode (150) in plan view and a portion that overlaps the second electrode (55) and is electrically connected to the third electrode (150).

[B20] A semiconductor device (1, etc.) comprising: a semiconductor layer (10) which has a main surface (11); a switching device (2) which is formed in the semiconductor layer (10); a diode (290) which is formed in a region different from the switching device (2) in the semiconductor layer (10); a first electrode (50/150) which is arranged on the main surface (11) and electrically connected to the switching device (2); a second electrode (55) which is arranged on the main surface (11) at an interval from the first electrode (50/150) and electrically connected to the switching device (2); a first terminal electrode (70/170) which is electrically connected to the first electrode (50/150) on the first electrode (50/150); a second terminal electrode (75) which is electrically connected to the second electrode (55) on the second electrode (55); and a polar terminal electrode (270, 275) which has a portion that overlaps the diode (290) in plan view and a portion that overlaps the second electrode (55) and is electrically connected to the diode (290).

[C1] semiconductor A device (1, etc.) comprising: a semiconductor layer (10) which has a first main surface (11) at one side and a second main surface (12) at the other side and includes SiC; an active region (3, 103, 203) which is provided at the first main surface (11); a non-active region (4, 104, 204) which is provided in a region other than the active region (3, 103, 203) at the first main surface (11); a first insulating layer (61) which covers the first main surface (11); a first main electrode layer (55) which is arranged on the first insulating layer (61) such as to overlap the active region (3, 103, 203) in plan view; a first conductive layer (50/150/290) which is arranged on the first insulating layer (61) at an interval from the first main electrode layer (55) such as to overlap the non-active region (4, 104, 204) in plan view and electrically disconnected from the first main electrode layer (55); a second insulating layer (63) which covers the first main electrode layer (55) and the first conductive layer (50/150/290); a second conductive layer (70/170/270/275) which is arranged on the second insulating layer (63) such as to overlap the first main electrode layer (55) in plan view, electrically disconnected from the first main electrode layer (55) and electrically connected to the first conductive layer (50/150/290); and an electrode (40) which covers the second main surface (12).

[C2] The semiconductor device (1, etc.) according to C1, further comprising: a switching device (2) which is formed in the semiconductor layer (10) in the active region (3, 103, 203); wherein the first conductive layer (50/150/290) and the second conductive layer (70/170/270/275) are electrically connected to the switching device (2).

[C3] The semiconductor device (1, etc.) according to C2, wherein the switching device (2) includes at least one of a MISFET (Metal Insulator Semiconductor Field Effect Transistor) and an IGBT (Insulated Gate Bipolar Transistor).

[C4] The semiconductor device (1, etc.) according to C3, wherein the first conductive layer (50/150) and the second conductive layer (70/170) are electrically connected to a gate of the switching device (2) and form a first transmission path of a gate voltage.

[C5] The semiconductor device (1, etc.) according to C1, further comprising: a current detecting device (2) which is formed in the semiconductor layer (10); wherein the first conductive layer (150) and the second conductive layer (170) are electrically connected to the current detecting device (2) and form a second transmission path of a signal that is generated by the current detecting device (2).

[C6] The semiconductor device (1, etc.) according to C5, wherein the current detecting device (2) is formed in the non-active region (4, 104, 204).

[C7] The semiconductor device (1, etc.) according to C1, wherein the first conductive layer (290) is constituted of a diode (290) and forms a third transmission path of a current which flows through the diode (290) between the first conductive layer (290) and the second conductive layer (270/275).

[C8] The semiconductor device (1, etc.) according to C7, wherein the diode (290) is a temperature sensitive diode (290), and the third transmission path transmits a signal that detects a temperature of the semiconductor layer (10).

[C9] The semiconductor device (1, etc.) according to C7 or C8, wherein the diode (290) is formed in the non-active region (4, 104, 204).

[C10] The semiconductor device (1, etc.) according to any one of C1 to C9, wherein the first conductive layer (50/150/290) is constituted of substantially the same thickness and substantially the same material as the first main electrode layer (55). Here, "substantially the same" means that the first main electrode layer (55) and the first conductive layer (50/150/290) are formed through the same process (manufacturing step), therefore, having the same arrangement (in terms of the thickness and material).

[C11] The semiconductor device (1, etc.) according to any one of C1 to C10, further comprising: a second main electrode layer (75) which is arranged on the second insulating layer (63) at an interval from the second conductive layer (70/170/270/275) such as to overlap the first main electrode layer (55) in plan view.

[C12] The semiconductor device (1, etc.) according to C11, wherein the second main electrode layer (75) is constituted of substantially the same thickness and substantially the same material as the second conductive layer (70/170/270/275). Here, "substantially the same" means that the second main electrode layer (75) and the second conductive layer (70/170/270/275) are formed through the same process (manufacturing step), therefore, having the same arrangement (in terms of the thickness and material).

[C13] The semiconductor device (1, etc.) according to C11 or C12, wherein at least one of the second conductive layer (70/170/270/275) and the second main electrode layer (75) is exposed to the outside such as to be electrically connected to an external terminal (302*d*, 302*g*, 302*s*, 402).

[C14] The semiconductor device (1, etc.) according to C13, wherein at least one of the second conductive layer (70/170/270/275) and the second main electrode layer (75) is arranged such as to be electrically connected to the external terminal (302*d*, 302*g*, 302*s*, 402) through a bonding wire (303*g*, 303*s*), soldering (502), or a sintered metal (502).

[C15] The semiconductor device (1, etc.) according to C13 or C14, wherein the external terminal (302*d*, 302*g*, 302*s*, 402) is a lead frame.

[C16] The semiconductor device (1, etc.) according to any one of C1 to C10, wherein the first main electrode layer (55) is exposed to the outside such as to be electrically connected to the external terminal (302*d*, 302*g*, 302*s*, 402).

[C17] The semiconductor device (1, etc.) according to C16, wherein the first main electrode layer (55) is arranged such as to be electrically connected to the external terminal (302*d*, 302*g*, 302*s*, 402) through a bonding wire (303*g*, 303*s*), soldering (502), or a sintered metal (502).

[C18] The semiconductor device (1, etc.) according to C16 or C17, wherein the external terminal (302*d*, 302*g*, 302*s*, 402) is a lead frame.

The semiconductor device according to [C1] to [C18] may include at least one of the first transmission path, the second transmission path, and the third transmission path according to [C4] to [C8]. That is, in the semiconductor device, the first transmission path, the second transmission path, and the third transmission path may be provided alone or may be provided in combination. Specifically, a semiconductor device which includes only any one of the first transmission path, the second transmission path, and the third transmission path may be adopted.

Further, a semiconductor device may be adopted which includes only any two of the first transmission path, the second transmission path, and the third transmission path. Further, a semiconductor device may be adopted which includes all of the first transmission path, the second transmission path, and the third transmission path. Where a plurality of transmission paths are provided, preferably at least one of the transmission paths has the arrangement according to [C1] described above. In this case, it is in particular preferable that all the plurality of transmission paths have the arrangement according to [C1] described above.

[D1] A semiconductor device which includes a vertical transistor, the semiconductor device comprising: a semiconductor layer which has a first main surface and a second main surface at the opposite side of the first main surface and includes SiC as a main component; a first electrode which covers a part of the first main surface; a second electrode which is a second electrode provided at an interval from the first electrode in plan view and covers a part of the first main surface; a first electrode pad which is provided at the opposite side to the semiconductor layer with respect to the first electrode; at least partially overlaps the first electrode in plan view, and is electrically connected to the first electrode; and an electrode which is provided on the second main surface; wherein the first electrode pad overlaps a part of the second electrode in plan view.

[D2] The semiconductor device according to D1, further comprising: a first insulating layer which is positioned between the first electrode pad and the second electrode in a direction vertical to the first main surface.

[D3] The semiconductor device according to D2, wherein a side surface of the first insulating layer is a plane along the direction vertical to the first main surface.

[D4] The semiconductor device according to D2 or D3, further comprising: a second electrode pad which is electrically connected to the second electrode; wherein an end portion of the second electrode pad at the first electrode pad side is positioned on the first insulating layer.

[D5] The semiconductor device according to D4, further comprising: a second insulating layer which covers a boundary portion between the first electrode pad and the second electrode pad.

[D6] The semiconductor device according to any one of D1 to D5, wherein the vertical transistor includes a source region formed on a front surface of the semiconductor layer on the first main surface side, a gate electrode adjacent to the source region via a gate insulating film, and a drain region formed in the semiconductor layer, the first electrode is electrically connected to the gate electrode, and the second electrode is electrically connected to the source region.

[D7] The semiconductor device according to D6, wherein the vertical transistor has a main cell region for conducting a drain current in plan view and a current detecting cell region that detects a drain current, and the second electrode is arranged such as to correspond to the main cell region, and the semiconductor device further comprising: a third electrode which is provided at an interval from the first electrode and the second electrode in plan view and arranged such as to correspond to the current detecting cell region; and a third electrode pad which is provided at the opposite side to the semiconductor layer with respect to the third electrode, at least partially overlaps the third electrode in plan view and is electrically connected to the third electrode, wherein the third electrode pad overlaps a part of the second electrode in plan view.

[D8] The semiconductor device according to D6 or D7, further comprising: a diode which is provided on an insulating layer that covers a part of the first main surface; an anode electrode pad which is electrically connected to a p-type semiconductor layer of the diode; and a cathode electrode pad which is electrically connected to an n-type semiconductor layer of the diode; wherein at least one of the anode electrode pad and the cathode electrode pad overlaps a part of the second electrode in plan view.

[D9] A method for manufacturing a semiconductor device including a vertical transistor, the method for manufacturing the semiconductor device comprising: a first step in which a first electrode and a second electrode that cover a part of a first main surface of a semiconductor layer which has the first main surface and a second main surface at the opposite side of the first main surface and includes SiC as a main component are formed at an interval from each other; and a second step in which a first electrode pad that is electrically connected to the first electrode is formed at the opposite side to the semiconductor layer with respect to the first electrode such that at least a part of the first electrode pad will overlap the first electrode in plan view, wherein the first electrode pad overlaps a part of the second electrode in plan view.

[E1] A semiconductor device comprising: a semiconductor layer which has a first main surface having an active region and a non-active region and a second main surface at the opposite side of the first main surface and includes SiC as a main component; a first insulating layer which is formed on the first main surface; a first main electrode layer which is formed on the first insulating layer, and formed in a region corresponding to the active region; a first conductive layer which is formed on the first insulating layer, electrically disconnected from the first main electrode layer and formed in a region corresponding to the non-active region; a second insulating layer which is formed on the first main electrode layer and the first conductive layer; a second conductive layer which is formed on the second insulating layer, electrically connected to the first conductive layer, electrically disconnected from the first main electrode layer, and formed in a region which partially overlaps the first main electrode layer in a thickness direction of the semiconductor layer; and an electrode which is formed on the second main surface.

[E2] The semiconductor device includes an insulating gate driving-type switching device that includes a MOSFET or an IGBT, and the first conductive layer and the second conductive layer constitute a transmission path of a control signal used for controlling the insulating gate driving-type switching device.

[E3] That is, the first conductive layer and the second conductive layer may be connected to a gate electrode of the switching device to constitute a first transmission path which is a transmission path of the control signal of a gate voltage.

[E4] Further, the first conductive layer and the second conductive layer are connected to a source electrode (emitter electrode) of a current detecting device to constitute a second transmission path which is a transmission path of a detection signal that detects a current flowing through the semiconductor device.

[E5] Further, the first conductive layer and the second conductive layer may be connected to an electrode of a diode that detects a temperature of the semiconductor device to constitute a third transmission path which is a transmission path of a detection signal that detects a temperature of the semiconductor device.

[E6] The first, the second, or the third transmission path may be provided alone in the semiconductor device or a plurality of them may be provided.

[E7] Specifically, there may be an arrangement that only the first transmission path is provided. In addition to the first transmission path, the second transmission path or the third transmission path may be provided. Alternatively, the semiconductor device may be provided with all the first transmission path, the second transmission path, and the third transmission path.

[E8] Where a plurality of transmission paths are provided, such an arrangement is preferable that all of the transmission paths meet the above-described arrangement. However, at least one of the transmission paths may meet the above description.

[E9] The first main electrode layer and the first conductive layer may be constituted of substantially the same thickness and of the same material. Here, "substantially the same" means that the first main electrode layer and the first conductive layer are formed through the same process, thereby giving the same arrangement.

[E10] Further, the second main electrode layer may be formed such as to overlap the first main electrode layer from above.

[E11] In this case, the second main electrode layer and the second conductive layer may be constituted of substantially the same thickness and of the same material.

[E12] The second conductive layer and the second main electrode layer are exposed on a front surface of the semiconductor device and used for connection with a corresponding external terminal.

[E13] Where no second main electrode layer is provided, the first main electrode layer may be exposed on the front surface of the semiconductor device and used for connection with an external terminal.

[E14] Bonding between the second conductive layer/the second main electrode layer and the respectively corresponding external terminals such as lead frames is performed by wire bonding. However, the second conductive layer/the second main electrode layer and the external terminals may be bonded by soldering or by using a sintered metal.

[E15] Bonding between the second conductive layer and the external terminal may be performed by wire bonding, and the second main electrode layer and the external terminal may be bonded by soldering or by using a sintered metal.

Although the semiconductor devices and the methods for manufacturing the semiconductor devices according to one or a plurality of modes have been described based on the preferred embodiments, the present invention is not limited to these preferred embodiments. Various modifications, replacements, additions, omissions, etc., can be performed within the scope of the claims or the scope of equivalents thereof on the respective preferred embodiments. As long as the spirit and the scope of the present invention are not departed from, embodiments in which various modifications that one skilled in the art can arrive at are applied to the respective preferred embodiments and embodiments constructed by combination of the constituent devices in different preferred embodiments are also included within the scope of the present invention. In regard to industrial applicability, the present invention can be applied to semiconductor devices, semiconductor packages, etc.

REFERENCE SIGNS LIST

1: semiconductor device
2: vertical transistor
3: active region
4: non-active region 10: semiconductor layer
11: first main surface
12: second main surface
13: semiconductor substrate
14: epitaxial layer
17: source region
20: gate electrode
23: gate insulating layer
40: drain electrode
50: main surface gate electrode
55: main surface source electrode
63: upper insulating layer
66: protective insulating layer
70: gate pad
75: source pad
80: boundary portion
101: semiconductor device
101a: semiconductor device
103: active region
104: non-active region
150: current detecting electrode
170: current detecting pad
201: semiconductor device
201a: semiconductor device
201b: semiconductor device
203: active region
204: non-active region
260: insulating layer
270: anode electrode pad
275: cathode electrode pad
290: diode
291: p-type semiconductor layer
292: n-type semiconductor layer
302d: terminal
302g: terminal
302s: terminal
402: terminal
303g: bonding wire
303s: bonding wire
501: semiconductor device
502: bonding material

The invention claimed is:

1. A semiconductor device comprising:
a semiconductor layer that has a main surface, and that has an active region and a non-active region provided in a region outside the active region;
a switching element that is formed in the active region of the semiconductor layer, and that has a gate electrode, a source region, and a drain region;
a first electrode that is arranged on the main surface at the non-active region, and that is electrically connected to the gate electrode of the switching element;
a lower insulating layer that has contact holes at the active region;
a second electrode that is arranged on the main surface via the lower insulating layer at an interval from the first electrode at the active region as viewed in plan, and that is electrically connected to the source region of the switching element via the contact hole;
an upper insulating layer that is arranged on the second electrode;
a first terminal electrode that has a portion overlapping the first electrode and a portion overlapping the second electrode as viewed in plan, that is electrically connected to the first electrode, and that is electrically isolated from the second electrode with the upper insulating layer; and
a second terminal electrode that has a portion overlapping the second electrode as viewed in plan, and that is electrically connected to the second electrode;
wherein the second electrode has a first portion that is embedded in the contact hole of the lower insulating layer and a second portion that is formed on the lower insulating layer,
the first portion includes tungsten or tungsten alloy, and
the second portion includes aluminum or aluminum alloy.

2. The semiconductor device according to claim 1,
wherein the first portion is formed via a barrier film made of titanium or titanium nitride.

3. The semiconductor device according to claim 2,
wherein the second portion includes a first base layer that is formed on the lower insulating layer, and a first metal layer that is formed on the first base layer and that is made of aluminum or aluminum alloy.

4. The semiconductor device according to claim 3,
wherein the first base layer is formed as a barrier film made of titanium.

5. The semiconductor device according to claim 4, further comprising:
a gate finger portion that is connected to the gate electrode of the switching element, and that has a portion overlapping the first electrode;
wherein the first electrode includes aluminum or aluminum alloy, and
the first electrode is electrically connected to the gate finger portion via a through hole provided in the lower insulating layer.

6. The semiconductor device according to claim 4,
wherein the first electrode includes a second base layer that is formed on the lower insulating layer, and a second metal layer that is formed on the second base layer and that is made of aluminum or aluminum alloy.

7. The semiconductor device according to claim 6,
wherein the second base layer is formed as a barrier film made of titanium.

8. The semiconductor device according to claim 4,
wherein the semiconductor layer includes SiC.

9. The semiconductor device according to claim 8, further comprising:
an end insulating layer that covers the semiconductor layer at an outer peripheral portion of the semiconductor layer;
wherein the lower insulating layer covers the outer peripheral portion of the semiconductor layer, and
the end insulating layer covers the semiconductor layer via the lower insulating layer at the outer peripheral portion of the semiconductor layer.

10. The semiconductor device according to claim 9,
wherein the end insulating layer is formed of a same insulating material as the upper insulating layer.

11. The semiconductor device according to claim 8,
wherein the first terminal electrode includes a connecting portion that is formed in a through hole formed in the upper insulating layer and that is connected to the first electrode, and a wide portion that extends to an outside from the connecting portion, and
the connecting portion and the wide portion are formed of a same conductive material.

12. The semiconductor device according to claim 11,
wherein the first terminal electrode is recessed toward the first electrode at a portion overlapping the connecting portion.

13. The semiconductor device according to claim 8,
wherein the first terminal electrode has an area of not less than 640000 μm² and not more than 1000000 μm².

14. The semiconductor device according to claim 8, further comprising:
a bonding wire that is bonded to the first terminal electrode;
wherein the first terminal electrode includes a connecting portion that is formed in a through hole formed in the upper insulating layer and that is connected to the first electrode, and a wide portion that extends to an outside from the connecting portion, and
the bonding wire is bonded to a region that does not overlap the connecting portion as viewed in plan.

15. The semiconductor device according to claim 8,
wherein the first terminal electrode has a side surface that is arranged at an upper side to the second electrode so as to face the second electrode across the upper insulating layer, and
the second terminal electrode has a side surface that is arranged at an upper side to the second electrode so as to face the second electrode across the upper insulating layer, and that forms a gap exposing the upper insulating layer in a region between the side surface of the first terminal electrode and the side surface of the second terminal electrode.

16. The semiconductor device according to claim 15, further comprising:
a protective insulating layer that covers the upper insulating layer inside the gap and faces the second electrode across the upper insulating layer.

17. The semiconductor device according to claim 16, further comprising:
an end insulating layer that covers the semiconductor layer at an outer peripheral portion of the semiconductor layer;
wherein the lower insulating layer covers the outer peripheral portion of the semiconductor layer,
the end insulating layer covers the semiconductor layer via the lower insulating layer at the outer peripheral portion of the semiconductor layer, and
the protective insulating layer covers the semiconductor layer via the lower insulating layer and the end insulating layer at the outer peripheral portion of the semiconductor layer.

18. The semiconductor device according to claim 17,
wherein the end insulating layer is formed of a same insulating material as the upper insulating layer.

19. The semiconductor device according to claim 8,
wherein the first electrode includes:
an electricity receiving portion that is arranged so as to overlap the first terminal electrode as viewed in plan and that is electrically connected to the first terminal electrode;
an electricity supplying portion that extends along one direction as viewed in plan; and
a connecting portion that connects the electricity receiving portion and the electricity supplying portion, and that extends along a direction orthogonal to the one direction.

20. The semiconductor device according to claim 1, further comprising:
a metal plate that is electrically connected to the second terminal electrode; and
a bonding material that is interposed between the second terminal electrode and the metal plate;
wherein a first plating layer is formed on an upper surface of the second terminal electrode, and
the first plating layer and the metal plate are bonded with the bonding material.

21. The semiconductor device according to claim 20,
wherein the first plating layer includes a metal layer including nickel as a main component.

22. The semiconductor device according to claim 21,
wherein a second plating layer is formed on an upper surface of the first terminal electrode.

23. The semiconductor device according to claim 1,
wherein the second electrode is arranged in such a manner as to surround a periphery of the first electrode as viewed in plan.

24. The semiconductor device according to claim 1,
wherein the second terminal electrode is arranged such as to surround a periphery of the first terminal electrode.

25. A semiconductor device comprising:
a semiconductor layer that has a main surface, and that has an active region and a non-active region provided in a region outside the active region;
a switching element that is formed in the active region of the semiconductor layer, and that has a gate electrode, a source region, and a drain region;
a first electrode that is arranged on the main surface at the non-active region, and that is electrically connected to the gate electrode of the switching element;
a lower insulating layer that has contact holes at the active region;
a second electrode that is arranged on the main surface via the lower insulating layer at an interval from the first electrode at the active region as viewed in plan, and that is electrically connected to the source region of the switching element via the contact hole;
an upper insulating layer that is arranged on the second electrode;
a first terminal electrode that has a portion overlapping the first electrode and a portion overlapping the second electrode as viewed in plan, that is electrically connected to the first electrode, and that is electrically isolated from the second electrode with the upper insulating layer; and
a second terminal electrode that has a portion overlapping the second electrode as viewed in plan, and that is electrically connected to the second electrode;
wherein the second electrode has a first portion that is embedded in the contact hole of the lower insulating layer and a second portion that is formed on the lower insulating layer,
the first portion includes tungsten or tungsten alloy,
the second portion includes aluminum or aluminum alloy,
the first portion is formed via a barrier film made of titanium or titanium nitride,
the second portion includes a first base layer that is formed on the lower insulating layer, and a first metal layer that is formed on the first base layer and that is made of aluminum or aluminum alloy,
the first base layer is formed as a barrier film made of titanium, and
the semiconductor layer includes SiC.

26. The semiconductor device according to claim 25, further comprising:
a metal plate that is electrically connected to the second terminal electrode; and
a bonding material that is interposed between the second terminal electrode and the metal plate;

wherein a first plating layer is formed on an upper surface of the second terminal electrode, and the first plating layer and the metal plate are bonded with the bonding material.

27. The semiconductor device according to claim 26, wherein the first plating layer includes a metal layer including nickel as a main component.

28. The semiconductor device according to claim 27, wherein a second plating layer is formed on an upper surface of the first terminal electrode.

29. The semiconductor device according to claim 25, wherein the second electrode is arranged in such a manner as to surround a periphery of the first electrode as viewed in plan.

30. The semiconductor device according to claim 25, wherein the second terminal electrode is arranged such as to surround a periphery of the first terminal electrode.

* * * * *